United States Patent
Karda et al.

(10) Patent No.: US 11,616,073 B1
(45) Date of Patent: Mar. 28, 2023

(54) MEMORY DEVICE HAVING 2-TRANSISTOR VERTICAL MEMORY CELL AND WRAPPED DATA LINE STRUCTURE

(71) Applicant: Micron Technology, Inc., Boise, ID (US)

(72) Inventors: Kamal M. Karda, Boise, ID (US); Eric S. Carman, San Francisco, CA (US); Karthik Sarpatwari, Boise, ID (US); Durai Vishak Nirmal Ramaswamy, Boise, ID (US); Richard E Fackenthal, Carmichael, CA (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/514,979

(22) Filed: Oct. 29, 2021

(51) Int. Cl.
*H01L 27/11575* (2017.01)
*H01L 29/423* (2006.01)
*H01L 29/10* (2006.01)

(52) U.S. Cl.
CPC .... *H01L 27/11575* (2013.01); *H01L 29/1062* (2013.01); *H01L 29/42396* (2013.01)

(58) Field of Classification Search
CPC combination set(s) only.
See application file for complete search history.

(56) References Cited

U.S. PATENT DOCUMENTS

2020/0211615 A1* 7/2020 Sarpatwari .......... H01L 29/7827

* cited by examiner

*Primary Examiner* — Julio J Maldonado
*Assistant Examiner* — Mohammad A Rahman
(74) *Attorney, Agent, or Firm* — Schwegman Lundberg & Woessner, P.A.

(57) ABSTRACT

Some embodiments include apparatuses and methods forming the apparatuses. One of the apparatuses includes a first transistor including a first channel region, and a charge storage structure separated from the first channel region; a second transistor including a second channel region formed over the charge storage structure; and a data line formed over and contacting the first channel region and the second channel region, the data line including a portion adjacent the first channel region and separated from the first channel region by a dielectric material.

17 Claims, 32 Drawing Sheets

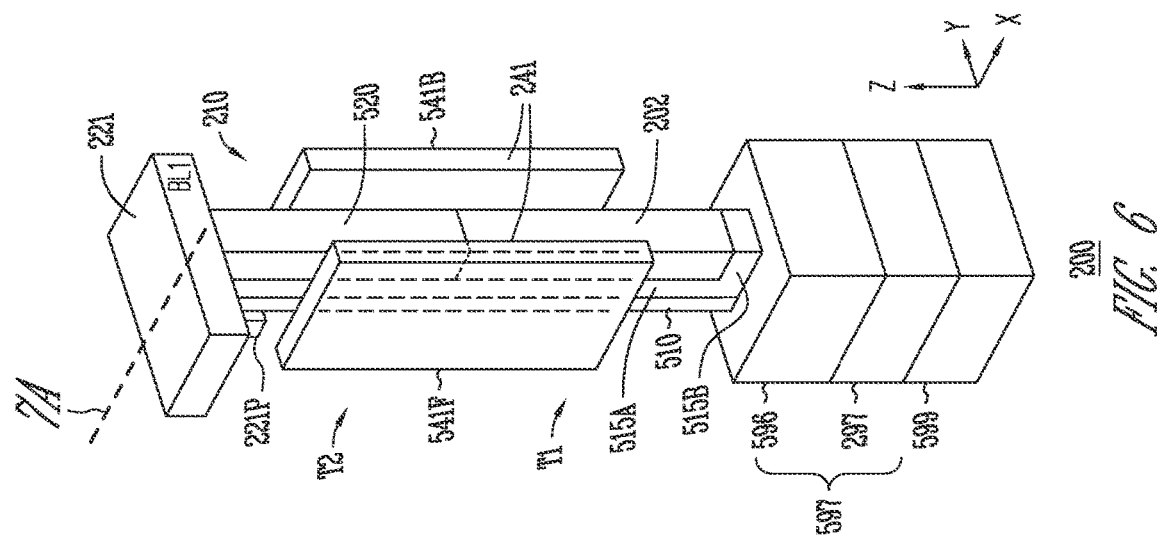
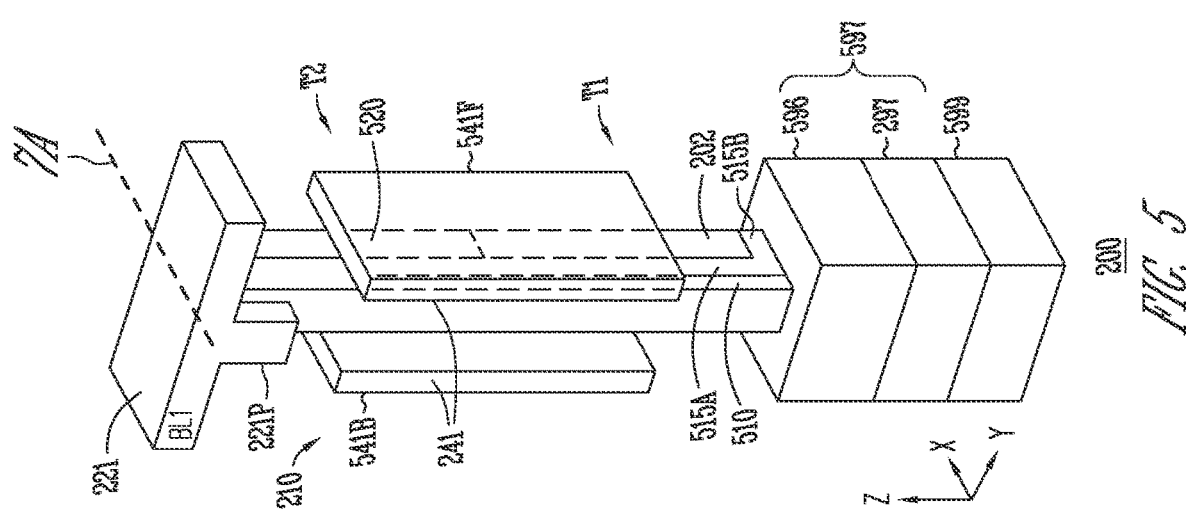

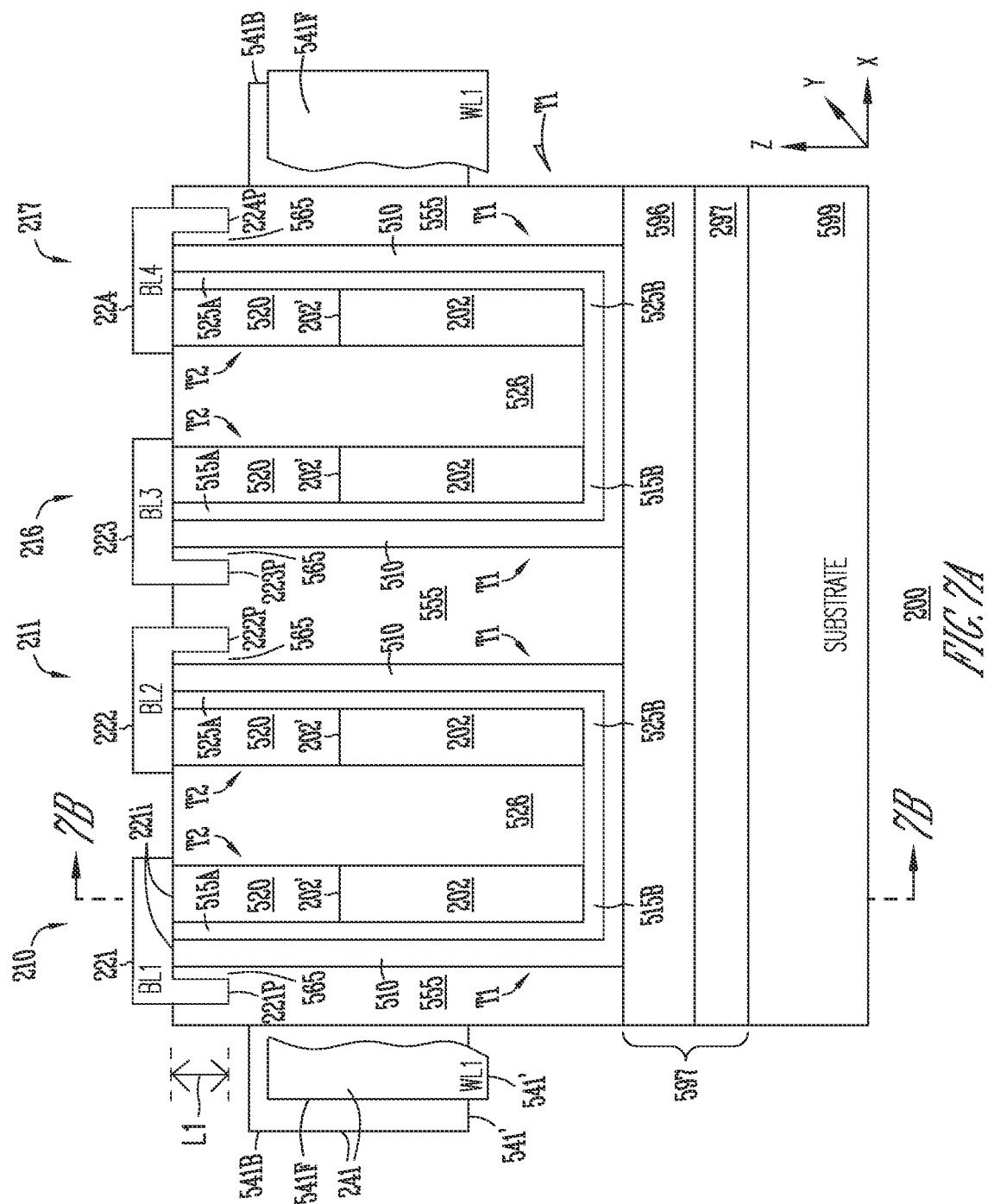

US 11,616,073 B1

MEMORY DEVICE HAVING 2-TRANSISTOR VERTICAL MEMORY CELL AND WRAPPED DATA LINE STRUCTURE

BACKGROUND

Memory devices are widely used in computers and many other electronic items to store information. Memory devices are generally categorized into two types: volatile memory device and non-volatile memory device. A memory device usually has numerous memory cells in which to store information. In a volatile memory device, information stored in the memory cells is lost if power supply is disconnected from the memory device. In a non-volatile memory device, information stored in the memory cells is retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Further, increased device storage density for a given area may cause excessive capacitive coupling between elements of adjacent memory cells. Unlike some conventional memory devices, the memory devices described herein include features that can overcome challenges faced by conventional techniques.

BRIEF DESCRIPTION OF THE DRAWINGS

FIG. 5. FIG. 6, FIG. 7A.

DETAILED DESCRIPTION

The memory device described herein includes volatile memory cells in which each of the memory cells can include two transistors (2T). One of the two transistors has a charge storage structure, which can form a memory element of the memory cell to store information. The memory device described herein can have a structure (e.g., a 4F2 cell footprint) that allows the size (e.g., footprint) of the memory device to be relatively smaller than the size (e.g., footprint) of similar conventional memory devices. The described memory device can include a single access line (e.g., word line) to control two transistors of a corresponding memory cell. This can lead to reduced power dissipation and improved processing. Each of the memory cells of the described memory device can include a cross-point gain cell structure (and cross-point operation), such that a memory cell can be accessed using a single access line (e.g., word line) and single data line (e.g., bit line) during an operation (e.g., a read or write operation) of the memory device. The described memory device can include data lines having respective wrapped portions that wrap around part of a channel region of a transistor of a respective memory cell. The wrapped portions of the data lines can improve operations of the memory device. In an example, the wrapped portions can mitigate or prevent static power (e.g., current leakage) that may occur in the memory cells. Other improvements and benefits of the described memory device and its variations are discussed below with reference to FIG. 1 through FIG. 28C.

Figure 1:
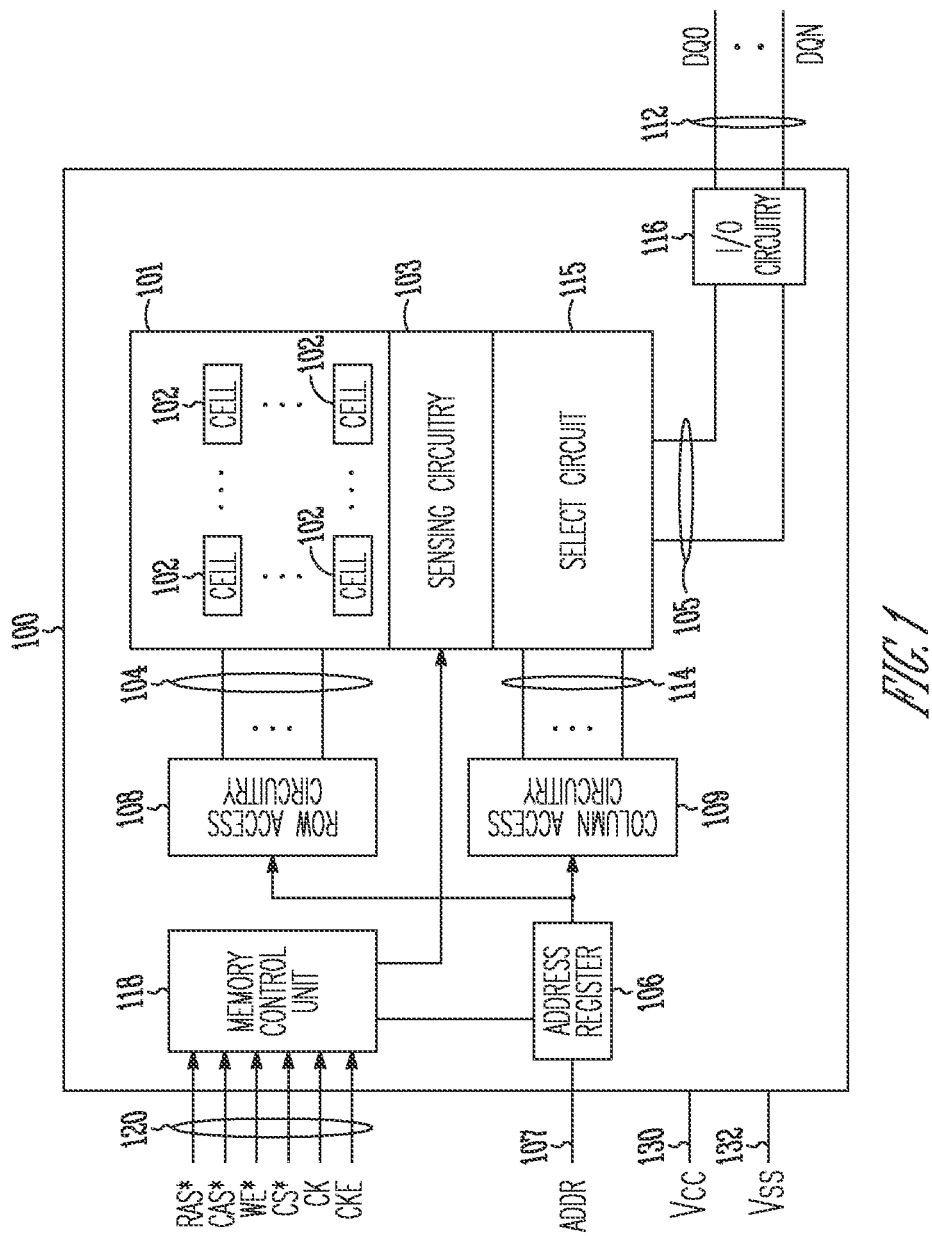
FIG. 1 shows a block diagram of an apparatus in the form of a memory device including memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 can include a volatile memory device such that memory cells 102 can be volatile memory cells. An example of memory device 100 includes a dynamic random-access memory (DRAM) device. Information stored in memory cells 102 of memory device 100 may be lost (e.g., invalid) if supply power (e.g., supply voltage Vcc) is disconnected from memory device 100. Hereinafter, supply voltage Vcc is referred to as representing some voltage levels' however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on supply voltage Vcc, such an internal voltage may be used instead of supply voltage Vcc.

In a physical structure of memory device 100, each of memory cells 102 can include transistors (e.g., two transistors) formed vertically (e.g., stacked on different layers) in different levels over a substrate (e.g., semiconductor substrate) of memory device 100. Memory device 100 can also include multiple levels (e.g., multiple decks) of memory cells where one level (e.g., one deck) of memory cells can be formed over (e.g., stacked on) another level (e.g., another deck) of additional memory cells. The structure of memory array 101, including memory cells 102, can include the structure of memory arrays and memory cells described below with reference to FIG. 2 through FIG. 28C.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or read (e.g., sensed) from memory cells 102.

Memory device 100 can include an address register 106 to receive address information ADDR (e.g., row address signals and column address signals) on lines 107 (e.g., address lines). Memory device 100 can include row access circuitry 108 (e.g., X-decoder) and column access circuitry 109 (e.g., Y-decoder) that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1"), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form of signals DQ0 through DQN) can be based on the values of the signals on data lines 105. In a write operation, the value (e.g., "0" or "1") of information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or the same as any of the memory devices described below with reference to FIG. 2 through FIG. 28C.

Figure 2:
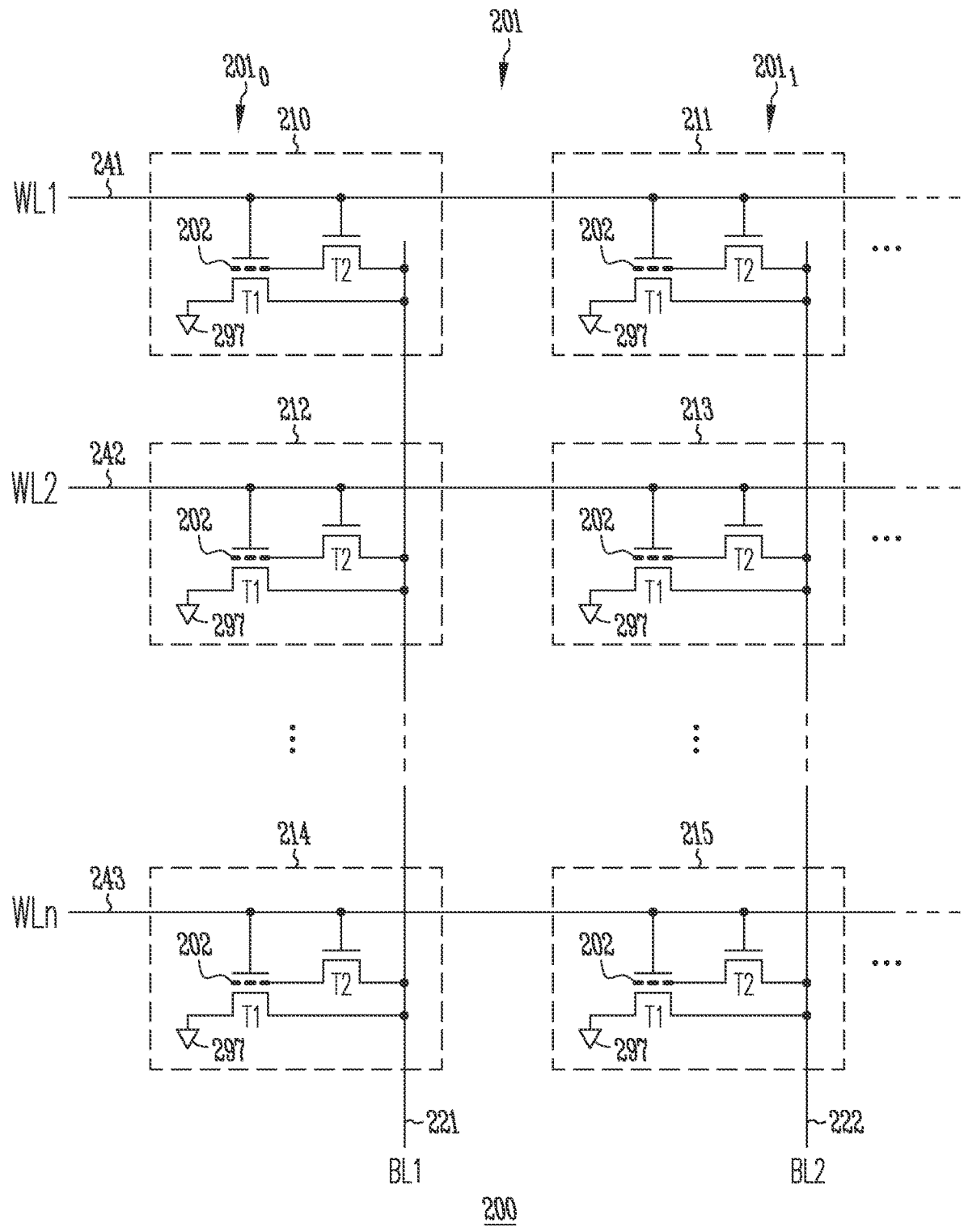
FIG. 2 shows a schematic diagram of a portion of a memory device including a memory array of two-transistor (2T) memory cells, according to some embodiments described herein.

FIG. 2 shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 215, which are volatile memory cells (e.g., DRAM cells). For simplicity, similar or identical elements among memory cells 210 through 215 are given the same labels.

Each of memory cells 210 through 215 can include two transistors T1 and T2. Thus, each of memory cells 210 through 215 can be called a 2T memory cell (e.g., 2T gain cell). Each of transistors T1 and T2 can include a field-effect transistor (FET). As an example, transistor T1 can be a p-channel FET (PFET), and transistor T2 can be an n-channel FET (NFET). Part of transistor T1 can include a structure of a p-channel metal-oxide semiconductor (PMOS) transistor. Thus, transistor T1 can include an operation similar to that of a PMOS transistor. Part of transistor T2 can include an n-channel metal-oxide semiconductor (NMOS). Thus, transistor T2 can include an operation similar to that of a NMOS transistor.

Transistor T1 of memory device 200 can include a charge-storage based structure (e.g., a floating-gate based). As shown in FIG. 2, each of memory cells 210 through 215 can include a charge storage structure 202, which can include the floating gate of transistor T1. Charge storage structure 202 can form the memory element of a respective memory cell among memory cells 210 through 215. Charge storage structure 202 can store charge. The value (e.g., "0" or "1") of information stored in a particular memory cell among memory cells 210 through 215 can be based on the amount of charge in charge storage structure 202 of that particular memory cell. For example, the value of information stored in a particular memory cell among memory cells 210 through 215 can be "0" or "1" (if each memory cell is configured as a single-bit memory cell) or "00", "01", "10", "11" (or other multi-bit values) if each memory cell is configured as a multi-bit memory cell.

As shown in FIG. 2, transistor T2 (e.g., the channel region of transistor T2) of a particular memory cell among memory cells 210 through 215 can be electrically coupled to (e.g., directly coupled to (contact)) charge storage structure 202 of that particular memory cell. Thus, a circuit path (e.g., current path) can be formed directly between transistor T2 of a particular memory cell and charge storage structure 202 of that particular memory cell during an operation (e.g., a write operation) of memory device 200. During a write operation of memory device 200, a circuit path (e.g., current path) can be formed between a respective data line (e.g., data line 221 or 222) and charge storage structure 202 of a particular memory cell through transistor T2 (e.g., through the channel region of transistor T2) of the particular memory cell.

Memory cells 210 through 215 can be arranged in memory cell groups $201_0$ and $201_1$. FIG. 2 shows two memory cell groups (e.g., $201_0$ and $201_1$) as an example. However, memory device 200 can include more than two memory cell groups. Memory cell groups $201_0$ and $201_1$ can include the same number of memory cells. For example, memory cell group $201_0$ can include memory cells 210, 212, and 214, and memory cell group $201_1$ can include memory cells 211, 213, and 215. FIG. 2 shows three memory cells in each of memory cell groups $201_0$ and $201_1$ as an example. The number of memory cells in memory cell groups $201_0$ and $201_1$ can be different from three.

Memory device 200 can perform a write operation to store information in memory cells 210 through 215, and a read operation to read (e.g., sense) information from memory cells 210 through 215. Memory device 200 can be configured to operate as a DRAM device. However, unlike some conventional DRAM devices that store information in a structure such as a container for a capacitor, memory device 200 can store information in the form of charge in charge storage structure 202 (which can be a floating gate structure). As mentioned above, charge storage structure 202 can be the floating gate of transistor T1. During an operation (e.g., a read or write operation) of memory device 200, an access line (e.g., a single access line) and a data line (e.g., a single data line) can be used to access a selected memory cell (e.g., target memory cell).

As shown in FIG. 2, memory device 200 can include access lines (e.g., word lines) 241, 242, and 243 that can carry respective signals (e.g., word line signals) WL1, WL2, and WLn. Access lines 241, 242, and 243 can be used to access both memory cell groups $201_0$ and $201_1$. In the physical structure of memory device 200, each of access lines 241, 242, and 243 can be structured as (can be formed from) at least one conductive line (one conductive line or multiple conductive lines where the multiple conductive lines can be electrically coupled (e.g., shorted) to each other).

Access lines 241, 242, and 243 can be selectively activated (e.g., activated one at a time) during an operation (e.g., read or write operation) of memory device 200 to access a selected memory cell (or selected memory cells) among memory cells 210 through 215. A selected memory cell can be referred to as a target memory cell. In a read operation, information can be read from a selected memory cell (or selected memory cells). In a write operation, information can be stored in a selected memory cell (or selected memory cells).

In memory device 200, a single access line (e.g., a single word line) can be used to control (e.g., turn on or turn off) transistors T1 and T2 of a respective memory cell during either a read or write operation of memory device 200. Some conventional memory devices may use multiple (e.g., two separate) access lines to control access to a respective memory cell during read and write operations. In comparison with such conventional memory devices (that use multiple access lines for the same memory cell), memory device 200 uses a single access line (e.g., shared access line) in memory device 200 to control both transistors T1 and T2 of a respective memory cell to access the respective memory cell. This technique can save space and simplify operation of memory device 200. Further, some conventional memory devices may use multiple data lines to access a selected memory cell (e.g., during a read operation) to read information from the selected memory cell. In memory device 200, a single data line (e.g., data line 221 or 222) can be used to access a selected memory cell (e.g., during a read operation) to read information from the selected memory cell. This may also simplify the structure, operation, or both of memory device 200 in comparison with conventional memory devices that use multiple data lines to access a selected memory cell.

In memory device 200, the gate (not labeled in FIG. 2) of each of transistors T1 and T2 can be part of a respective access line (e.g., a respective word line). As shown in FIG. 2, the gate of each of transistors T1 and T2 of memory cell 210 can be part of access line 241. The gate of each of transistors T1 and T2 of memory cell 211 can be part of access line 241. For example, in the physical structure of memory device 200, four different portions of a conductive material (e.g., four different portions of continuous piece of metal or polysilicon) that forms access line 241 can form the gates (e.g., four gates) of transistors T1 and T2 of memory cell 210 and the gates of transistors T1 and T2 of memory cell 211, respectively.

The gate of each of transistors T1 and T2 of memory cell 212 can be part of access line 242. The gate of each of transistors T1 and T2 of memory cells 213 can be part of access line 242. For example, in the structure of memory device 200, four different portions of a conductive material (e.g., four different portions of continuous piece of metal or polysilicon) that form access line 242 can form the gates (e.g., four gates) of transistors T1 and T2 of memory cell 212 and the gates of transistors T1 and T2 of memory cell 213, respectively.

The gate of each of transistors T1 and T2 of memory cell 214 can be part of access line 243. The gate of each of transistors T1 and T2 of memory cell 215 can be part of access line 243. For example, in the structure of memory device 200, four different portions of a conductive material (e.g., four different portions of continuous piece of metal or polysilicon) that form access line 243 can form the gates (e.g., four gates) of transistors T1 and T2 of memory cell 214 and the gates of transistors T1 and T2 of memory cell 215, respectively.

In this description, a material can include a single material or a combination of multiple materials. A conductive material can include a single conductive material or combination multiple conductive materials.

Memory device 200 can include data lines (e.g., bit lines) 221 and 222 that can carry respective signals (e.g., bit line signals) BL1 and BL2. During a read operation, memory device 200 can use data line 221 to obtain information read (e.g., sensed) from a selected memory cell of memory cell group $206_0$, and data line 222 to read information from a selected memory cell of memory cell group $201_1$. During a write operation, memory device 200 can use data line 221 to provide information to be stored in a selected memory cell of memory cell group $201_0$, and data line 222 to provide information to be stored in a selected memory cell of memory cell group $201_1$.

Memory device 200 can include a ground connection (e.g., ground plate) 297 coupled to each of memory cells 210 through 215. Ground connection 297 can be structured from a conductive plate (e.g., a layer of conductive material) that can be coupled to a ground terminal of memory device 200.

As an example, ground connection 297 can be part of a common conductive structure (e.g., a common conductive plate) that can be formed on a level of memory device 200 that is under the memory cells (e.g., memory cells 210 through 215) of memory device 200. In this example, the elements (e.g., part of transistors T1 and T2 or the entire transistors T1 and T2) of each of the memory cells (e.g., memory cells 210 through 215) of memory device 200 can be formed (e.g., formed vertically) over the common conductive structure (e.g., a common conductive plate) and electrically coupled to the common conductive structure.

In another example, ground connection 297 can be part of separate conductive structures (e.g., separate conductive strips) that can be formed on a level of memory device 200 that is under the memory cells (e.g., memory cells 210 through 215) of memory device 200. In this example, the elements (e.g., part of transistors T1 and T2) of each of the memory cells (e.g., memory cells 210 through 215) of memory device 200 can be formed over (e.g., formed vertically) respective conductive structures (e.g., respective conductive strips) among the separate conductive structures (e.g., separate conductive strips) and electrically coupled to the respective conductive structures.

As shown in FIG. 2, transistor T1 (e.g., the channel region of transistor T1) of a particular memory cell among memory cells 210 through 215 can be electrically coupled to (e.g., directly coupled to) ground connection 297 and electrically coupled to (e.g., directly coupled to) a respective data line (e.g., data line 221 or 222). Thus, a circuit path (e.g., current path) can be formed between a respective data line (e.g., data line 221 or 222) and ground connection 297 through transistor T1 of a selected memory cell during an operation (e.g., a read operation) performed on the selected memory cell.

Memory device 200 can include read paths (e.g., circuit paths). Information read from a selected memory cell during a read operation can be obtained through a read path coupled to the selected memory cell. In memory cell group $201_0$, a read path of a particular memory cell (e.g., memory cell 210, 212, or 214) can include a current path (e.g., read current path) through a channel region of transistor T1 of that particular memory cell, data line 221, and ground connection 297. In memory cell group $201_1$, a read path of a particular memory cell (e.g., memory cell 211, 213, or 215) can include a current path (e.g., read current path) through a channel region of transistor T1 of that particular memory cell, data line 222, and ground connection 297. In the example where transistor T1 is a PFET (e.g., a PMOS), the current in the read path (e.g., during a read operation) can include a hole conduction (e.g., hole conduction in the direction from data line 221 to ground connection 297 through the channel region (e.g., p-channel region) of transistor T1). Since transistor T1 can be used in a read path to read information from the respective memory cell during a read operation, transistor T1 can be called a read transistor and the channel region of transistor T1 can be called a read channel region.

Memory device 200 can include write paths (e.g., circuit paths). Information to be stored in a selected memory cell during a write operation can be provided to the selected memory cell through a write path coupled to the selected memory cell. In memory cell group $201_0$, a write path of a particular memory cell can include transistor T2 (e.g., can include a write current path through a channel region of transistor T2) of that particular memory cell and data line 221. In memory cell group $201_1$, a write path of a particular memory cell (e.g., memory cell 211, 213, or 215) can include transistor T2 (e.g., can include a write current path through a channel region of transistor T2) of that particular memory cell and data line 222. In the example where transistor T2 is an NFET (e.g., NMOS), the current in a write path (e.g., during a write operation) can include an electron conduction (e.g., electron conduction in the direction from data line 221 to charge storage structure 202) through the channel region (e.g., n-channel region) of transistor T2. Since transistor T2 can be used in a write path to store information in a respective memory cell during a write operation, transistor T2 can be called a write transistor and the channel region of transistor T2 can be called a write channel region.

Each of transistors T1 and T2 can have a threshold voltage (Vt). Transistor T1 has a threshold voltage Vt1. Transistor T2 has a threshold voltage Vt2. The values of threshold voltages Vt1 and Vt2 can be different (unequal values). For example, the value of threshold voltage Vt2 can be greater than the value of threshold voltage Vt1. The difference in values of threshold voltages Vt1 and Vt2 allows reading (e.g., sensing) of information stored in charge storage structure 202 in transistor T1 on the read path during a read operation without affecting (e.g., without turning on) transistor T2 on the write path (e.g., path through transistor T2). This can prevent leaking of charge (e.g., during a read operation) from charge storage structure 202 through transistor T2 of the write path.

In a structure of memory device 200, transistors T1 and T2 can be formed (e.g., engineered) such that threshold voltage Vt1 of transistor T1 can be less than zero volts (e.g., Vt1<0V) regardless of the value (e.g., "0" or "1") of information stored in charge storage structure 202 of transistor T1, and Vt1<Vt2. Charge storage structure 202 can be in state "0" when information having a value of "0" is stored in charge storage structure 202. Charge storage structure 202 can be in state "1" when information having a value of "1" is stored in charge storage structure 202. Thus, in this structure, the relationship between the values of threshold voltages Vt1 and Vt2 can be expressed as follows: Vt1 for state "0"<Vt1 for state "1"<0V. and Vt2=0V (or alternatively Vt2>0V).

In an alternative structure of memory device 200, transistors T1 and T2 can be formed (e.g., engineered) such that Vt1 for state "0"<Vt1 for state "1", where Vt1 for state "0"<0V (or alternatively Vt1 for state "0"=0V), Vt1 for state "1">0V, and Vt1<Vt2.

In another alternative structure, transistors T1 and T2 can be formed (e.g., engineered) such that Vt1 for state "0"<Vt1 for state "1", where Vt1 for state "0"=0V (or alternatively Vt1 for state "0">0V), and Vt1<Vt2.

During a read operation of memory device 200, only one memory cell of the same memory cell group can be selected one at a time to read information from the selected memory cell. For example, memory cells 210, 212, and 214 of memory cell group $201_0$ can be selected one at a time during a read operation to read information from the selected memory cell (e.g., one of memory cells 210, 212, and 214 in this example). In another example, memory cells 211, 213, and 215 of memory cell group $201_1$ can be selected one at a time during a read operation to read information from the selected memory cell (e.g., one of memory cells 211, 213, and 215 in this example).

During a read operation, memory cells of different memory cell groups (e.g., memory cell groups $201_0$ and $201_1$) that share the same access line (e.g., access line 241, 242, or 243) can be concurrently selected (or alternatively can be sequentially selected). For example, memory cells 210 and 211 can be concurrently selected during a read operation to read (e.g., concurrently read) information from memory cells 210 and 211. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215.

The value of information read from the selected memory cell of memory cell group $201_0$ during a read operation can be determined based on the value of a current detected (e.g., sensed) from a read path (described above) that includes data line 221, transistor T1 of the selected memory cell (e.g., memory cell 210, 212, or 214), and ground connection 297. The value of information read from the selected memory cell of memory cell group $201_1$ during a read operation can be determined based on the value of a current detected (e.g., sensed) from a read path that includes data line 222, transistor T1 of the selected memory cell (e.g., memory cell 211, 213, or 215), and ground connection 297.

Memory device 200 can include detection circuitry (not shown) that can operate during a read operation to detect (e.g., sense) a current (e.g., current I1, not shown) on a read path that includes data line 221, and detect a current (e.g., current I2, not shown) on a read path that includes data line 222. The value of the detected current can be based on the value of information stored in the selected memory cell. For example, depending on the value of information stored in the selected memory cell of memory cell group $201_0$, the value of the detected current (e.g., the value of current I1) on data line 221 can be zero or greater than zero. Similarly, depending on the value of information stored in the selected memory cell of memory cell group $201_1$, the value of the detected current (e.g., the value of current I2) on data line 222 can be zero or greater than zero. Memory device 200 can include circuitry (not shown) to translate the value of a detected current into the value (e.g., "0", "1", or a combination of multi-bit values) of information stored in the selected memory cell.

During a write operation of memory device 200, only one memory cell of the same memory cell group can be selected at a time to store information in the selected memory cell. For example, memory cells 210, 212, and 214 of memory cell group $201_0$ can be selected one at a time during a write operation to store information in the selected memory cell (e.g., one of memory cell 210, 212, and 214 in this example). In another example, memory cells 211, 213, and 215 of memory cell group $201_1$ can be selected one at a time during a write operation to store information in the selected memory cell (e.g., one of memory cell 211, 213, and 215 in this example).

During a write operation, memory cells of different memory cell groups (e.g., memory cell groups $201_0$ and $201_1$) that share the same access line (e.g., access line 241, 242, or 243) can be concurrently selected. For example, memory cells 210 and 211 can be concurrently selected during a write operation to store (e.g., concurrently store) information in memory cells 210 and 211. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215.

Information to be stored in a selected memory cell of memory cell group $201_0$ during a write operation can be provided through a write path (described above) that includes data line 221 and transistor T2 of the selected memory cell (e.g., memory cell 210, 212, or 214). Information to be stored in a selected memory cell of memory cell group $201_1$ during a write operation can be provided through a write path (described above) that includes data line 222 and transistor T2 of the selected memory cell (e.g., memory cell 211, 213, or 215). As described above, the value (e.g., binary value) of information stored in a particular memory cell among memory cells 210 through 215 can be based on the amount of charge in the charge storage structure 202 of that particular memory cell.

In a write operation, the amount of charge in the charge storage structure 202 of a selected memory cell can be changed (to reflect the value of information stored in the selected memory cell) by applying a voltage on a write path that includes transistor T2 of that particular memory cell and the data line (e.g., data line 221 or 222) coupled to that particular memory cell. For example, a voltage having one value (e.g., 0V) can be applied on data line 221 (e.g., provide 0V to signal BL1) if information to be stored in a selected memory cell among memory cells 210, 212, and 214 has one value (e.g., "0"). In another example, a voltage having another value (e.g., a positive voltage) can be applied on data line 221 (e.g., provide a positive voltage to signal BL1) if information to be stored in a selected memory cell among memory cells 210, 212, and 214 has another value (e.g., "1"). Thus, information can be stored (e.g., directly stored) in the charge storage structure 202 of a particular memory cell by providing the information to be stored (e.g., in the form of a voltage) on a write path (that includes transistor T2) of that particular memory cell.

Figure 3:
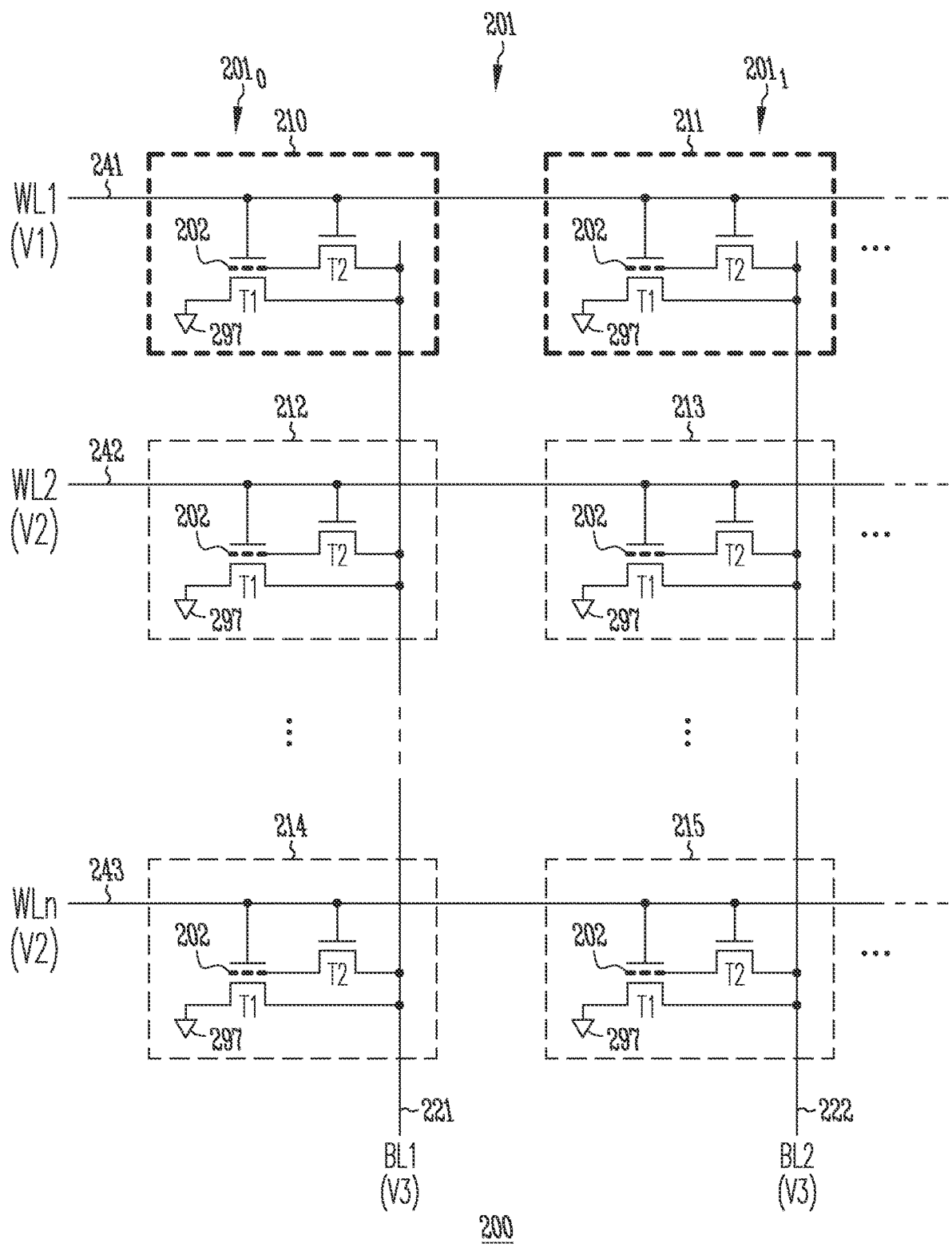
FIG. 3 shows the memory device of FIG. 2, including example voltages used during a read operation of the memory device, according to some embodiments described herein.

FIG. 3 shows memory device 200 of FIG. 2 including example voltages V1, V2, and V3 used during a read operation of memory device 200, according to some embodiments described herein. The example of FIG. 3 assumes that memory cells 210 and 211 are selected memory cells (e.g., target memory cells) during a read operation to read (e.g., to sense) information stored (e.g., previously stored) in memory cells 210 and 211. Memory cells 212 through 215 are assumed to be unselected memory cells. This means that memory cells 212 through 215 are not accessed, and information stored in memory cells 212 through 215 is not read while information is read from memory cells 210 and 211 in the example of FIG. 3. In this example, access line 241 can be called a selected access line (e.g., selected word line), which is the access line associated with (e.g., coupled to) selected memory cells (e.g., memory cells 210 and 211 in this example). In this example, access lines 242 and 243 can be called unselected access lines (e.g., unselected word line), which are the access lines associated with (e.g., coupled to) unselected memory cells (e.g., memory cells 212, 213, 214, and 215 in this example).

In FIG. 3, voltages V1, V2, and V3 can represent different voltages applied to respective access lines 241, 242, and 243 and data lines 221 and 222 during a read operation of memory device 200. Voltage V1 can be applied to the selected access line (e.g., access line 241). In a read operation, Voltage V2 can be applied to the unselected access lines (e.g., access lines 242 and 243).

Voltages V1, V2, and V3 can have different values. As an example, voltages V1, V2, and V3 can have values −1V, 0V, and 0.5V, respectively. The specific values of voltages used in this description are only example values. Different values may be used. For example, voltage V1 can have a negative value range (e.g., the value of voltage V1 can be from −3V to −1V).

In the read operation shown in FIG. 3, voltage V1 can have a value (voltage value) to turn on transistor T1 of each of memory cells 210 and 211 (selected memory cells in this example) and turn off (or keep off) transistor T2 of each of memory cells 210 and 211. This allows information to be read from memory cells 210 and 211. Voltage V2 can have a value, such that transistors T1 and T2 of each of memory cells 212 through 215 (unselected memory cells in this example) are turned off (e.g., kept off). Voltage V3 can have a value, such that a current (e.g., read current) may be formed on a read path that includes data line 221 and transistor T1 of memory cell 210, and a read path (a separate read path) that includes data line 222 and transistor T1 of memory cell 212. This allows a detection of current on the read paths (e.g., on respective data lines 221 and 222) coupled to memory cells 210 and 211, respectively. A detection circuitry (not shown) of memory device 200 can operate to translate the value of the detected current (during reading of information from the selected memory cells) into the value (e.g., "0", "1", or a combination of multi-bit values) of information read from the selected memory cell. In the example of FIG. 3, the value of the detected currents on data lines 221 and 222 can be translated into the values of information read from memory cells 210 and 211, respectively.

In the read operation shown in FIG. 3, the voltages applied to respective access lines 241, 242, and 243 can cause transistors T1 and T2 of each of memory cells 212 through 215, except transistor T1 of each of memory cells 210 and 211 (selected memory cells), to turn off (or to remain turned off). Transistor T1 of memory cell 210 (selected memory cell) may or may not turn on, depending on the value of the threshold voltage Vt1 of transistor T1 of memory cell 210. Transistor T1 of memory cell 211 (selected memory cell) may or may not turn on, depending on the value of the threshold voltage Vt1 of transistor T1 of memory cell 211. For example, if transistor T1 of each of memory cells (e.g., 210 through 215) of memory device 200 is configured (e.g., structured) such that the threshold voltage of transistor T1 is less than zero (e.g., Vt1<−1V) regardless of the value (e.g., the state) of information stored in a respective memory cell 210, then transistor T1 of memory cell 210, in this example, can turn on and conduct a current on data line 221 (through transistor T1 of memory cell 210). In this example, transistor T1 of memory cell 211 can also turn on and conduct a current on data line 222 (through transistor T1 of memory cell 211). Memory device 200 can determine the value of information stored in memory cells 210 and 211 based on the value of the currents on data lines 221 and 222, respectively. As described above, memory device 200 can include detection circuitry to measure the value of currents on data lines 221 and 222 during a read operation.

Figure 4:
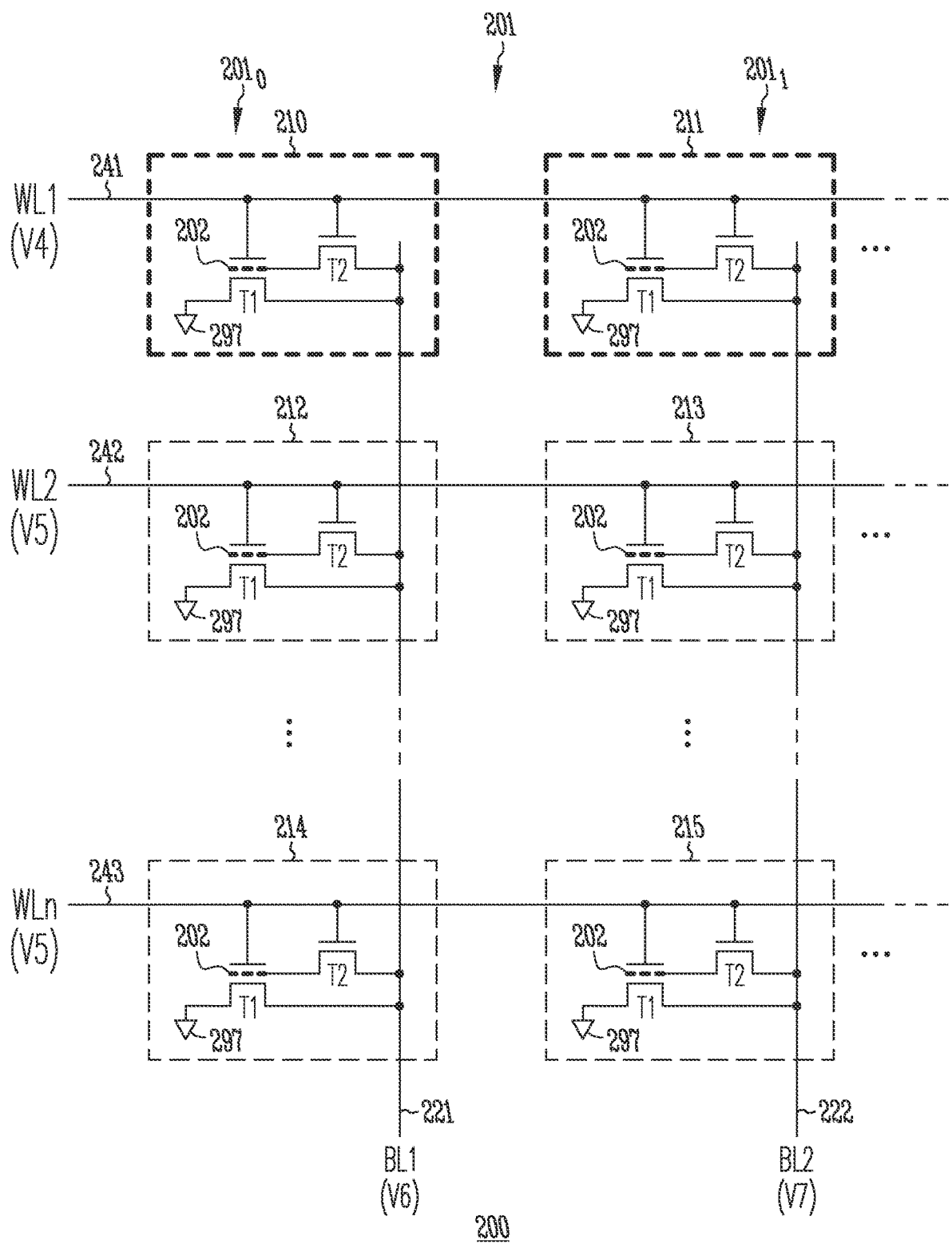
FIG. 4 shows the memory device of FIG. 2, including example voltages used during a write operation of the memory device, according to some embodiments described herein.

FIG. 4 shows memory device 200 of FIG. 2 including example voltages V4, V5, V6, and V7 used during a write operation of memory device 200, according to some embodiments described herein. The example of FIG. 4 assumes that memory cells 210 and 211 are selected memory cells (e.g., target memory cells) during a write operation to store information in memory cells 210 and 211. Memory cells 212 through 215 are assumed to be unselected memory cells. This means that memory cells 212 through 215 are not accessed and information is not to be stored in memory cells 212 through 215 while information is stored in memory cells 210 and 211 in the example of FIG. 4.

In FIG. 4, voltages V4, V5. V6, and V7 can represent different voltages applied to respective access lines 241, 242, and 243 and data lines 221 and 222 during a write operation of memory device 200. In a write operation, voltage V4 can be applied to the selected access line (e.g., access line 241). Voltage V5 can be applied to the unselected access lines (e.g., access lines 242 and 243).

Voltages V4, V5, V6, and V7 can have different values. As an example, voltages V4 and V5 can have values of 3V and 0V, respectively. These values are example values. Different values may be used.

The values of voltages V6 and V7 can be the same or different depending on the value (e.g., "0" or "1") of information to be stored in memory cells 210 and 211. For example, the values of voltages V6 and V7 can be the same (e.g., V6=V7) if the memory cells 210 and 211 are to store information having the same value. As an example, V6=V7=0V if information to be stored in each memory cell 210 and 211 is "0". In another example, V6=V7=V+(e.g., V+ is a positive voltage (e.g., from 1V to 3V)) if information to be stored in each memory cell 210 and 211 is "1".

In another example, the values of voltages V6 and V7 can be different (e.g., V6≠V7) if the memory cells 210 and 211 are to store information having different values. As an example, V6=0V if "0" is to be stored in memory cell 210, and V7=V+(e.g., V+ is a positive voltage (e.g., from 1V to 3V)) if "1" is to be stored in memory cell 211. As another example, V6=V+(e.g., V+ is a positive voltage (e.g., from 1V to 3V)) if "1" is to be stored in memory cell 210, and V7=0V if "0" is to be stored in memory cell 211.

The range of voltage of 1V to 3V is used here as an example. A different range of voltages can be used. Further, instead of applying 0V (e.g., V6=0V or V7=0V) to a particular write data line (e.g., data line 221 or 222) for storing information having a value of "0" to the memory cell (e.g., memory cell 210 or 211) coupled to that particular write data line, a positive voltage (e.g., V6>0V or V7>0V) may be applied to that particular data line.

In a write operation of memory device 200 of FIG. 4, voltage V5 can have a value (e.g., V5=0V or V5<0V), such that transistors T1 and T2 of each of memory cells 212 through 215 (unselected memory cells, in this example) are turned off (e.g., kept off). Voltage V4 can have a value (e.g., V4>0V) to turn on transistor T2 of each of memory cells 210 and 211 (selected memory cells in this example) and form a write path between charge storage structure 202 of memory cell 210 and data line 221, and a write path between charge storage structure 202 of memory cell 211 and data line 222. A current (e.g., write current) may be formed between charge storage structure 202 of memory cell 210 (selected memory cell) and data line 221. This current can affect (e.g., change) the amount of charge on charge storage structure 202 of memory cell 210 to reflect the value of information to be stored in memory cell 210. A current (e.g., another write current) may be formed between charge storage structure 202 of memory cell 211 (selected memory cell) and data line 222. This current can affect (e.g., change) the amount of charge on charge storage structure 202 of memory cell 211 to reflect the value of information to be stored in memory cell 211.

In the example write operation of FIG. 4, the value of voltage V6 may cause charge storage structure 202 of memory cell 210 to discharge or to be charged, such that the resulting charge (e.g., charge remaining after the discharge or charge action) on charge storage structure 202 of memory cell 210 can reflect the value of information stored in memory cell 210. Similarly, the value of voltage V7 in this example may cause charge storage structure 202 of memory cell 211 to discharge or to be charged, such that the resulting charge (e.g., charge remaining after the discharge or charge action) on charge storage structure 202 of memory cell 211 can reflect the value of information stored in memory cell 211.

FIG. 5. FIG. 6, FIG. 7A, FIG. 7B, and FIG. 7C show different views of a structure of memory device 200 of FIG. 2 with respect to the X. Y. and Z directions, according to some embodiments described herein. For simplicity, cross-sectional lines (e.g., hatch lines) are omitted from most of the elements shown in FIG. 5. FIG. 6, FIG. 7A, FIG. 7B, and FIG. 7C and other figures (e.g., FIG. 8A through FIG. 28C) in the drawings described herein. Some elements of memory device 200 (and other memory devices described herein) may be omitted from a particular figure of the drawings so as to not obscure the description of the element (or elements) being described in that particular figure. The dimensions (e.g., physical structures) of the elements shown in the drawings described herein are not scaled.

Figure 7B:
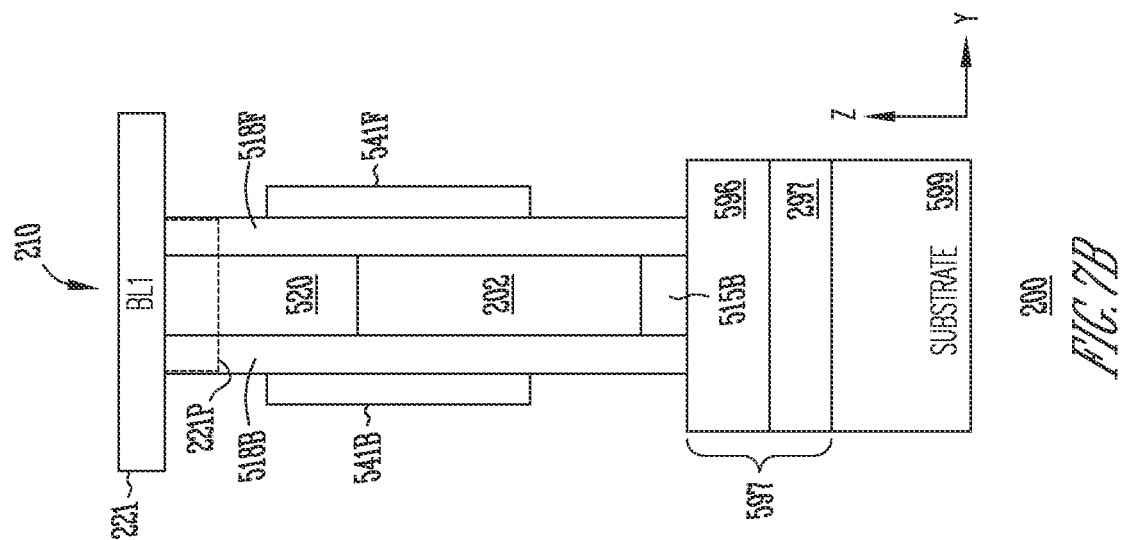
FIG. 7B, and FIG. 7C show different views of a structure of the memory device of FIG. 2 including data lines having discontinuous wrapped portions, according to some embodiments described herein.
Figure 7C:
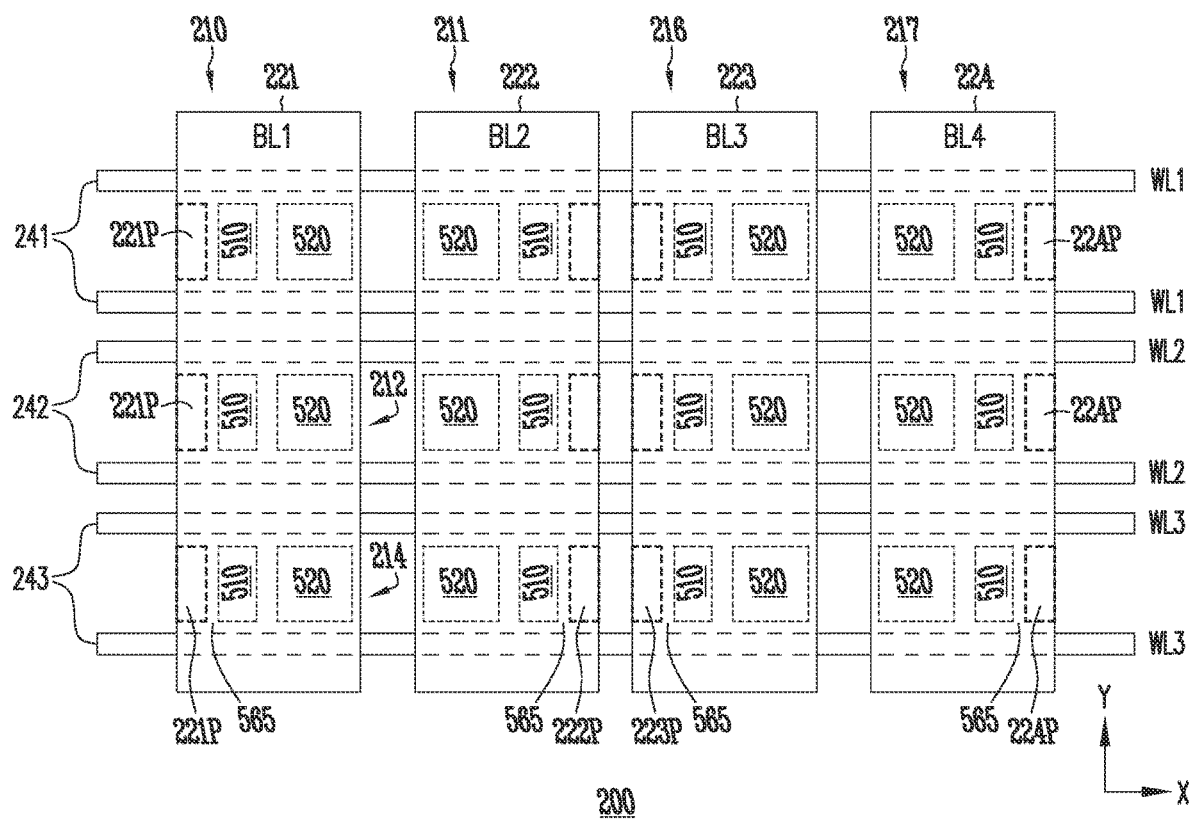

FIG. 5 and FIG. 6 show different 3-dimensional views (e.g., isometric views) of memory device 200 including memory cell 210 with respect to the X, Y. and Z directions. FIG. 7A shows a side view (e.g., cross-sectional view) of memory device 200 including memory cells 210, 211, 216, and 217 with respect to the X-Z direction taken along line 7A in FIG. 5 and FIG. 6. FIG. 7B shows a view (e.g., cross-sectional view) taken along line 7B of FIG. 7A. FIG. 7C shows a top view (e.g., plan view) of memory device 200 of FIG. 7A including relative locations of data lines 221, 222, 223, and 224 (and associated signals BL1, BL2. BL3, and BL4), and access lines 241, 242, and 243 (associated signals WL1, WL2, WL3, and WL4). For simplicity, other elements of memory device 200 are omitted from FIG. 7C.

The following description refers to FIG. 5, FIG. 6. FIG. 7A. FIG. 7B, and FIG. 7C. FIG. 5 and FIG. 6 show the structure of one memory cell (e.g., memory cell 210) of memory device 200. The structures of other memory cells (e.g., memory cells 211 through 215 in FIG. 2) of memory device 200 can be similar to or the same as the structure of memory cell 210 in FIG. 5 through FIG. 7C. In FIG. 2 through FIG. 7C, the same elements are given the same reference numbers. Some portions (e.g., gate oxide and cell isolation structures) of memory device 200 are omitted from FIG. 5 through FIG. 7C so as to not obscure the elements of memory device 200 in the embodiments described herein.

As shown in FIG. 5, memory device 200 can include a substrate 599 over which memory cell 210 (and other memory cells (not shown) of memory device 200) can be formed. Transistors T1 and T2 of memory cell 210 can be formed vertically with respect to substrate 599. Substrate 599 can be a semiconductor substrate (e.g., silicon-based substrate) or other type of substrate. The Z-direction (e.g., vertical direction) is a direction perpendicular to (e.g., outward from) substrate 599. The Z-direction is also perpendicular to (e.g., extended vertically from) the X-direction and the Y-direction. The X-direction and Y-direction are perpendicular to each other.

As shown in FIG. 5 and FIG. 6, ground connection 297 can include a structure (e.g., a piece (e.g., a layer)) of conductive material (e.g., conductive region) located over (formed over) substrate 599. Example materials for ground connection 297 include a piece of metal, conductively doped polysilicon, or other conductive materials. Ground connection 297 can be coupled to a ground terminal (not shown) of memory device 200. FIG. 5 and FIG. 6 show ground connection 297 contacting (e.g., directly coupled to) substrate 599 as an example. In an alternative structure, memory device 200 can include a dielectric (e.g., a layer of dielectric material, not shown) between ground connection 297 and substrate 599.

As shown in FIG. 5, FIG. 6, FIG. 7A, and FIG. 7B, memory device 200 can include a semiconductor material 596 formed over ground connection 297. Semiconductor material 596 can include a structure (e.g., a piece (e.g., a layer)) of silicon, polysilicon, or other semiconductor material, and can include a doped region (e.g., p-type doped region), or other conductive materials.

FIG. 7A shows memory cells 216 and 217 and associated data lines 223 and 224 that are not shown in FIG. 2. However, as shown in FIG. 7A and FIG. 7C, memory cells 216 and 217 can share access line 241 with memory cells 210 and 211.

As shown in FIG. 5, FIG. 6, and FIG. 7A, access line 241 can be structured by (can include) a combination of portions 541F and 541B (e.g., front and back conductive portions) that can be opposite from each other in respect to (looking from) the Y-direction. Each of portions 541F and 541B can include a conductive material (or a combination of materials) that can be structured as a conductive line (e.g., conductive region) having a length extending continuously in the X-direction. Thus, portions 541F and 541B can be part of conductive lines that are opposite from each other (e.g., opposite from each other in the Y-direction).

Each of portions 541F and 541B can include a structure (e.g., a piece (e.g., a layer)) of conductive material (e.g., metal, conductively doped polysilicon, or other conductive materials). Each of portions 541F and 541B can have a length (shown in FIG. 5) in the X-direction, a width (shown in FIG. 5) in the Z-direction, and a thickness (shown in FIG. 8A) in the Y-direction.

Portions 541F and 541B can be electrically coupled to each other. For example, memory device 200 can include a conductive material (e.g., not shown) that can contact (e.g., electrically couple to) portions 541F and 541B, such that portions 541F and 541B (which are part of a single access line 241) can be concurrently applied by the same signal (e.g., signal WL1).

In an alternative structure of memory device 200, one of the two portions (e.g., portions 541F and 541B) of each of the access lines of memory device 200 can be omitted. For example, either portion 541F or portion 541B be omitted, such that access line 241 can include only either portion 541F or portion 541B. In the structure shown in FIG. 5, FIG. 6. FIG. 7A, and FIG. 7B, including two portions (e.g., portions 541F and 541B) in each access line and can help better control transistor T1 (e.g., transistor T1, shown schematically in FIG. 2) of each of the memory cells of memory device 200 during a read operation.

Charge storage structure 202 (FIG. 5 through FIG. 7B) of each memory cell of memory device 200 can include a charge storage material (or a combination of materials), which can include a piece (e.g., a layer) of semiconductor material (e.g., polysilicon), a piece (e.g., a layer) of metal, or a piece of material (or materials) that can trap charge. The materials for charge storage structure 202 and the portions (e.g., portions 541F and 541B in FIG. 5) of the access lines (e.g., access line 241) of memory device 200 can be the same or can be different. As shown in FIG. 5, charge storage structure 202 can include a portion (e.g., bottom portion) that is closer (e.g., extends in the Z-direction closer) to substrate 599 than the bottom portion of each of portions 541F and 541B of access line 241.

As shown in FIG. 7A, each charge storage structure 202 can include an edge (e.g., top edge) 202', and portions 541F and 541B of access line 241 can include respective edges (e.g., bottom edges) 541'. FIG. 7A shows an example where edge 202' is at a specific distance (e.g., distance shown in FIG. 7A) from edges 541'. However, the distance between edge 202' of charge storage structure 202 and edges 541' of portions 541F and 541B may vary. For example, FIG. 7A shows edges 541' being below edge 202' with respect to the Z-direction, such that portions 541F and 541B can overlap (in the Z-direction) charge storage structure 202. However, edges 541' can alternatively be above edge 202' with respect to the Z-direction, such that portions 541F and 541B may not overlap (in the Z-direction) charge storage structure 202.

As shown in FIG. 5. FIG. 6, FIG. 7A, FIG. 7B, memory device 200 can include material 520 located between data line 221 and charge storage structure 202. Material 520 can be electrically coupled to (e.g., directly coupled to (contact)) data line 221. Material 520 can also be electrically coupled to (e.g., directly coupled to (contact)) charge storage structure 202 of memory cell 210. As described above, charge storage structure 202 of memory cell 210 can form the memory element of memory cell 210. Thus, memory cell 210 can include a memory element (which is charge storage structure 202) located between substrate 599 and material 520 with respect to the Z-direction, and the memory element contacts (e.g., directly coupled to) material 520.

Material 520 can form a source (e.g., source terminal), a drain (e.g., drain terminal), and a channel region (e.g., write channel region) between the source and the drain of transistor T2 of memory cell 210. Thus, as shown in FIG. 5, FIG. 6, and FIG. 7A, the source, channel region, and the drain of transistor T2 of memory cell 210 can be formed from a single piece of the same material (or alternatively, a single piece of the same combination of materials), such as material 520. Therefore, the source, the drain, and the channel region of transistor T2 of memory cell 210 can be formed from the same material (e.g., material 520) of the same conductivity type (e.g., either n-type or p-type). Other memory cells of memory device 200 can also include material 520 like memory cell 210.

Material 520 can include a structure (e.g., a piece (e.g., a layer)) of semiconductor material. In the example where transistor T2 is an NFET (as described above), material 520 can include n-type semiconductor material (e.g., n-type silicon).

In another example, the semiconductor material that forms material 520 can include a structure (e.g., a piece) of oxide material. Examples of the oxide material used for material 520 include semiconducting oxide materials, transparent conductive oxide materials, and other oxide materials.

As an example, material 520 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

Using the materials listed above in memory device 200 provides improvement and benefits for memory device 200. For example, during a read operation, to read information from a selected memory cell (e.g., memory cell 210), charge from charge storage structure 202 of the selected memory cell may leak to transistor T2 of the selected memory cell. Using the material listed above for the channel region (e.g., material 520) of transistor T2 can reduce or prevent such a leakage. This improves the accuracy of information read from the selected memory cell and improves the retention of information stored in the memory cells of the memory device (e.g., memory device 200) described herein.

The materials listed above are examples of material 520. However, other materials (e.g., a relatively high band-gap material) different from the above-listed materials can be used.

As shown in FIG. 5, FIG. 6, and FIG. 7A, material 520 and charge storage structure 202 of memory cell 210 can be electrically coupled (e.g., directly coupled) to each other, such that material 520 can contact charge storage structure 202 of memory cell 210 without an intermediate material (e.g., without a conductive material) between charge storage structure 202 of memory cell 210 and material 520. In an alternative structure (not shown), material 520 can be electrically coupled to charge storage structure 202 of memory cell 210, such that material 520 is not directly coupled to (not contacting) charge storage structure 202 of memory cell 210, but material 520 is coupled to (e.g., indirectly contacting) charge storage structure 202 of memory cell 210 through an intermediate material (e.g., a conductive material) between charge storage structure 202 of memory cell 210 and material 520.

As shown in FIG. 5, FIG. 6, and FIG. 7A, memory cell 210 can include a material 510, which can include a structure (e.g., a piece (e.g., a layer)) of semiconductor material. Example materials for material 510 can include silicon, polysilicon (e.g., undoped or doped polysilicon), germanium, silicon-germanium, or other semiconductor materials and semiconducting oxide materials (oxide semiconductors, e.g., SnO or other oxide semiconductors).

As described above with reference to FIG. 2, transistor T1 of memory cell 210 includes a channel region (e.g., read channel region). In FIG. 5, FIG. 6, and FIG. 7A, the channel region of transistor T1 of memory cell 210 can include (e.g., can be formed from) material 510. Material 510 can be electrically coupled to (e.g., directly coupled to (contact) data line 221. As described above with reference to FIG. 2, memory cell 210 can include a read path. In FIG. 5, FIG. 6, and FIG. 7A, material 510 (e.g., the read channel region of transistor T1 of memory cell 210) can be part of the read path of memory cell 210 that can carry a current (e.g., read current) during a read operation of reading information from memory cell 210. For example, during a read operation, to read information from memory cell 210, material 510 can conduct a current (e.g., read current (e.g., holes)) between data line 221 and ground connection 297 (through part of semiconductor material 596). The direction of the read current can be from data line 221 to ground connection 297 (through material 510 and part of semiconductor material 596). In the example where transistor T1 is a PFET and transistor T2 is an NFET, the material that forms material 510 can have a different conductivity type from material 520. For example, material 510 can include p-type semiconductor material (e.g., p-type silicon) regions, and material 520 can include n-type semiconductor material (e.g., n-type gallium phosphide (GaP)) regions.

As shown in FIG. 5. FIG. 6, and FIG. 7A, memory cell 210 can include dielectric materials 515A and 515B. Dielectric materials 515A and 515B can be gate oxide regions that electrically separate each of charge storage structure 202 and material 520 from material 510 (e.g., the channel region of transistor T1). Dielectric materials 515A and 515B can also electrically separate charge storage structure 202 from semiconductor material 596.

Example materials for dielectric materials 515A and 515B include silicon dioxide, hafnium oxide (e.g., $HfO_2$), aluminum oxide (e.g., $Al_2O_3$), or other dielectric materials. In an example structure of memory device 200, dielectric materials 515A and 515B include a high-k dielectric material (e.g., a dielectric material having a dielectric constant greater than the dielectric constant of silicon dioxide). Using such a high-k dielectric material (instead of silicon dioxide) can improve the performance (e.g., reduce current leakage, increase drive capability of transistor T1, or both) of memory device 200.

As shown in FIG. 7A, the memory cells (e.g., memory cells 210, 211, 216, and 217) of memory device 200 can share (e.g., can electrically couple to) semiconductor material 596. For example, the read channel regions of the memory cells (e.g., material 510 of each of memory cells 210, 211, 216, and 217) of memory device 200 can contact (e.g., can be electrically coupled to) semiconductor material 596.

As shown in FIG. 5, FIG. 6, and FIG. 7A, memory device 200 can include a conductive region 597 (e.g., a common conductive plate) under the memory cells (e.g., memory cells 210, 211, 216, and 217 in FIG. 7A) of memory device 200. Conductive region 597 can include at least one of the materials (e.g., doped polysilicon) of semiconductor material 596 and the material (e.g., metal or doped polysilicon) of ground connection 297. For example, conductive region 597 can include the material of semiconductor material 596, the material of ground connection 297, or the combination of the materials of semiconductor material 596 and ground connection 297. Thus, as shown FIG. 7A, the memory cells (e.g., memory cells 210, 211, 216, and 217) of memory device 200 can share conductive region 597 (which can include any combination of semiconductor material 596 and ground connection 297).

As shown in FIG. 5 and FIG. 6, part of portion 541F can be adjacent part of material 510 and part of material 520 and can span across (e.g., overlap in the X-direction) part of material 510 and part of material 520. As described above, material 510 can form part of a read channel region of transistor T1 and material 520 can form part of a write channel region of transistor T2. Thus, as shown in FIG. 5 and FIG. 6, part of portion 541F can span across (e.g., overlap) part of (e.g., on a side (e.g., front side) in the Y-direction) both read and write channel regions of transistors T1 and T2, respectively. Similarly, part of portion 541B can be adjacent material 510 and a part of material 520, and can span across (e.g., overlap in the X-direction) part of (e.g., on another side (e.g., back side opposite from the front side) in the Y-direction) material 510 and a part of material 520. As shown in FIG. 7A, each of portions 541F and 541B of access line 241 can also span across (e.g., overlap in the X-direction) part of material 510 (e.g., a portion of the read channel region of transistor T1) and part of material 520 (e.g., a portion of write channel region of transistor T2) of other memory cells (e.g., memory cells 211, 216, and 217) of memory device 200. The spanning (e.g., overlapping) of access line 241 across material 510 and material 520 allows access line 241 (a single access line) to control (e.g., to turn on or turn off) both transistors T1 and T2 of memory cells 210, 211, 216, and 217.

As shown in FIG. 7A, memory device 200 can include dielectric material (e.g., silicon dioxide) 526 that can form a structure (e.g., a dielectric) to electrically separate (e.g., isolate) parts of two adjacent (in the X-direction) memory cells of memory device 200. For example, dielectric material 526 between memory cells 210 and 211 can electrically separate material 520 (e.g., write channel region of transistor T2) of memory cell 210 from material 520 (e.g., write channel region of transistor T2) of memory cell 211, and electrically separate charge storage structure 202 of memory cell 210 from charge storage structure 202 of memory cell 211.

As shown in FIG. 7A, memory device 200 can include dielectric portions 555. Material (e.g., read channel region) 510 of two adjacent memory cells (e.g., memory cells 211 and 216) can be electrically separated from each other by one of dielectric portions 555. Some of portions (e.g., materials) of the memory cells of memory device 200 can be formed adjacent (e.g., formed on) a side wall (e.g., vertical portion with respect to the Z-direction) of a respective dielectric portion among dielectric portions 555. For example, as shown in FIG. 7A, material 510 (e.g., semiconductor material portion) of memory cell 210 can be formed adjacent (e.g., formed on) a side wall (not labeled) of dielectric portion 555 (on the left of memory cell 210). In another example, material 510 (e.g., semiconductor material portion) of memory cell 211 can be formed adjacent (e.g., formed on) a side wall (not labeled) of dielectric portion 555 between memory cells 211 and 216.

As shown in FIG. 7B, memory device 200 can include dielectric materials 518F and 518B (e.g., gate oxide regions) to electrically separate portions 541F and 541B of access line 241 from other elements (e.g., from material 510), charge storage structure 202, and material 520 of memory cell 210. The material (or materials) for dielectric materials 518F and 518B can be the same as (or alternatively, different from) the material (or materials) of dielectric materials 515A and 515B. Example materials for dielectric materials 518F and 518B can include silicon dioxide, hafnium oxide (e.g., $HfO_2$), aluminum oxide (e.g., $Al_2O_3$), or other dielectric materials.

As shown in FIG. 7B, portions 541F and 541B can be adjacent respective sides of material 520 and charge storage structure 202 of memory cell 210. For example, portion 541F can be adjacent a side (e.g., right side (or front side) in the X-direction in the view of FIG. 7B) of a portion of each of material 520 and charge storage structure 202. In another example, portion 541B can be adjacent another side (e.g., left side or back side (opposite from the right side) in the X-direction in the view of FIG. 7B) of a portion of each of material 520 and charge storage structure 202.

The above description focuses on the structure of memory cell 210. Other memory cells (e.g., memory cells 211, 216, and 217 in FIG. 7A) of memory device 200 can include elements structured in ways similar or the same as the elements of memory cell 210, described above. For example, as shown in FIG. 7A, memory cell 211 can include charge storage structure 202, material (e.g., write channel region) 520, material 510 (e.g., read channel region), and dielectric materials 525A and 525B. The material (or materials) for dielectric materials 525A and 525B can the same as the material (or materials) for dielectric materials 515A and 515B. Memory cells 216 and 217 can include elements structured in ways similar or the same as the elements of memory cells 210 and 211, respectively.

As described above. FIG. 7C shows a top view (e.g., plan view) of a portion of memory device 200 of FIG. 2 and FIG. 7A. FIG. 7C also shows relative locations of portions (e.g., wrapped portions) 221P, 222P, 223P, and 224P of data lines 221, 222, 223, and 224, respectively.

The following description describes data line 221. Other data lines (e.g., data lines 222, 223, and 224) of memory device 200 have similar structure and material as data line 221. As shown in FIG. 5 through FIG. 7C, data line 221 (associated with signal BL1) can have a length in the Y-direction, a width in the X-direction, and a thickness in the Z-direction. Data line 221 can include a conductive material (or a combination of materials) that can be structured as a conductive line (e.g., conductive region) having a length in the Y-direction. Example materials for data line 221 include metal, conductively doped polysilicon, or other conductive materials. Other data lines 222, 223, and 224 (associated with signals BL2, BL3, and BLA, respectively) can have a length, a width, a thickness, and a material similar to or the same as data line 221.

As shown in FIG. 5 through FIG. 7C, data line 221 can have portions 221P adjacent respective materials 510 (e.g., read channel regions) of respective memory cells 212 and 214 (FIG. 7C). Portions 221P of data line 221 can have the same material (e.g., conductive material) as the rest (e.g., as top portion) of data line 221. Portion 221P can be part (e.g., side part) of data line 221 that joins a top part of data line 221 and forms 90 degrees with the top part (e.g., portion 221P can be part of data line 221 that is perpendicular to the top part of data line 221).

As shown in FIG. 7A, portion 221P of data line 221 can partially wrap around a side (e.g., left side in FIG. 7A) of part (e.g., top part) of material 510 (e.g., a read channel region) of memory cell 210. Thus, portion 221P can be called a wrapped portion of data line 221. The wrapped portion (e.g., portion 221P) can also be called an overhang portion, which overhangs the side (e.g., left side in FIG. 7A) of part (e.g., top part) of material 510 (e.g., a read channel region) and extends toward substrate 599.

As shown in FIG. 7C, data line 221 can include a continuous top portion contacting material 510 (e.g., read channel region) and material 520 (e.g., write channel region) of respective memory cells 210, 212, and 214. Portions 221P are discontinuous (e.g., patterned) portions of data line 221, such that a gap void of the material of data line 221 is between vertical sides (sides parallel to the Z-direction) of two adjacent portions 221P. In an alternative structure (FIG. 8A, FIG. 8B, and FIG. 8C) of memory device 200, there is no gap between vertical sides of adjacent portions 221P (e.g., no void in the material of data line 221 between vertical sides of adjacent portions 221P).

As shown in FIG. 7A, material 510 includes opposite sides in the X-direction, such as a side (e.g., left side) adjacent portion 221P and another side (e.g., right side) adjacent material 520. Data line 221 can contact material 510 and material 520 at an interface 221i. Portion 221P can have a length L1 in the Z-direction and can extend (toward substrate 599) to a level below the level of interface 221i.

Portion 221P (FIG. 7A and FIG. 7C) can be located (e.g., can be formed) in a trench (not labeled) adjacent material 510. The trench is separated from material 510 by dielectric material 565. Portion 221P is separated from material 510 by dielectric material 565, such that dielectric material 565 is between and contacts portion 221P and material 510.

As shown in FIG. 7A and FIG. 7C, other data lines 221, 223, and 224 can have similar wrapped portions (e.g., portions 222P, 223P, and 224P) adjacent respective materials 510 of other memory cells. For simplicity, details of portions 222P, 223P, and 224P are not described here.

The structure of memory device 200 allows it to have a relatively smaller size (e.g., smaller footprint) and improved (e.g., reduced) power consumption (as result of using a single access line (e.g., word line) to control two transistors of a corresponding memory cell). Further, the structure of data lines (e.g., data lines 221, 222, 223, and 224) of memory device 200 also allows memory device 200 to have an improved operation (e.g., improved write operation) that can further provide power reduction in which static power (in write operation) can be mitigated or prevented, as discussed below with reference to FIG. 4 and FIG. 7C.

As shown in FIG. 7A, portion 221P can have a length L1 (in the Z-direction), which can be less than the length (not labeled) of material 510 (e.g., read channel region) and less than the length (not labeled) of material 520 (e.g., write channel region) of memory cell 210. The length of material 510 can be measured in the Z-direction from interface 221i to a surface (not labeled) of semiconductor material 596. As shown in FIG. 7A, the Z-direction is also a direction from material 520 (e.g., write channel region) to charge storage structure 202. The length of material 520 can be measured in the Z-direction from interface 221i to edge 202' of charge storage structure 202.

The length (e.g., length L1) of portion 221P can be selected such that power consumption in operations (e.g., write operations) of memory device 200 can be improved (e.g., reduced) without incurring too much coupling capacitance between data line 221 and other elements. For example, as shown in FIG. 7A, portion 221P can be formed such that length L1 can be less than the length (in the Z-direction) of material 510 and less than the length (in the Z-direction) of material 520. The relationship between the length (e.g., length L1) of portion 221P and the length of each of material 510 and material 520 as described here and as shown in FIG. 7A can provide improvement in memory device 200, as discussed in detail below.

In an alternative structure of memory device 200, each data line can have an alternative wrapped portion (e.g., a mirror of portion 221P in the X-direction) formed adjacent a write channel region (e.g., adjacent material 520 in FIG. 7A) of a respective memory cell instead of adjacent the read channel region (e.g., material 510). In another alternative structure of memory device 200, each data line can have two wrapped portions, such that each data line can have an additional wrapped portion (e.g., besides the wrapped portion shown in FIG. 7A) formed adjacent a write channel region (e.g., adjacent material 520 in FIG. 7A). However, both alternative structures mentioned here may provide less improvement and benefit in comparison with the structure shown in FIG. 7A for some conditions during some operations of memory device 200, as discussed below.

As shown in FIG. 4 and FIG. 7C, memory cells 210, 212, and 214 are associated with different access lines 241, 242, and 243 and share data line 221. In a write operation as described above with reference to FIG. 4, voltage V4 (e.g., V4>0V) can be applied to access line 241 (selected access line) to turn on transistor T2 of memory cell 210 (selected memory cell) to access memory cell 210. In this write operation, voltage V5 (e.g., V5=0V or V5<0V) can be applied to access lines 242 and 243 to turn off transistor T1 and T2 of memory cells 212 and 214 (unselected memory cells). However, static power (e.g., leakage current) may occur in the unselected memory cells. For example, in FIG. 4, if voltage V6 applied to data line 221 (as part of storing information (e.g., "1") in selected memory cell 210) is greater than voltage V5 (e.g., V6>V5) applied to access lines 242 and 243, then static power (e.g., leakage current) may occur in the read channel region (e.g., in material 510 in FIG. 7A) of transistor T1 of the unselected memory cell (memory cell 212 or 214). Portion 221P (FIG. 5. FIG. 7A, and FIG. 7C) is formed to mitigate or prevent such a static power. For example, as shown in FIG. 7C, since portion 221P is adjacent a side (in the X-direction) of material 510 (e.g., read channel region) of memory cell 212, portion 221P can impede a static power from occurring in the unselected memory cell (e.g., occurring in material 510 of the unselected memory cell) or to mitigate such a static power. This can improve the write operation of memory device 200 and reduce power consumption associated with the write operation.

As described above, portion 221P of data line 221 in FIG. 7A can be alternatively formed adjacent material 520 (instead of adjacent material 510). However, at some value of voltage V6 (e.g., V6=0V) applied on data line 221 as part of storing information (e.g., "0") in the selected memory cell 210 during a write operation, portion 221P (if formed adjacent material 520 (e.g., write channel region) of memory cell 210) of data line 221 can impede current provided (through material 520) to the selected memory cell 210. This can reduce the efficiency to the write operation compared with the write operation described above with reference to FIG. 4. Thus, a wrapped portion (e.g., portion 221P) of a data line can be formed adjacent material 510 (e.g., read channel region), adjacent material 520 (e.g., write channel region), or two wrapped portions can be formed adjacent material 510 and material 520, respectively, of a respective memory cell. However, forming portion 221P as shown in FIG. 7A can be more beneficial than forming portion 221P in the alternative structures, as discussed above. Therefore, in some structures of memory device 200, data line 271 does not have a portion (e.g., a wrapped portion) horizontally adjacent material (e.g., write channel region) 520. For example, in some structures of memory device, data line 271 does not have a portion adjacent material 520 that is opposite from portion 221P in the X-direction (e.g., horizontal direction).

Figure 8A:
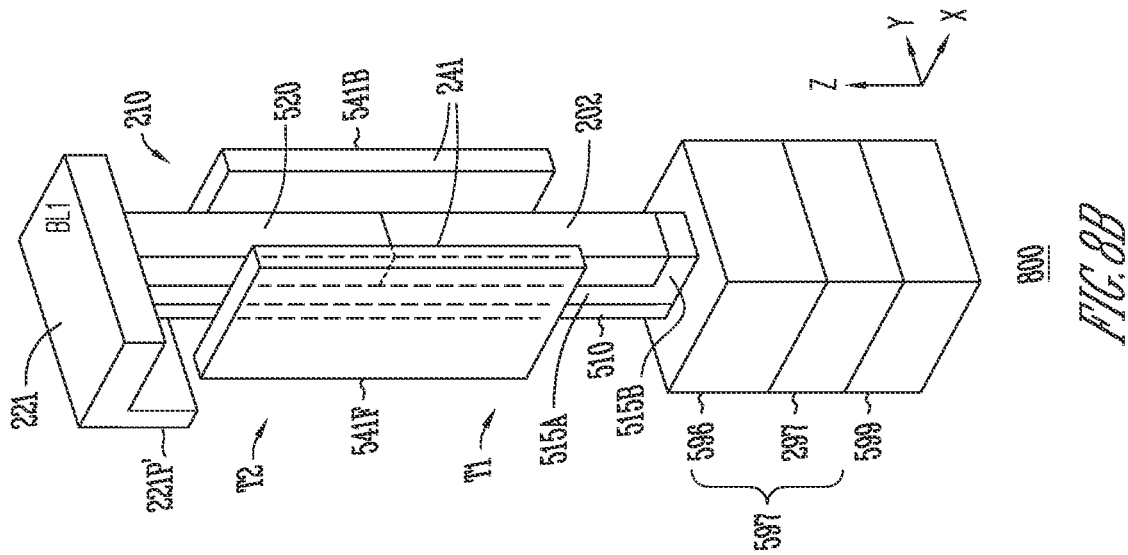
FIG. 8A, FIG. 8B, FIG. 8C show different views of a structure of the memory device including data lines having continuous wrapped portions, according to some embodiments described herein.
Figure 8B:
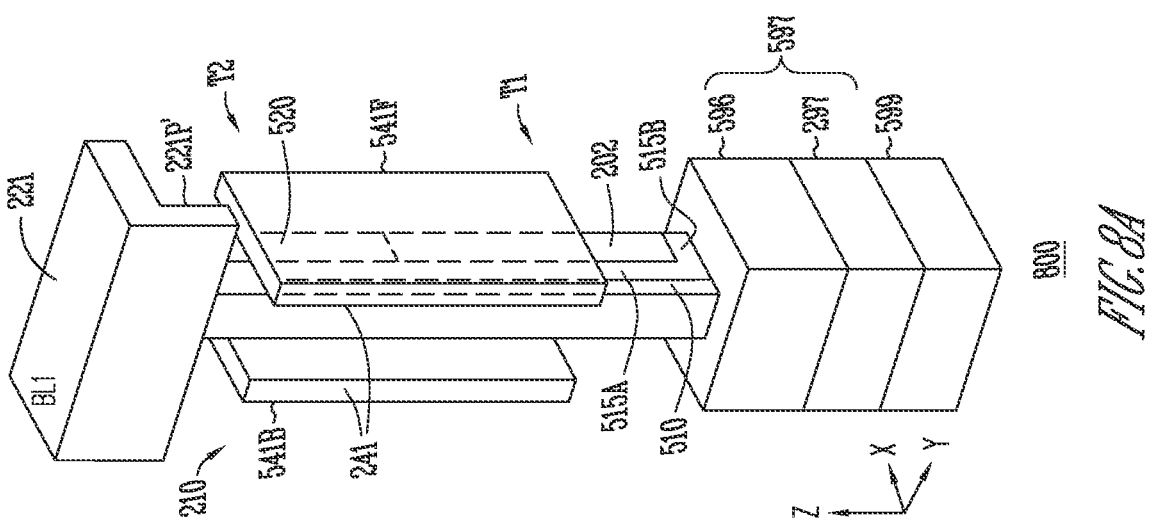
Figure 8C:
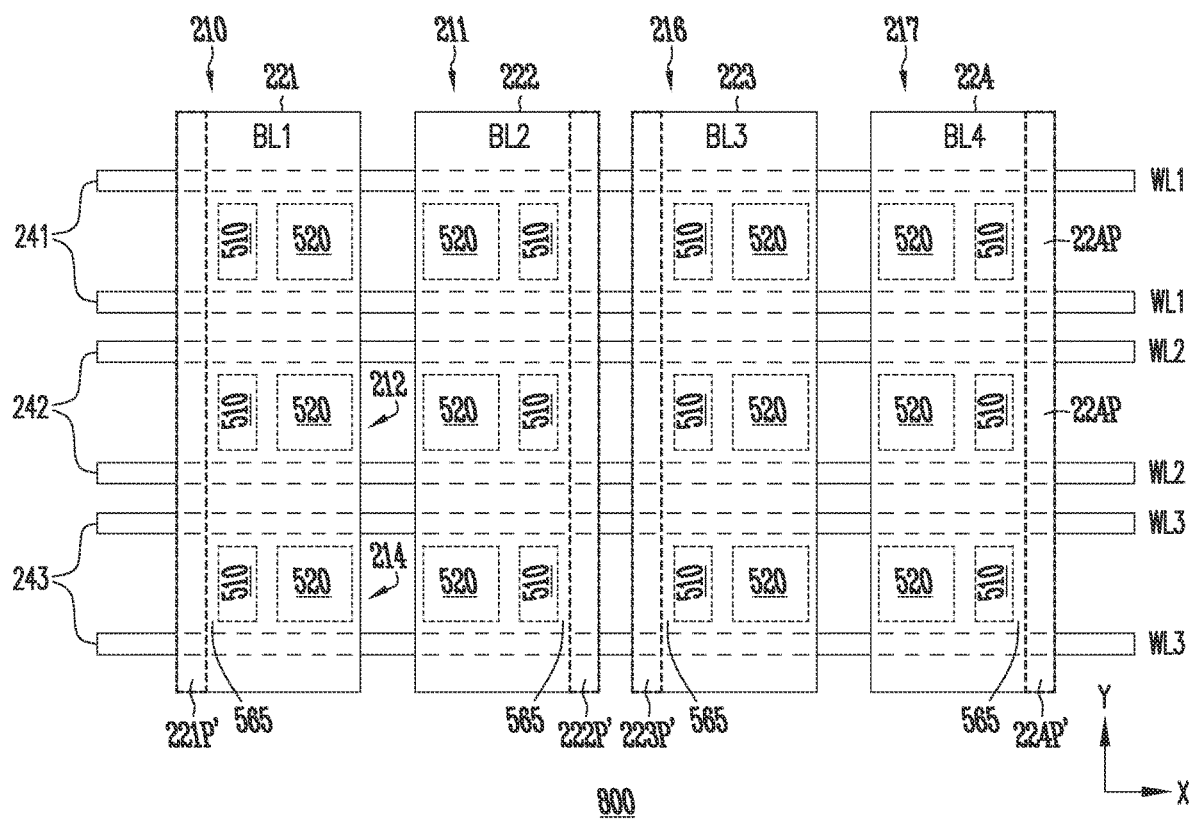

FIG. 8A. FIG. 8B, and FIG. 8C show different views of a structure of memory device 800, according to some embodiments described herein. Memory device 800 includes elements similar to or the same as those of memory device 200 described above. Differences between memory devices 200 and 800 include the continuous structure of the wrapped portions of each of data lines 221, 222, 223, and 224 of memory device 800.

As shown in FIG. 8A, FIG. 8B, and FIG. 8C, data line 221 includes portion 221P'. Like portion 221P (FIG. 7A and FIG. 7C), portion 221P' (FIG. 8A and FIG. 8B) can extend (toward substrate 599) in the Z-direction below a level (e.g., at interface 221i in FIG. 7A) where the top portion of data line 221 contacts material 510 and material 520 of respective memory cells 210, 212, and 214. However, unlike portion 221P (FIG. 7A and FIG. 7C), portion 221P' (FIG. 8A. FIG. 8B, and FIG. 8C) can extend continuously in the Y-direction along the length of data line 221. In FIG. 7A and FIG. 7C, a gap void of the material of data line 221 is between vertical sides (sides parallel to the Z-direction) of two adjacent portions 221P. However, in FIG. 8A, FIG. 8B, and FIG. 8C, portion 221P' is a continuous portion along the entire length of data line 221.

As shown in FIG. 8C, data line 221 can include a top part extending the entire length of data line 221 and another part (e.g., a side part, which includes portion 211P') perpendicular to the top part (e.g., joining the top part and forming 90 degrees with the top part) also extending the entire length of data line 221. Thus, as shown in FIG. 8C, a top part of data line 221 can extend from one memory cell to the next (e.g., from memory cell 210 to memory cell 212 and to memory cell 214), and another part (e.g., which includes portion 211P') perpendicular to the top part and also extending from one memory cell to the next (e.g., from memory cell 210 to memory cell 212 and to memory cell 214).

As described above, portion 221P (FIG. 7C) of data line 221 is adjacent a respective read channel (e.g., adjacent only one material 510) of a respective memory cell (e.g., memory cell 210). In FIG. 8C, since portion 221P' can extend continuously in the Y-direction along the length of data line 221, portion 221P' can be adjacent multiple read channel regions (e.g., adjacent multiple materials 510) of respective memory cells (e.g., memory cells 210, 212, and 214) coupled to data line 221. Similarly, each of data lines 222, 223, and 224 (FIG. 8C) can have a wrapped portion (e.g., portion 222P', 223P', or 224P') that extends continuously in the Y-direction along the length of a respective data line and adjacent multiple respective read channel regions (e.g., adjacent multiple portions of material 510). Memory device 800 can have improvements and benefits similar to those of memory device 700 described above, for example, relatively smaller footprint, reduced power consumption, and improved operation (e.g., static power mitigation or prevention during write operation).

FIG. 9 through FIG. 22D show different views of elements during processes of forming a memory device 900, according to some embodiments described herein. Some or all of the processes used to form memory device 900 can be used to form memory devices 200 and 800 described above with reference to FIG. 2 through FIG. 8.

Figure 9:
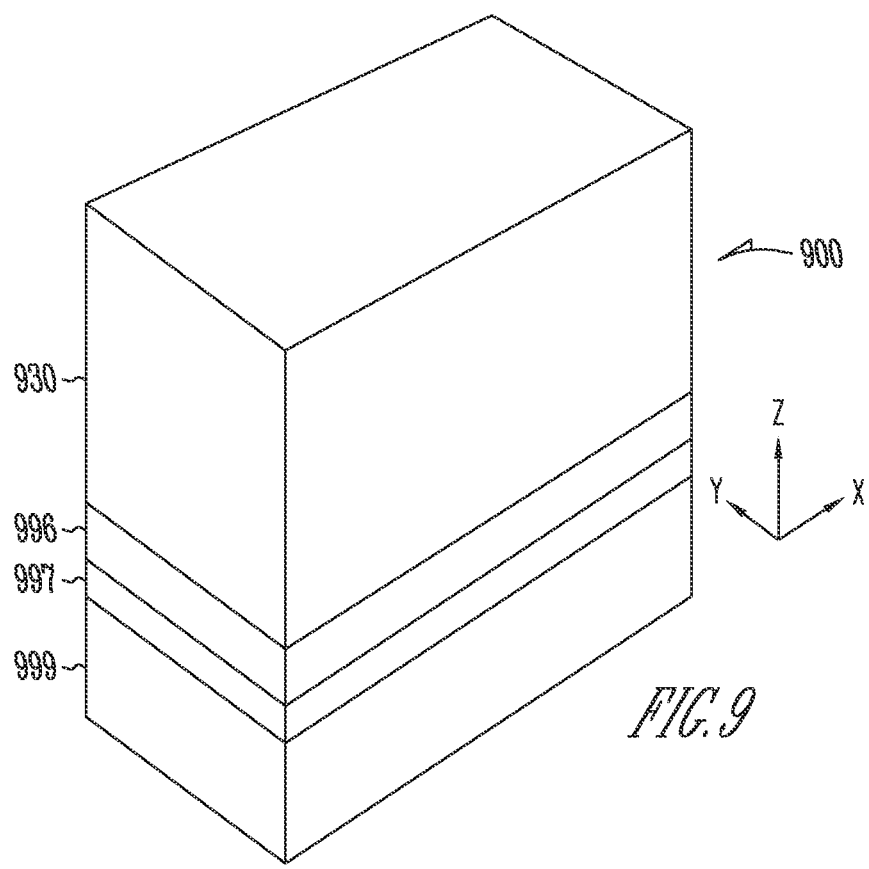
FIG. 9 through FIG. 22D show processes of forming a memory device, according to some embodiments described herein.

FIG. 9 shows memory device 900 after different levels (e.g., layers) of materials are formed in respective levels (e.g., layers) of memory device 900 in the Z-direction over a substrate 999. The different levels of materials include a dielectric material 930, a semiconductor material 996, and a conductive material 997. Dielectric material 930, semiconductor material 996, and conductive material 997 can be formed in a sequential fashion one material after another over substrate 999. For example, the processes used in FIG. 9 can include forming (e.g., depositing) conductive material 997 over substrate 999, forming (e.g., depositing) semiconductor material 996 over conductive material 997, and forming (e.g., depositing) dielectric material 930 over semiconductor material 996.

Substrate 999 can be similar to or the same as substrate 599 of FIG. 5. Conductive material 997 can include a material (or materials) similar to or the same as that of the material for ground connection 297 of memory devices 200 and 800 (FIG. 5 through FIG. 7C). For example, conductive material 997 can include metal, conductively doped polysilicon, or other conductive materials.

Semiconductor material 996 includes a material (or materials) similar to or the same as that of the material for semiconductor material 596 of memory devices 200 and 800 (FIG. 5 through FIG. 7C). For example, semiconductor material 996 can include silicon, polysilicon, or other semiconductor material, and can include a doped region (e.g., p-type doped region). As described below in subsequent processes of forming memory device 900, semiconductor material 996 can be structured to form part of a channel region (e.g., read channel region) for a respective memory cell of memory device 900.

Dielectric materials 930 of FIG. 9 can include a nitride material (e.g., silicon nitride (e.g., $Si_3N_4$)), oxide material (e.g., $SiO_2$), or other dielectric materials. As described below in subsequent processes of forming memory device 900, dielectric material 930 can be processed into dielectric portions to form part of cell isolation structures to electrically isolate one memory cell from another memory cell of memory device 900.

Figure 10A:
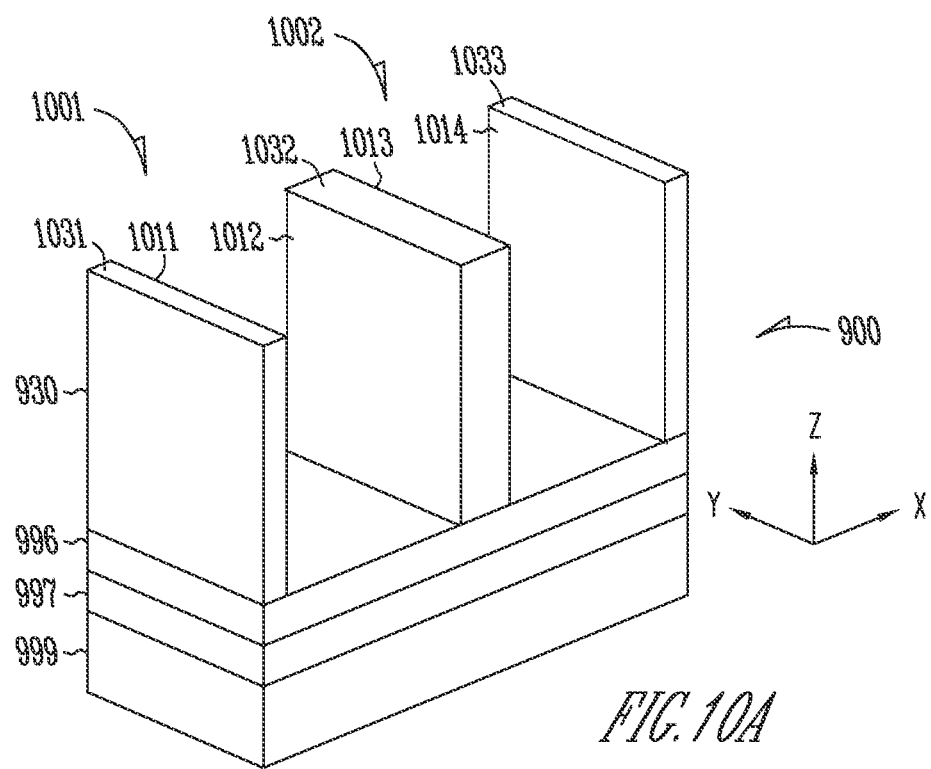

FIG. 10A shows memory device 900 after trenches (e.g., openings) 1001 and 1002 are formed. Forming trenches 1001 and 1002 can include removing (e.g., by patterning) part of dielectric material 930 (FIG. 9) at the locations of trenches 1001 and 1002 and leaving portions (e.g., dielectric portions) 1031, 1032, and 1033 (which are remaining portions of dielectric material 930) as shown in FIG. 10A. Each of trenches 1001 and 1002 can have a length in the Y-direction, a width (shorter than the length) in the X-direction, and a bottom (not labeled) resting on (e.g., bounded by) a respective portion of semiconductor material 996. Each of trenches 1001 and 1002 can include opposing side walls (e.g., vertical side walls) formed by respective portions 1031, 1032, and 1033. For example, trench 1001 can include a side wall 1011 (formed by portion 1031) and a side wall 1012 (formed by portion 1032). Trench 1002 can include a side wall 1013 (formed by portion 1032) and a side wall 1014 (formed by portion 1033).

Figure 10B:
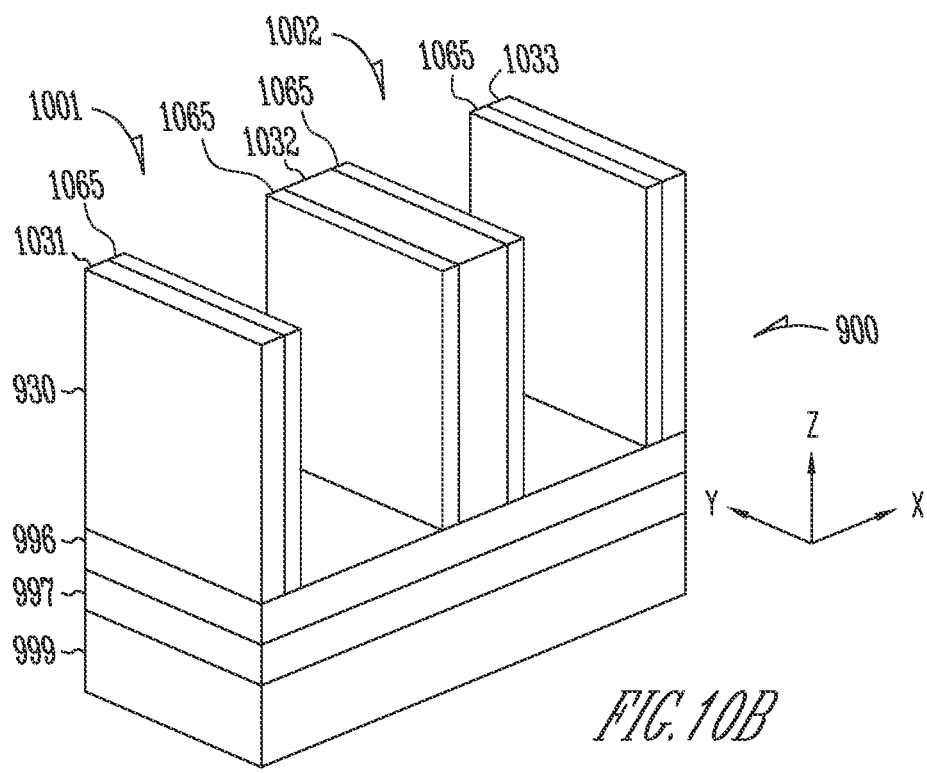

FIG. 10B shows memory device 900 after dielectric materials 1065 are formed (e.g., deposited) on respective side wall 1011, 1012, 1013, and 1014 (labeled in FIG. 10A) of trenches 1001 and 1002, respectively. Dielectric materials 1022 include silicon dioxide, silicon nitride, or other dielectric materials. In subsequent process (FIG. 18B) of forming memory device 900, a portion (e.g., top portion) of dielectric materials 1022 can be removed to form trenches (e.g., trenches 1822 in FIG. 18B) in respective dielectric materials 1022. A conductive material (e.g., metal) can be formed (e.g., filled) in the shallow trenches (formed in dielectric materials 1022) to create wrapped portions (e.g., portions 221P, 222P, 223P, and 225P in FIG. 7A) of respective data lines of memory device 900.

Figure 11:
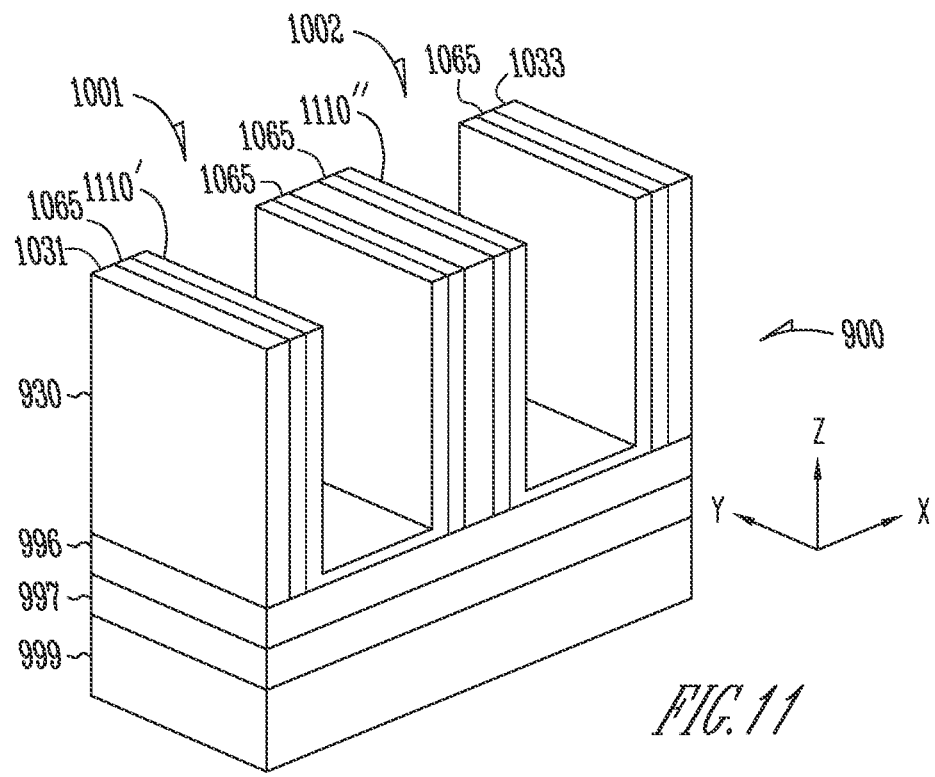

FIG. 11 shows memory device 900 after a material 1110' and a material 1110" are formed (e.g., deposited) in trenches 1001 and 1002, respectively. As shown in FIG. 11, material 1110' can be formed on respective side walls (not labeled) of dielectric material 1065 and the bottom (e.g., on a portion of semiconductor material 996) of trench 1001. Material 1110" can be formed on respective side walls (not labeled) of dielectric material 1065 and the bottom (e.g., on another portion of semiconductor material 996) of trench of trench 1002.

Materials 1110' and 1110" can be the same material. An example of material 1110' a material 1110" includes a semiconductor material. Materials 1110' and 1110" can have the same properties as the materials that form portions 510 (e.g., read channel regions) of transistors T1 of respective memory cells of memory device 200 of FIG. 5 through FIG. 7C. As described below in subsequent processes (e.g., FIG. 19A) of forming memory device 900, materials 1110' and 1110" can be structured to form channel regions (e.g., read channel regions) of transistors (e.g., transistors T1) of respective memory cells of memory device 900. Thus, each of materials 1110' and 1110" can conduct a current (e.g., conduct holes) during an operation (e.g., a read operation) of memory device 900.

The process of forming materials 1110' and 1110" can include a doping process. Such a doping process can include introducing dopants into materials 1110' and 1110" to allow a transistor (e.g., transistor T1) of a respective memory cell of memory device 900 to include a specific structure. For example, the doping process used in FIG. 9 can include introducing dopants (e.g., using a laser anneal process) with different dopant concentrations for different parts of materials 1110' and 1110", such that the transistor that includes material 1110' (or material 1110") can have a PFET structure. In such a PFET structure, part of material 1110' (or material 1110") can form a channel region (e.g., read channel region of P-type conductivity) to conduct currents (e.g., holes) during an operation (e.g., read operation) of memory device 900.

Figure 12:
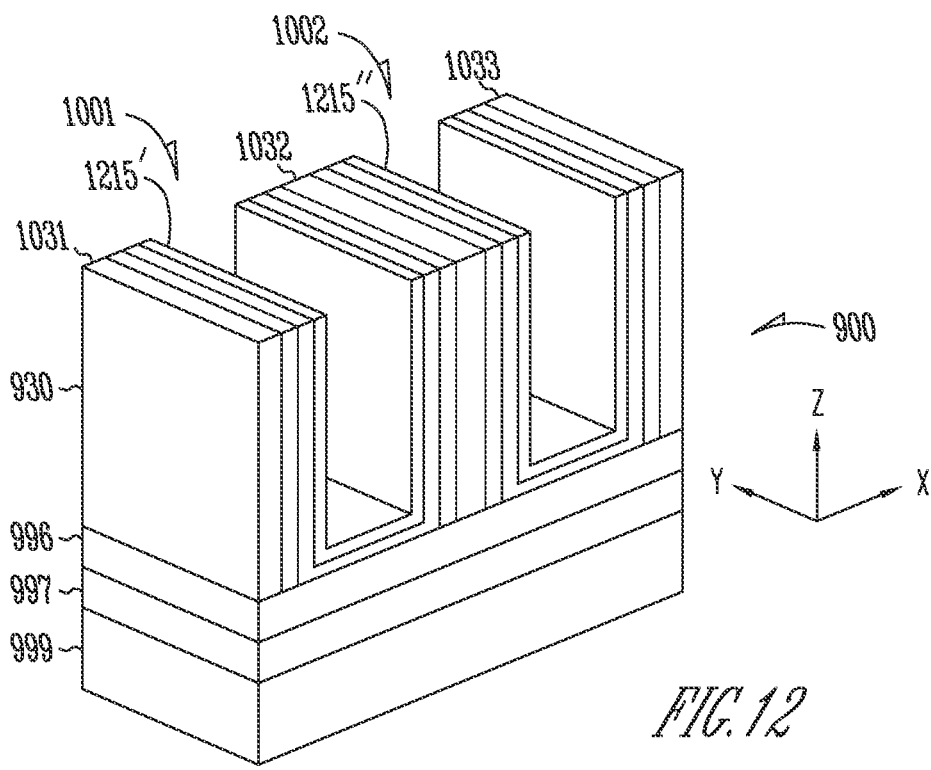

FIG. 12 shows memory device 900 after dielectric materials (e.g., oxide materials) 1215' and 1215" are formed (e.g., deposited) on materials 1110' and 1110", respectively. Dielectric materials 1215' and 1215" can be deposited, such that dielectric materials 1215' and 1215" can be conformal to materials 1110' and 1110", respectively. Dielectric materials 1215' and 1215" can have the same properties as the materials that form dielectric materials (gate oxide regions) 515A, 515B, 525A, and 525B of memory device 200 of FIG. 5 through FIG. 7C.

Figure 13:
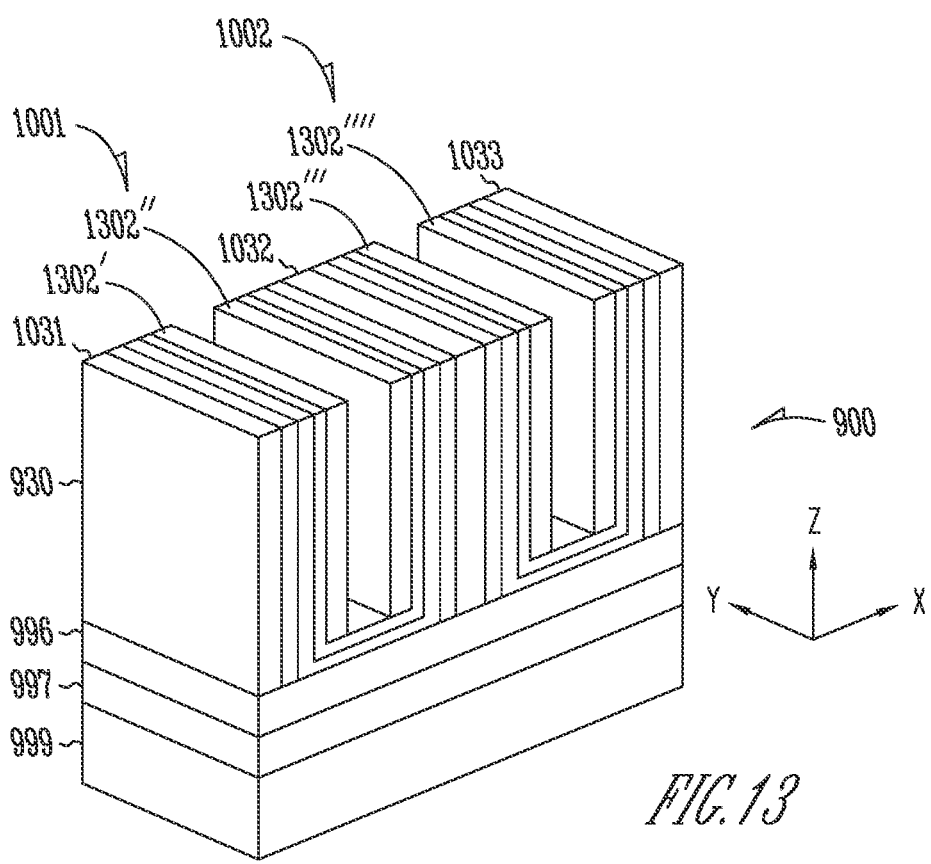

FIG. 13 shows memory device 900 after materials (e.g., charge storage materials) 1302', 1302", 1302''', and 1302'''' are formed on respective side walls of dielectric materials 1215' and 1215". Materials 1302', 1302", 1302''', and 1302'''' are electrically separated from each other. As described below in subsequent processes (FIG. 19A) of forming memory device 900, each of materials 1302', 1302", 1302''', and 1302'''' can be structured to form a charge storage structure of a respective memory cell of memory device 900. Materials 1302', 1302", 1302''', and 1302'''' can include material (e.g., polysilicon) similar or the same as the material of charge storage structure 202 of the memory cells (e.g., memory cell 210 or 211) of memory device 200 (FIG. 5 through FIG. 7C).

Figure 14:
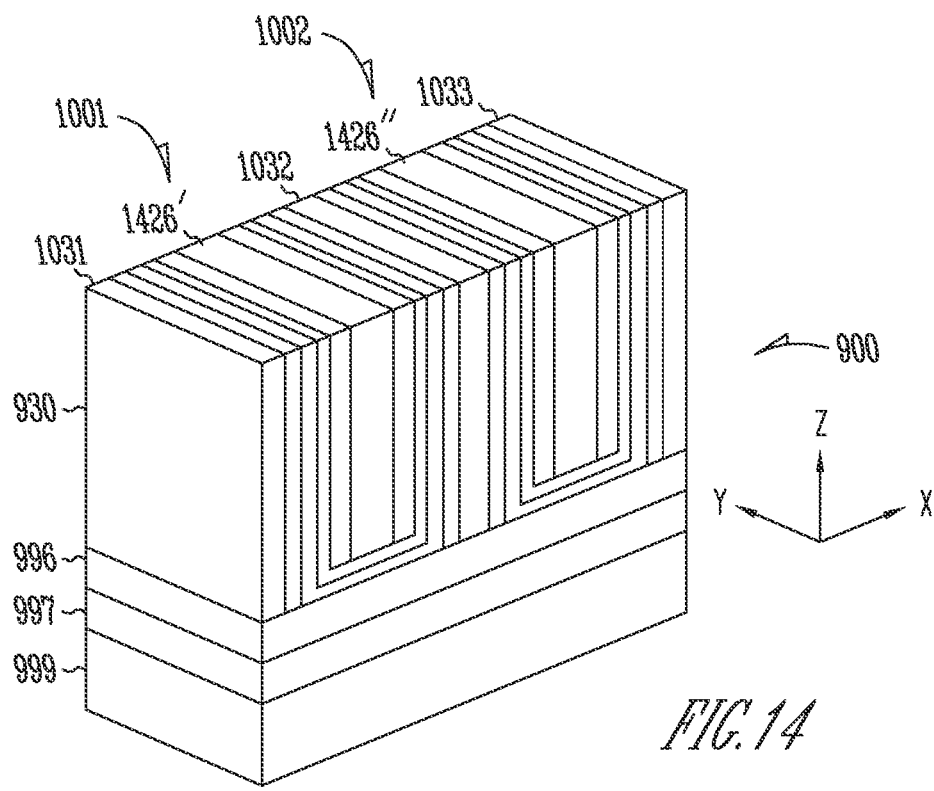

FIG. 14 shows memory device 900 after dielectric materials 1426' and 1426" are formed (e.g., filled) in opened spaces in trenches 1001 and 1002, respectively. Dielectric materials 1426' and 1426" can include an oxide material. As described below in subsequent processes of forming memory device 900, dielectric materials 1426' and 1426" can form part of an isolation structure that can electrically isolate parts of (e.g., charge storage structures) two adjacent (in the X-direction) memory cells of memory device 900.

Figure 15:
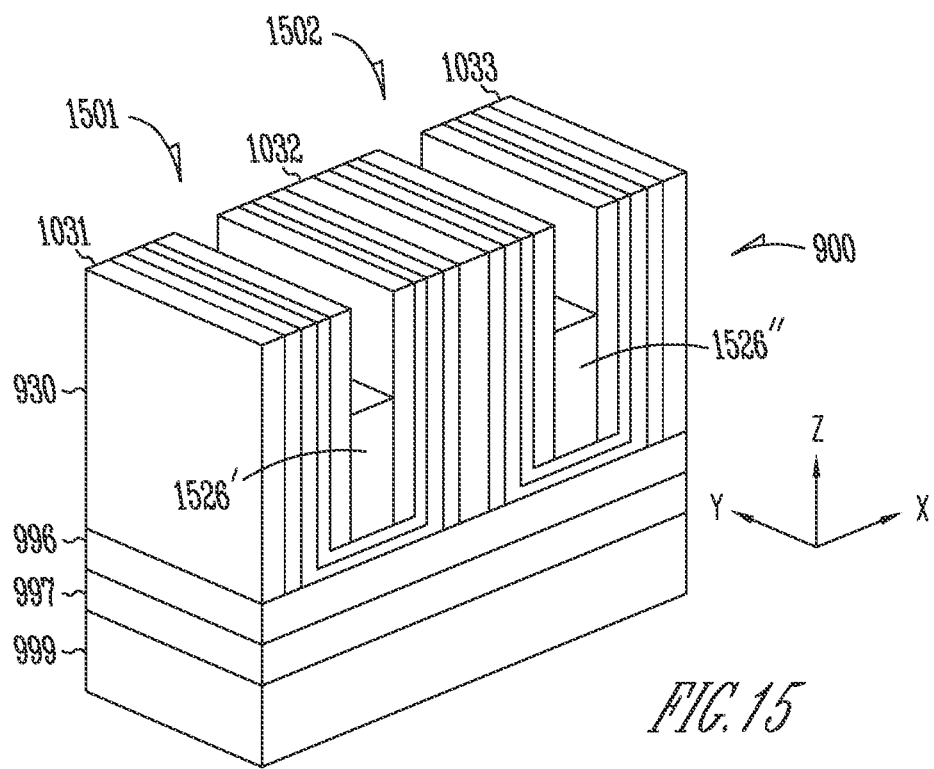

FIG. 15 shows memory device 900 after dielectric materials 1526' and 1526" are formed at locations 1501 and 1502, respectively. Forming dielectric materials 1526' and 1526" can include removing (e.g., by using an etch process) part (e.g., top part) of each of dielectric materials 1426' and 1426" (FIG. 14), such that the remaining parts of dielectric materials 1426' and 1426" are dielectric materials 1526' and 1526" (FIG. 15), respectively.

Figure 16:
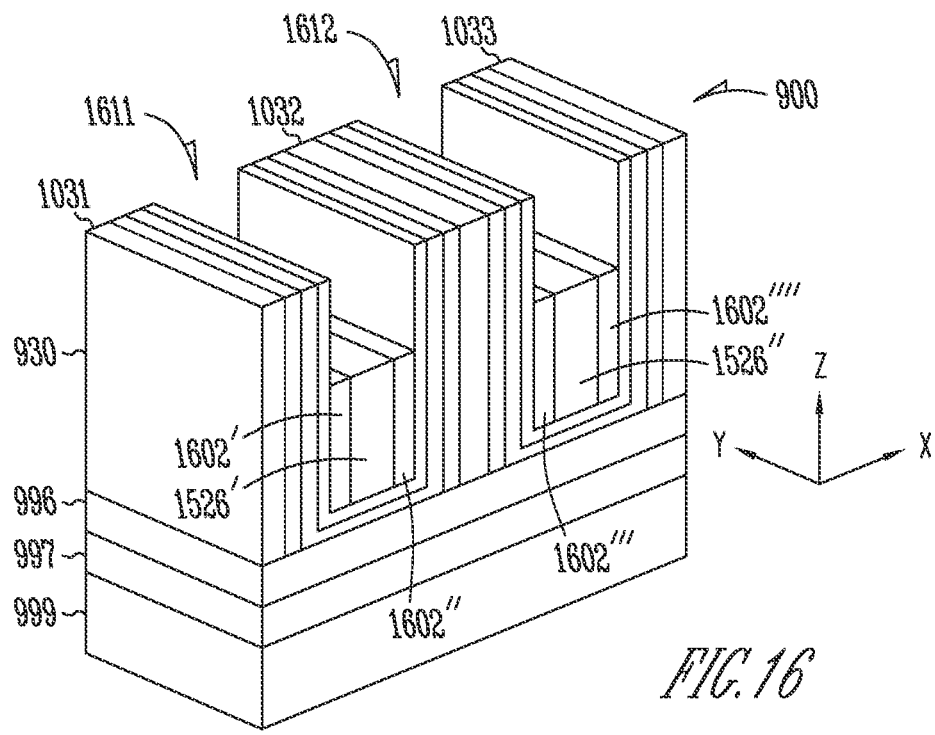

FIG. 16 shows memory device 900 after materials 1602', 1602", 1602''', and 1602'''' are formed at locations 1611 and 1612, respectively. Forming materials 1602', 1602", 1602''', and 1602'''' can include removing (e.g., by using an etch process) part (e.g., top part) of each of materials (e.g., charge storage materials) 1302', 1302", 1302''', and 1302'''' (FIG. 13), such that the remaining parts of materials 1302', 1302", 1302''', and 1302'''' are materials 1602', 1602", 1602''', and 1602'''' (FIG. 16), respectively.

In FIG. 15 and FIG. 16, top part of dielectric materials 1426' and 1426" (labeled in FIG. 14) and top part of materials 1302', 1302", 1302'''. 1302'''' (labeled in FIG. 13) were removed in separate processes (e.g., multiple steps one after another) as described with reference to FIG. 15 and FIG. 16. However, from FIG. 14, a single process (e.g., single step) can be used to remove part of dielectric materials 1426' and 1426" and part of materials 1302', 1302", 1302''', 1302'''' (FIG. 13).

Figure 17:
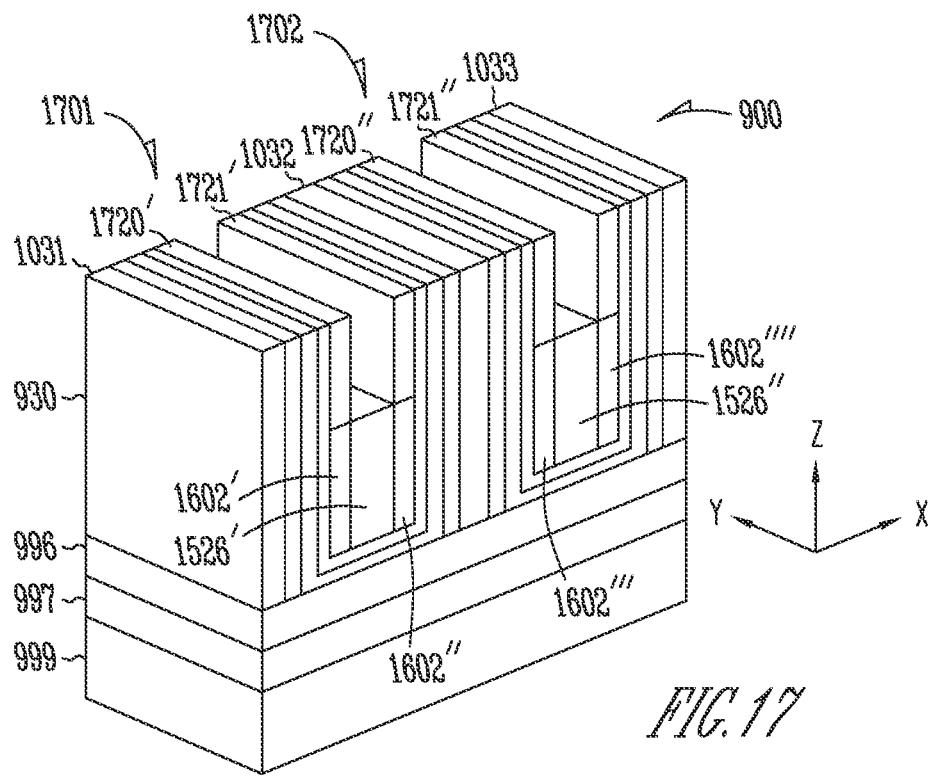

FIG. 17 shows memory device 900 after materials 1720', 1721', 1720", and 1721" are formed. Forming materials 1720', 1721', 1720", and 1721" can include depositing an initial material (or materials) on dielectric materials 1526' and 1526" and materials 1602', 1602", 1602''', and 1602''''. Then, the process used in FIG. 17 can include removing (e.g., by using an etch process) a portion of the initial material at locations 1701 and 1702. Materials 1720', 1721', 1720", and 1721" are the remaining portions of the initial material. As shown in FIG. 17, materials 1720', 1721', 1720", and 1721" are electrically separated from each other. However, materials 1720', 1721', 1720", and 1721" are electrically coupled to (e.g., directly coupled to) materials 1602', 1602", 1602''', and 1602'''', respectively.

Materials 1720', 1721', 1720", and 1721" can include materials similar or the same as material (e.g., write channel region) 520 (FIG. 5) of transistor T2 of memory device 200 of FIG. 5A and FIG. 6A. As described below in subsequent processes (FIG. 19A) of forming memory device 900, each of materials 1720', 1721', 1720", and 1721" can form a channel region (e.g., write channel region) of a transistor (e.g., transistor T2) of a respective memory cell of memory device 900. Thus, each of materials 1720', 1721', 1720", and 1721" can conduct a current (e.g., conduct electrons) during an operation (e.g., a write operation) of memory device 900.

Figure 18A:
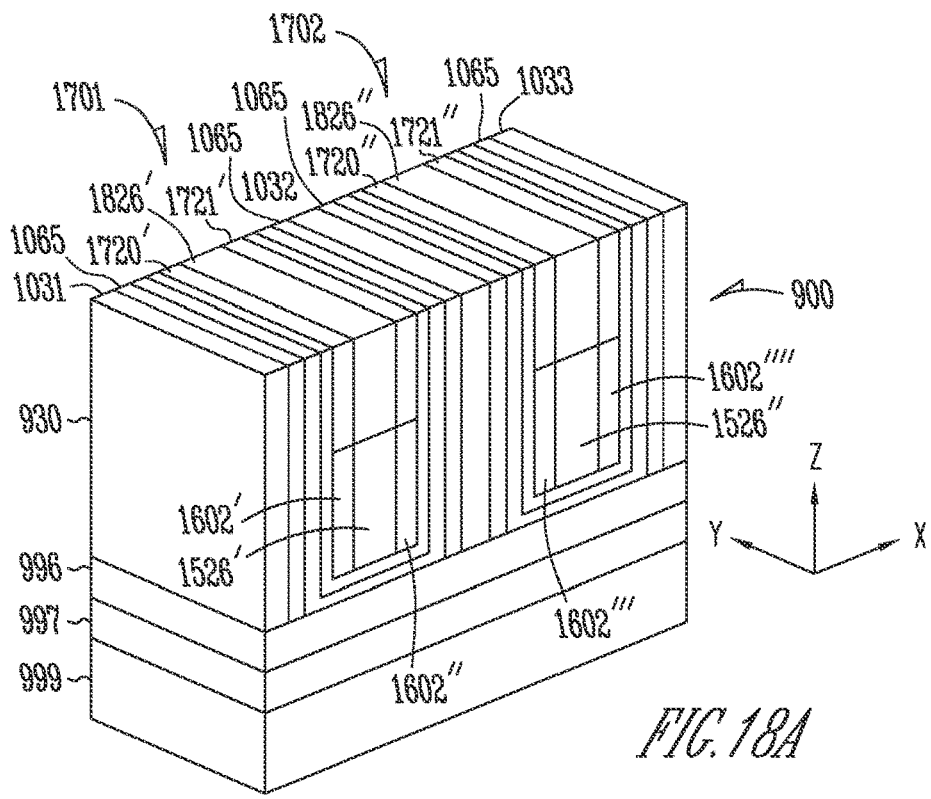

FIG. 18A shows memory device 900 after dielectric materials 1826' and 1826" are formed at (e.g., filled in) locations 1701 and 1702. Dielectric materials 1826' and 1826" can be the same as dielectric materials 1426' and 1426". As described below in subsequent processes of forming memory device 900, dielectric materials 1826' and 1826" can form part of an isolation structure that can electrically isolate parts of (e.g., write channel regions) two adjacent (in the X-direction) memory cells of memory device 900. In subsequent processes, shallow trenches will be formed in dielectric materials 1065 (which were formed in FIG. 10A).

Figure 18B:
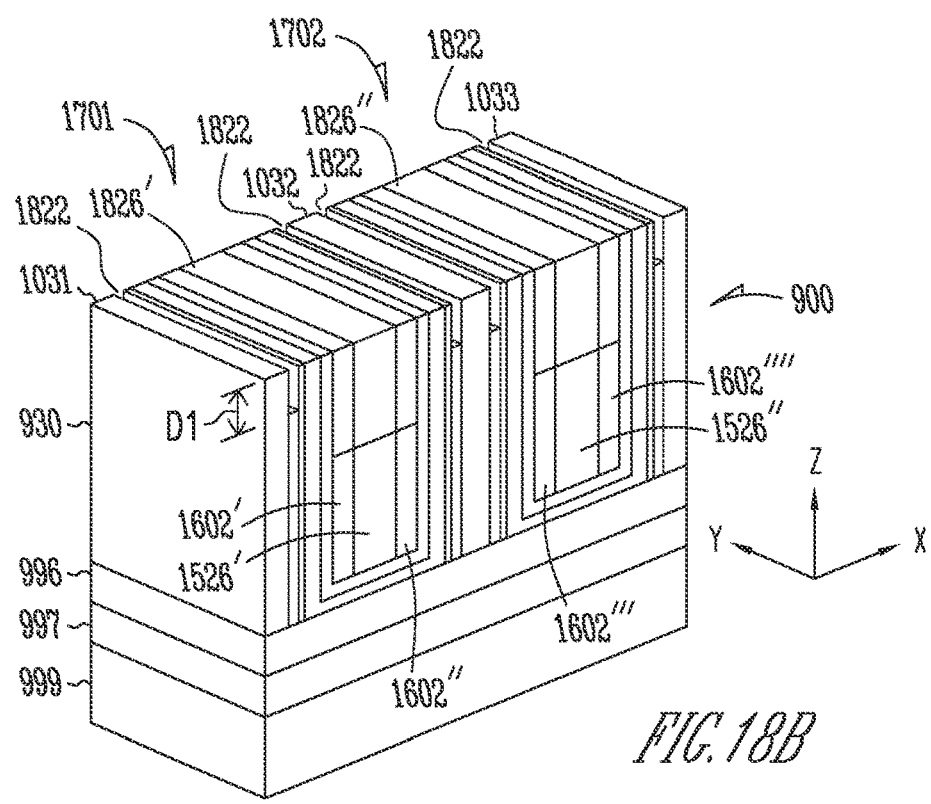

FIG. 18B shows memory device 900 after trenches (e.g., shallow trenches) 1822 are formed in dielectric materials 1065. Each trench 1822 can include a depth D1. As described above and shown in FIG. 7A, length L1 of portion 221P can be less than the length of material 510 (e.g., read channel region) and less than the length of material 520 (e.g., write channel region) of memory cell 210. Length L1 (FIG. 7A) of portion 221P is based on depth D1 (FIG. 18B). For example, length L1 is the same as depth D1. Thus, in FIG. 18B, depth D1 can be less than the length of material 510 (FIG. 7A) of memory cell 210 and less than the length of material 520 (FIG. 7A) of memory cell 210. In subsequent processes (FIG. 22C), a conductive material (e.g., metal) can be formed (e.g., filled) in trenches 1822 to create wrapped portions (e.g., portions 221P, 222P, 223P, and 225P in FIG. 7A) of respective data lines of memory device 900.

Figure 19A:
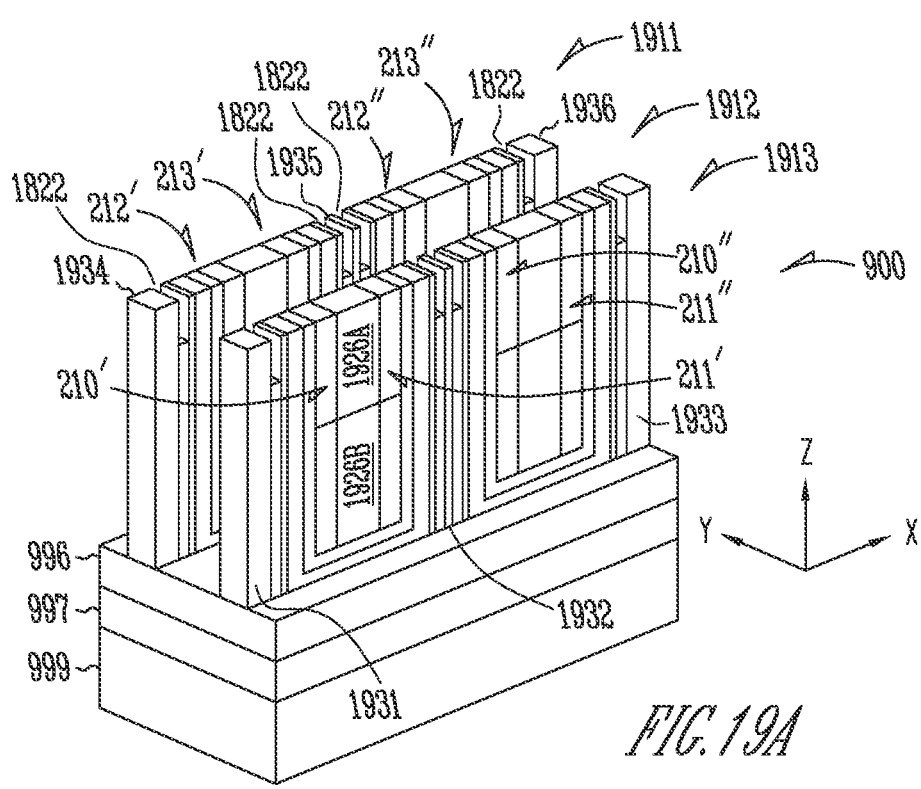

FIG. 19A shows memory device 900 after trenches 1911, 1912, and 1913 are formed (in the X-direction) across the materials of memory device 900. Each of trenches 1911, 1912, and 1913 can have a length in the X-direction, a width (shorter than the length) in the Y-direction, and a bottom (not labeled) resting on (e.g., bounded by) a respective portion of semiconductor material 996. In the structure of FIG. 19A, memory device 900 can include a common conductive structure (e.g., a common conductive plate) formed on a level of memory device 900 that is under the memory cells of memory device 900. In an alternative structure (not shown in FIG. 19A) of memory device 900, each of trenches 1911, 1912, and 1913 can have a bottom (not labeled) resting on (e.g., bounded by) a respective portion of conductive material 997 (instead of semiconductor material 996).

In the FIG. 19A, forming trenches 1911, 1912, and 1913 can include removing (e.g., by cutting (e.g., etching) in the Z-direction) part of the materials of memory device 900 at locations of trenches 1911, 1912, and 1913 and leaving portions (e.g., slices) of the structure of memory device 900 shown in FIG. 19A. After portions (at the locations of trenches 1911, 1912, and 1913) of memory device 900 are removed (e.g., cut), the remaining portions can form parts of memory cells of memory device 900. For example, memory device 900, as shown in FIG. 19A, can include memory cells 210', 211', 210", and 211" in one row along the X-direction, and memory cells 212', 213', 212", and 213" in another row along the X-direction. Memory cells 210', 211', 210", and 211" can correspond to memory cells 210, 211, 216, and 217, respectively, of memory device 200 of FIG. 7A.

For simplicity, only some of similar elements (e.g., portions) of memory device 900 in FIG. 19A are labeled. For example, memory device 900 can include dielectric portions (e.g., cell isolation structures) 1931, 1932, 1933, 1934, 1935, and 1936, and dielectric materials 1926A and 1926B. Dielectric portions 1931 and 1932 can correspond to two respective dielectric portions 555 of memory device 200 of FIG. 7A.

Figure 19B:
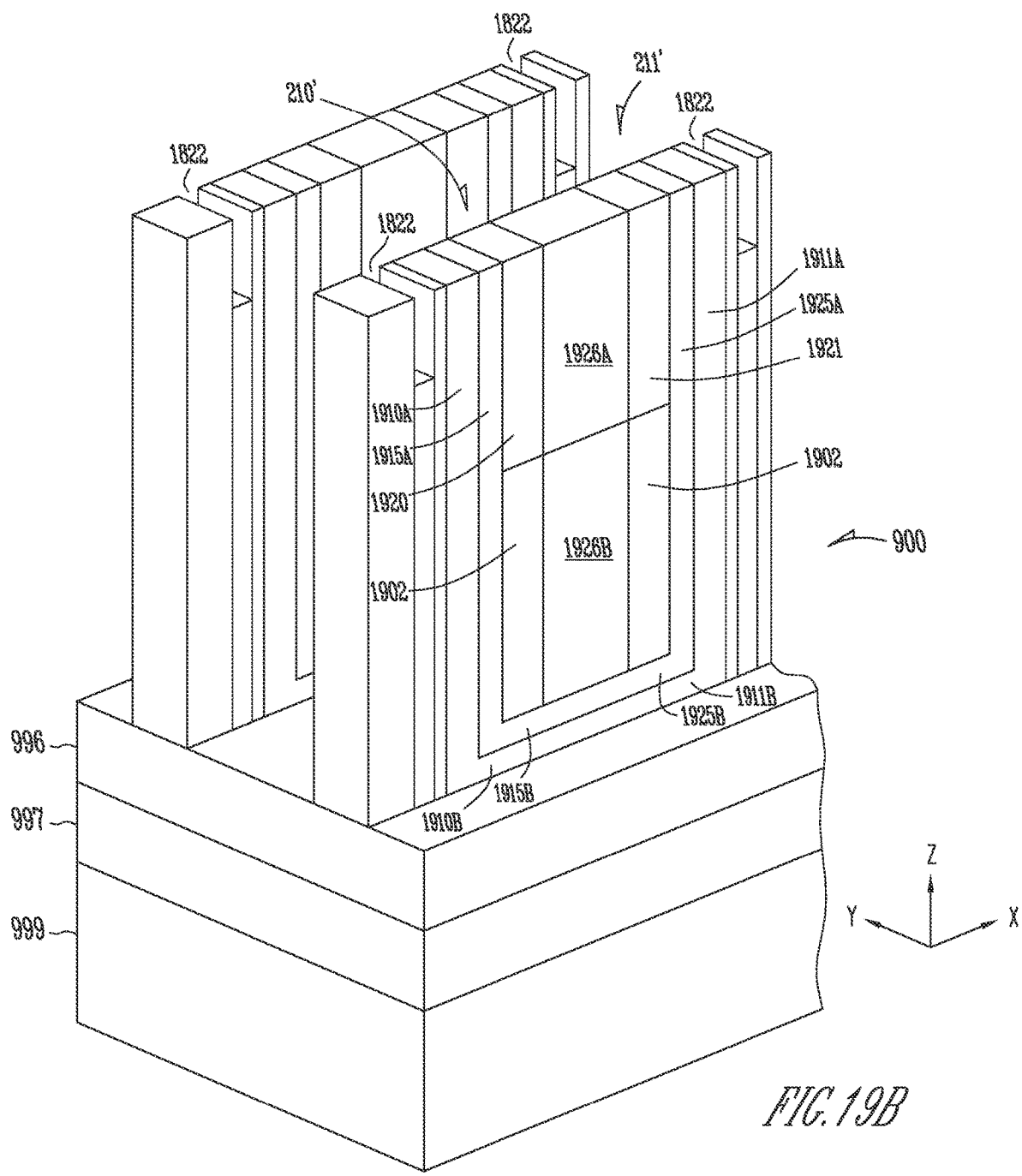

FIG. 19B shows an enlarged portion of memory device 900 of FIG. 19A. As shown in FIG. 19B, memory cell 210' can include portions 1910A and 1910B (which can be part of the read channel region of memory cell 210'), dielectric materials 1915A and 1915B, material (e.g., write channel region) 1920, and charge storage structure 1902 (directly below material 1920). Memory cell 211' can include portions 1911A and 1911B (which can be part of the read channel region of memory cell 211'), dielectric materials 1925A and 1925B, material (e.g., write channel region) 1921, and charge storage structure 1902 (directly below material 1921).

As described above with reference to FIG. 9 through FIG. 19B, part of each of the memory cells of memory device 900 can be formed from a self-aligned process, which can include formation of trenches 1001 and 1002 (FIG. 10A) in the Y-direction and trenches 1911, 1912, and 1913 (FIG. 19A) in the X-direction. The self-aligned process can improve (e.g., increase) memory cell density, improve process (e.g., provide a higher process margin), or both. The self-aligned process, as described above, includes a reduced number of critical masks that can allow forming of multiple decks of memory cells in the same memory device. An example of a multi-deck memory device is described below with reference to FIG. 28A through FIG. 28C.

Figure 20:
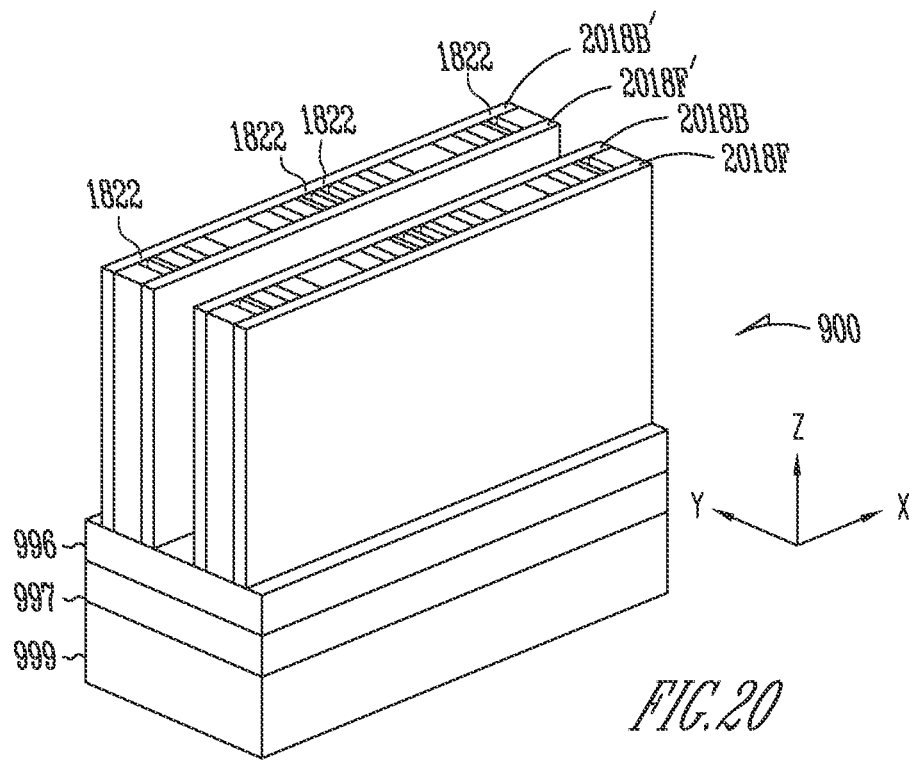

FIG. 20 shows memory device 900 after dielectric materials 2018F, 2018B, 2018F', and 2018B' (e.g., gate oxide regions) are formed. The material (or materials) for dielectric materials 2018F, 2018B, 2018F', and 2018B' can be the same as (or alternatively, different from) the material (or materials) of dielectric materials 515A, 515B, 525A, and 525B (FIG. 7A). Example materials for dielectric materials 2018F, 2018B, 2018F', and 2018B' can include silicon dioxide, hafnium oxide (e.g., $HfO_2$), aluminum oxide (e.g., $Al_2O_3$), or other dielectric materials (e.g., other high-k dielectric materials).

Figure 21:
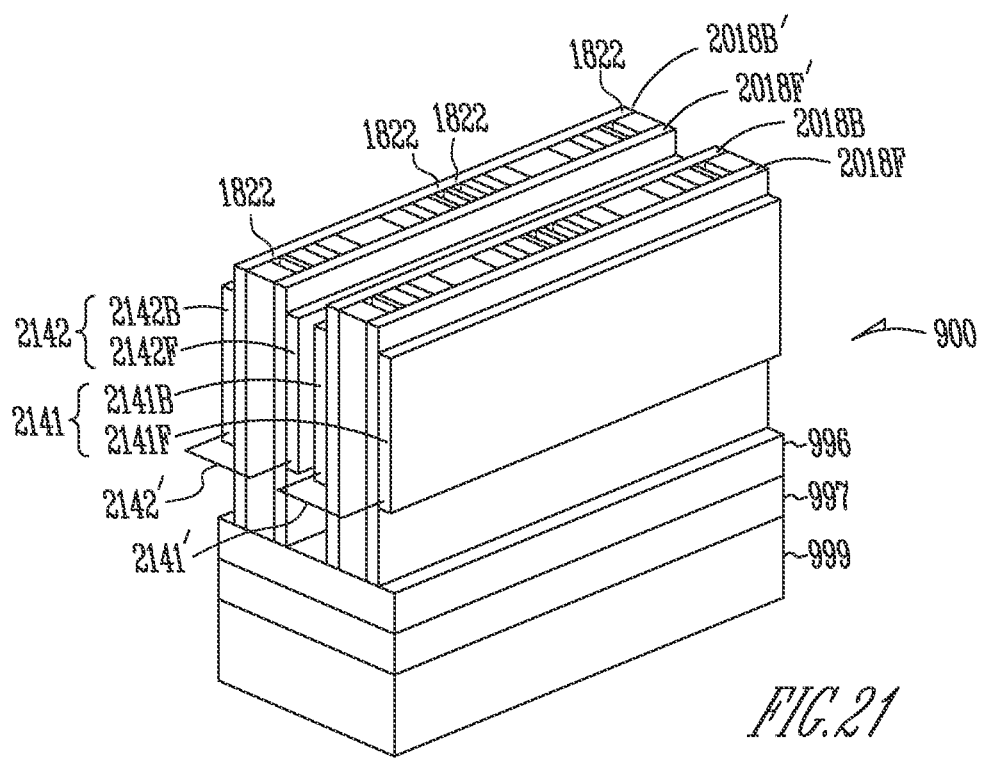

FIG. 21 shows memory device 900 after conductive lines (e.g., conductive regions) 2141F, 2141B, 2142F, and 2142B are formed. Each of conductive lines 2141F, 2141B, 2142F, and 2142B can include metal, conductively doped polysilicon, or other conductive materials. As shown in FIG. 21, conductive lines 2141F, 2141B, 2142F, and 2142B are electrically separated from other elements of memory device 900 by dielectric materials 2018F, 2018B, 2018F', and 2018B', respectively.

Conductive lines 2141F and 2141B can form part of an access line (e.g., word line) 2141 to control the read and write transistors (e.g., transistor T1 and T2, respectively) of respective memory cells 210', 211', 210", and 211" (labeled in FIG. 19A) of memory device 900. For example, conductive lines 2141F and 2141B can form front and back conductive portions, respectively, of access line 2141. Conductive lines 2142F and 2142B can form part of an access line (e.g., word line) 2142 to access memory cells 212', 213', 212", and 213" (labeled in FIG. 19A) of memory device 900. For example, conductive lines 2142F and 2142B can form front and back conductive portions, respectively, of access line 2142. Access lines 2141 and 2412 can correspond to access lines 241 and 242, respectively, of memory device 200 of FIG. 2.

The processes of forming memory device 900 in FIG. 21 can include forming a conductive connection 2141' (which can include a conductive material (e.g., metal)) to electrically couple conductive lines 2141F and 2141B to each other. This allows conductive lines 2141F and 2141B to form part of a single access line (e.g., access line 2141). Similarly, the processes of forming memory device 900 can include forming a conductive connection 2142' to electrically couple conductive lines 2142F and 2142B to each other. This allows conductive lines 2142F and 2142B to form part of a single access line (e.g., access line 2142).

Figure 22A:
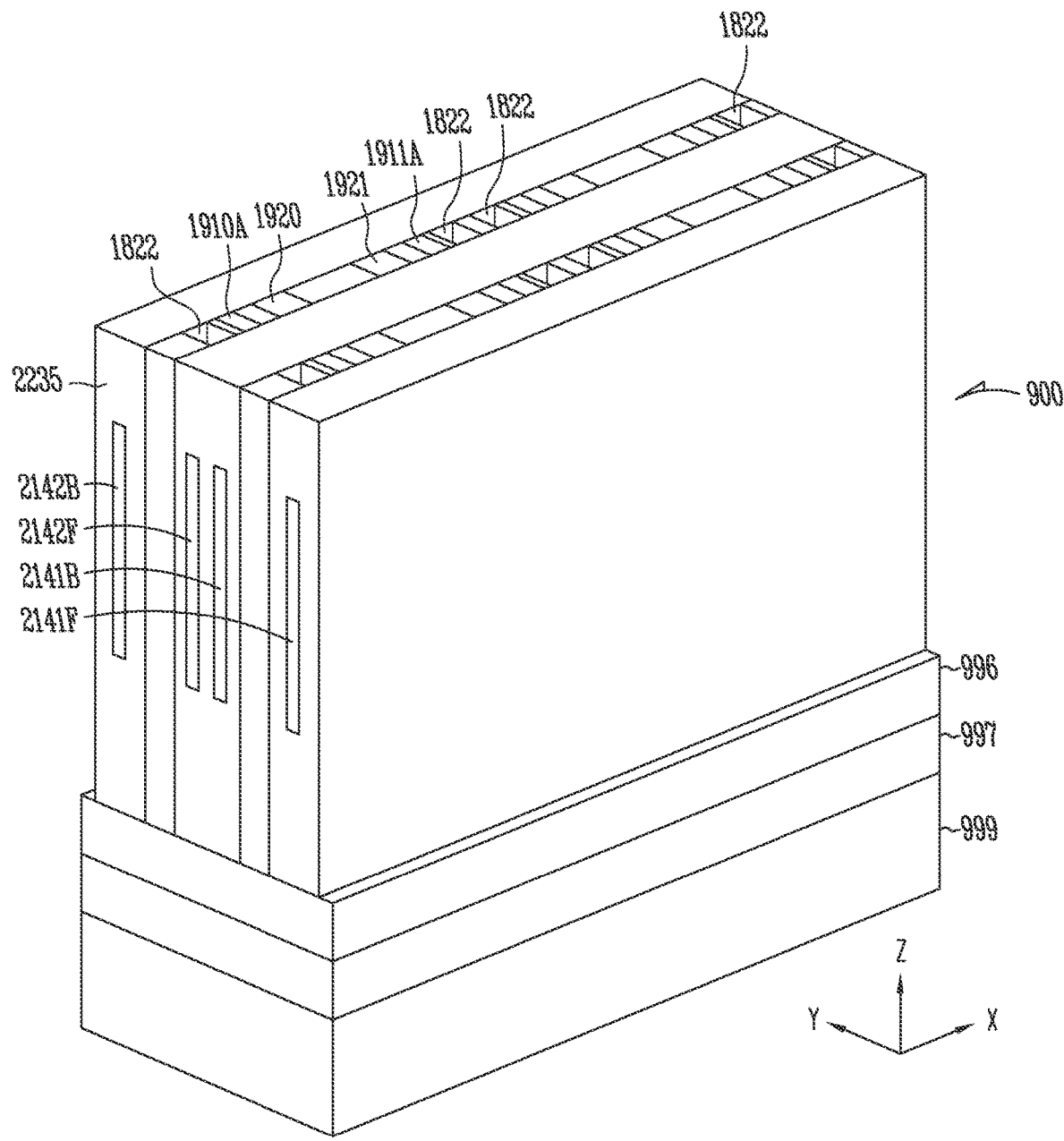

FIG. 22A shows memory device 900 after a dielectric material 2235 is formed. Dielectric material 2235 can fill the structure of memory device 900 as shown in FIG. 22A. As shown in FIG. 22A, trenches 1822 (formed in FIG. 18A) are not filled with dielectric material 2235. Portion 1910A and material 1920 (e.g., read channel region and write channel region, respectively) of memory cell 210' are exposed. Portion 1911A and material 1921 (e.g., read channel region and write channel region, respectively) of memory cell 211' are exposed. Read and write channel regions (not labeled) of other memory cells are also exposed.

Figure 22B:
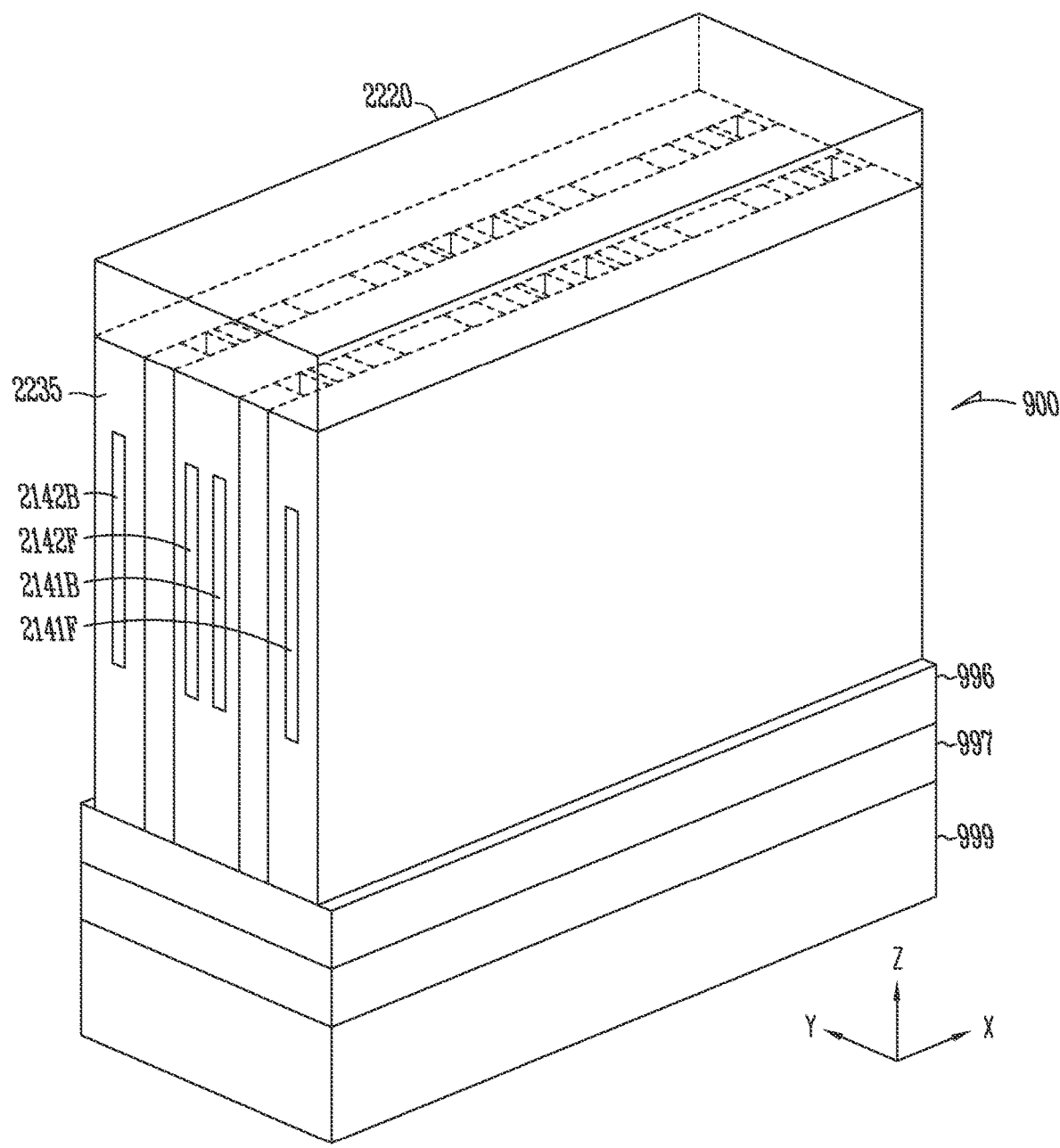

FIG. 22B shows memory device 900 after a conductive material 2220 is formed. Conductive material 2220 can be formed (e.g., deposited) in trenches 1822 (FIG. 22A) and over exposed portion 1910A, material 1920, portion 1911A, and material 1921 (labeled in FIG. 22A) and other elements of memory device 900.

Figure 22C:
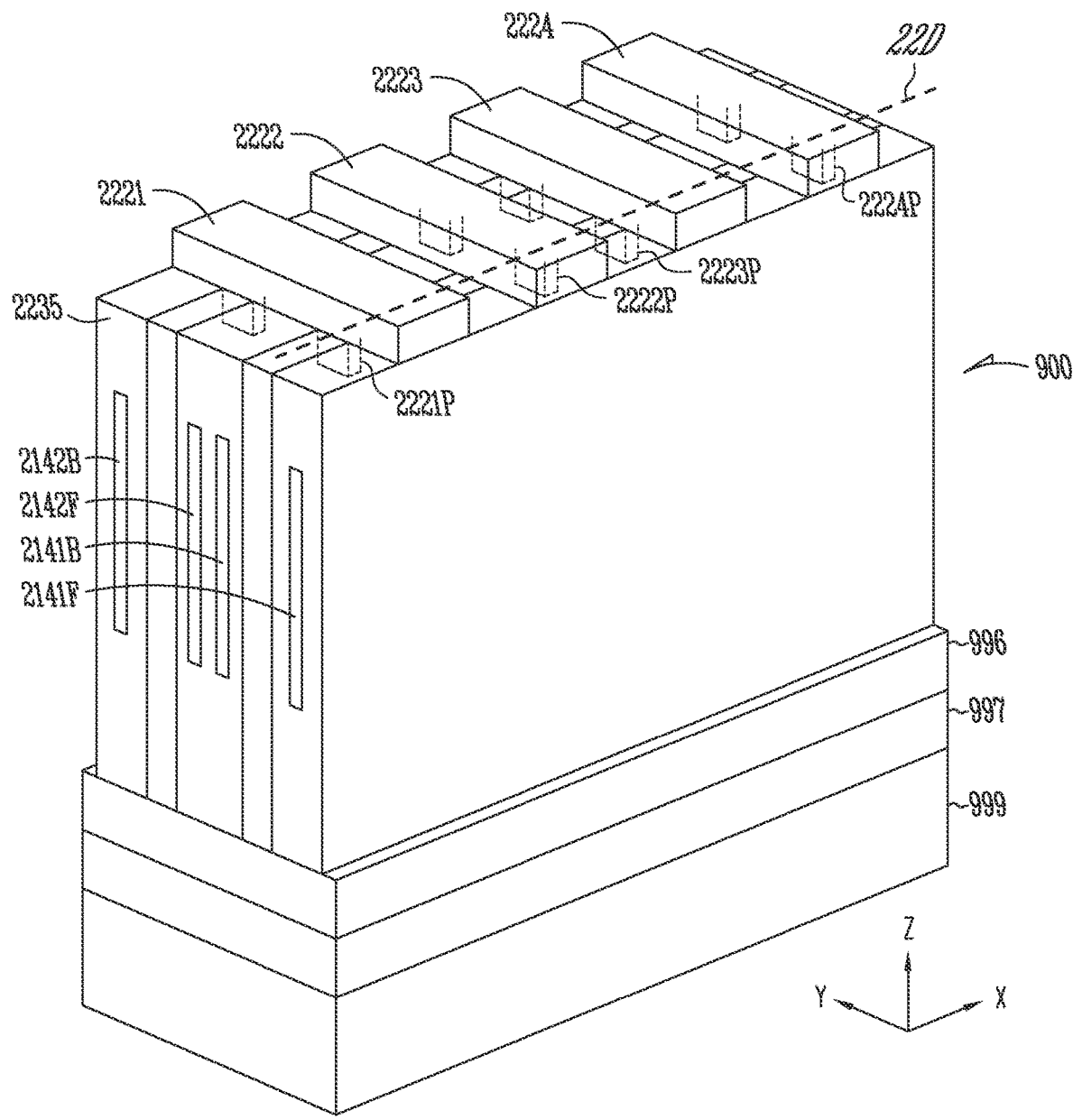
Figure 22D:
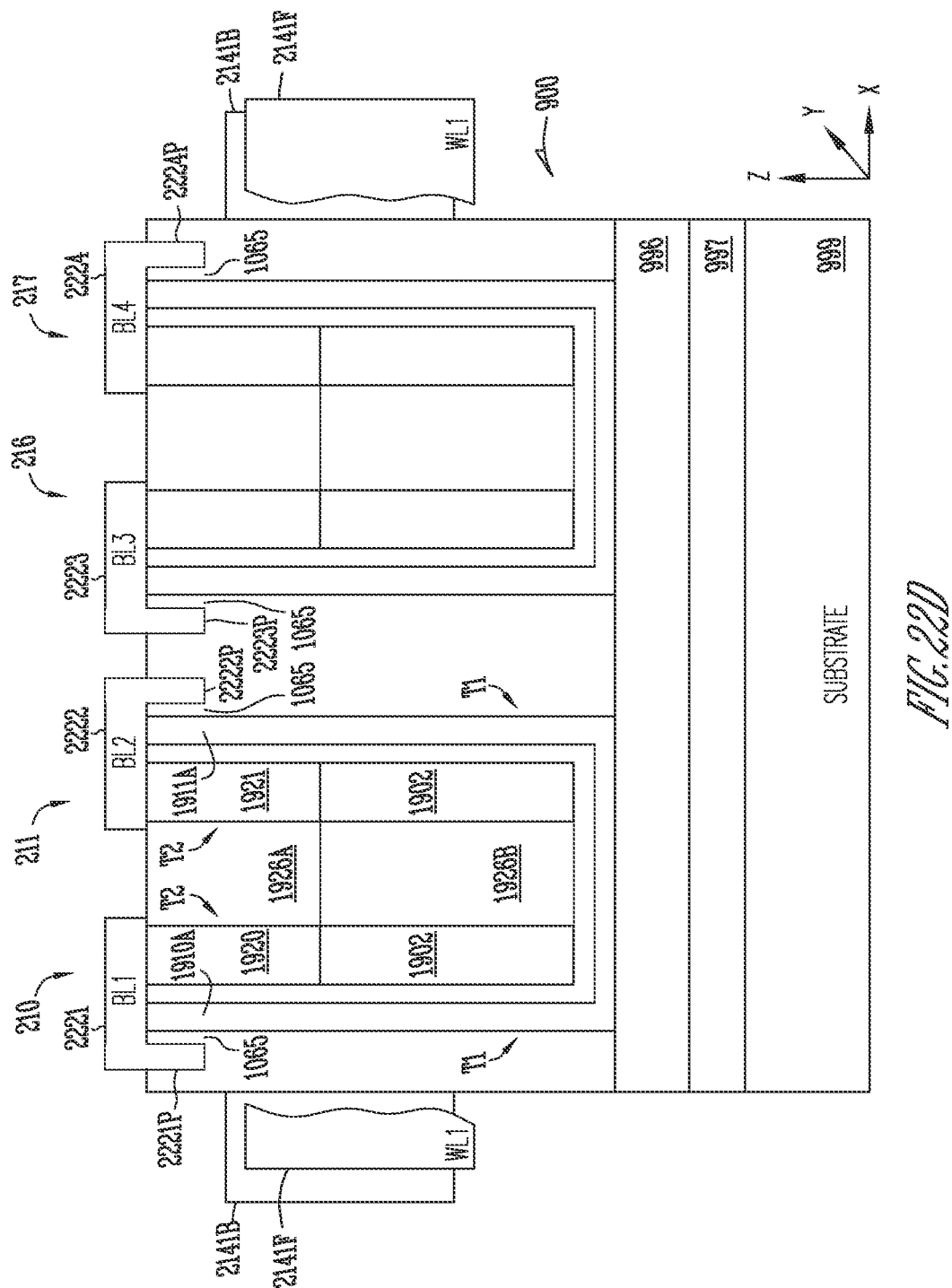

FIG. 22C shows memory device 900 after data lines 2221, 2222, 2223, and 2224 and respective portions (e.g., wrapped portions) 2221P, 2222P, 2223P, and 2224P are formed. FIG. 22D shows a side view of memory device 900 taken along line 22D of FIG. 22C. Data lines 2221, 2222, 2223, and 2224 and respective portions 2221P, 2222P, 2223P, and 2224P can be concurrently formed. For example, a process (e.g., patterning process) can be performed to remove a portion of conductive material 2200 (FIG. 22B). In FIG. 22C, data lines 2221, 2222, 2223, and 2224 and respective portions 2221P, 2222P, 2223P, and 2224P are the remaining portion of conductive material 2200.

As shown in FIG. 22C, data lines 2221, 2222, 2223, and 2224 are electrically separated from each other. Each of data lines 2221, 2222, 2223, and 2224 can have a length in the Y-direction, a width in the X-direction, and a thickness in the Z-direction. Data lines data lines 2221, 2222, 2223, and 2224 can correspond to data lines data lines 221, 222, 223, and 224, respectively, of memory device 200 of FIG. 7A. Portions 2221P, 2222P, 2223P, and 2224P can correspond to portions (e.g., wrapped portions) 221P, 222P, 223P, and 224P, respectively, of memory device 200 of FIG. 7A.

As shown in FIG. 22D, portions 2221P, 2222P, 2223P, and 2224P of respective data lines 2221, 2222, 2223, and 2224 can be adjacent respective read channel regions (e.g., portions 1910A and 1911A) of respective memory cells. Portions 2221P, 2222P, 2223P, and 2224P of also separated from respective read channel regions by respective dielectric materials 1065. Dielectric materials 1065 shown in FIG. 22D are the remaining portions of dielectric materials 1065 formed in FIG. 10A and etched in FIG. 18A.

The description of forming memory device 900 with reference to FIG. 9 through FIG. 22D can include other processes to form a complete memory device. Such processes are omitted from the above description so as to not obscure the subject matter described herein.

The process of forming memory device 900 as described above can have a relatively reduced number of masks (e.g., reduced number of critical masks) in comparison with some conventional processes. For example, by forming trenches 1001 and 1002 in the process associated with FIG. 10A, and forming trenches 1911, 1912, and 1913 in the process of FIG. 19A, the number of critical masks used to form the memory cells of memory device 900 can be reduced. The reduced number of masks can simplify the process, reduce cost, or both, of forming memory device 900. Further, forming data lines 2221, 2222, 2223, and 2224 that have respective portions 2221P, 2222P, 2223P, and 2224P allows memory device 900 to have improvements and benefits (e.g., reduce leakage current and other improvements) similar to those of memory device 200 (FIG. 2 through FIG. 7C).

FIG. 23 through FIG. 28C show processes of forming a memory device 2300 including data lines having continuous wrapped portions, according to some embodiments described herein. The processes of forming memory device 2300 can be a variation of the processes of forming memory device 900 (FIG. 9 through FIG. 22D). Thus, similar elements (which have the same labels) between the processes of forming memory devices 900 and 2300 are not repeated.

Figure 23:
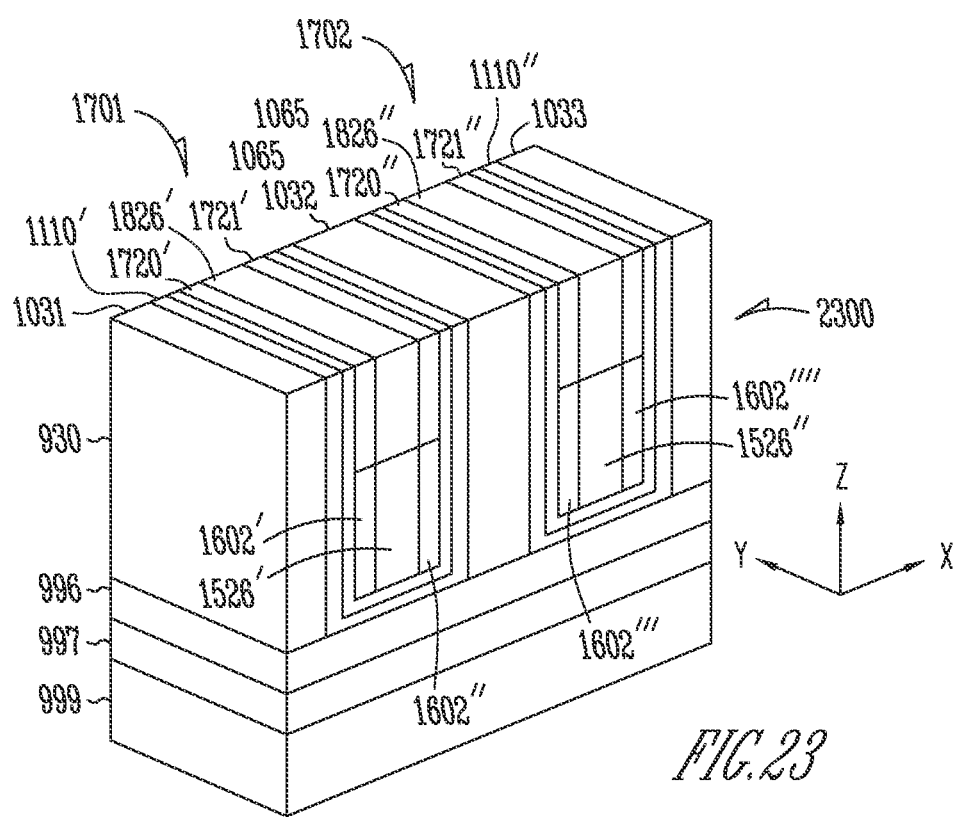
FIG. 23 through FIG. 27B show processes of forming another memory device, according to some embodiments described herein.

FIG. 23 shows the elements of memory device 2300 that can be formed using similar or identical processes used to form the elements of memory device 900 of FIG. 9 through FIG. 18A. However, unlike memory device 900 of FIG. 19A, dielectric materials 1065 (formed in FIG. 10A) can be omitted (not formed) in the processes of forming memory device 2300. Thus, in memory device 2300, material 1110' and material 1110" can be formed (e.g., deposited) on side walls of trenches 1001 and 1002 (FIG. 10A) and on semiconductor material 996 in trenches 1001 and 1002 (FIG. 10A).

Figure 24:
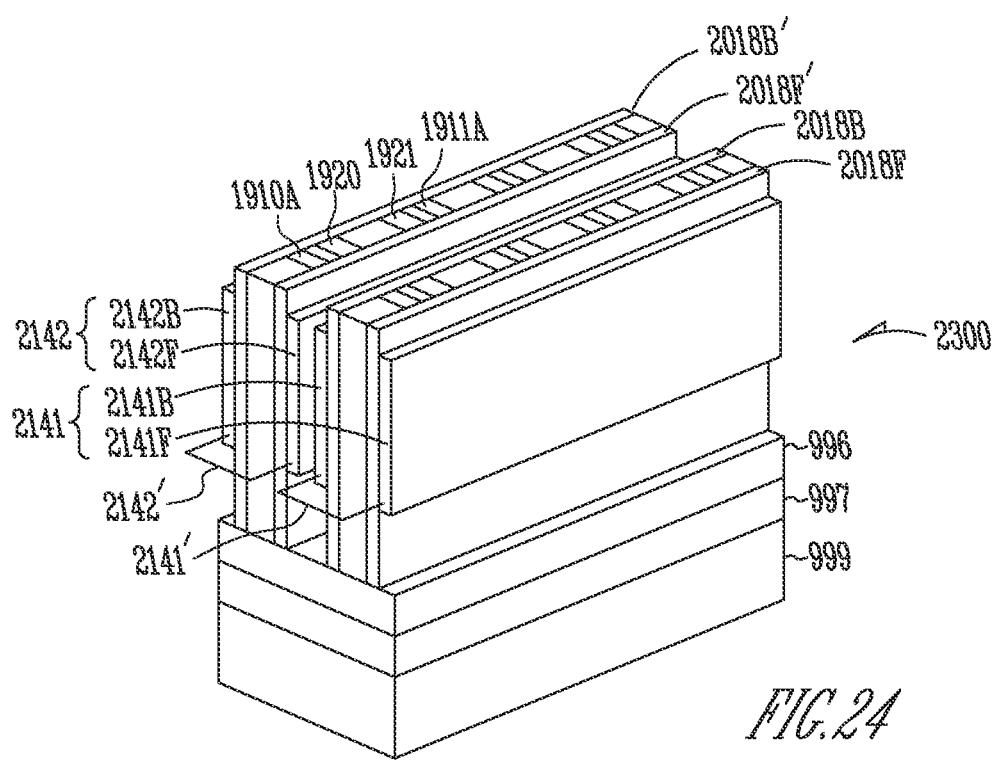

FIG. 24 shows memory device 2300 after dielectric materials (e.g., gate oxide regions) 2018F, 2018B, 2018F', and 2018B', conductive lines (e.g., conductive regions) 2141F, 2141B, 2142F, and 2142B, and conductive connections 2141' and 2142' are formed.

Figure 25:
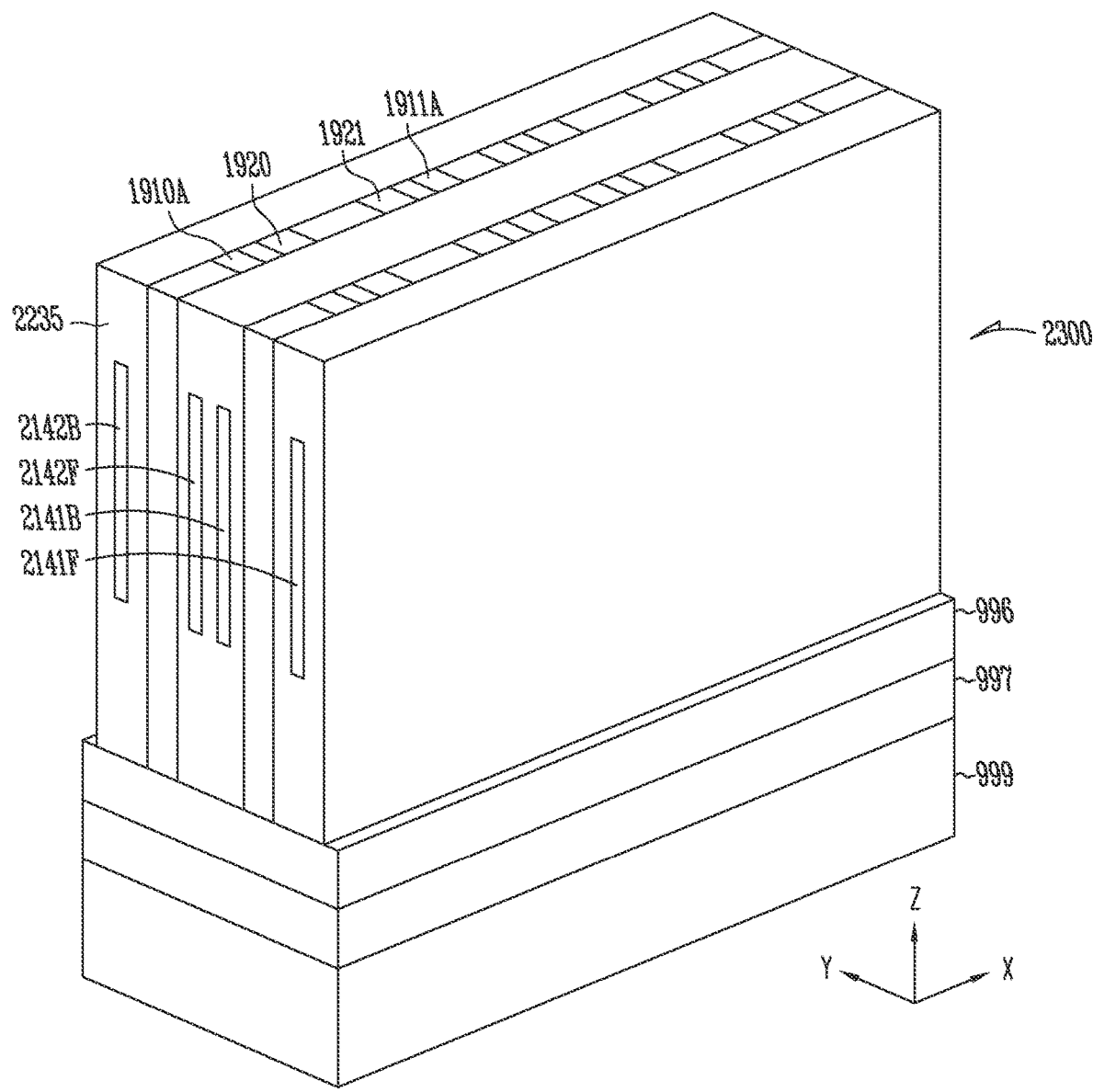

FIG. 25 shows memory device 2300 after dielectric material 2235 is formed. Dielectric material 2235 can fill the structure of memory device 230 as shown in FIG. 25.

Figure 26:
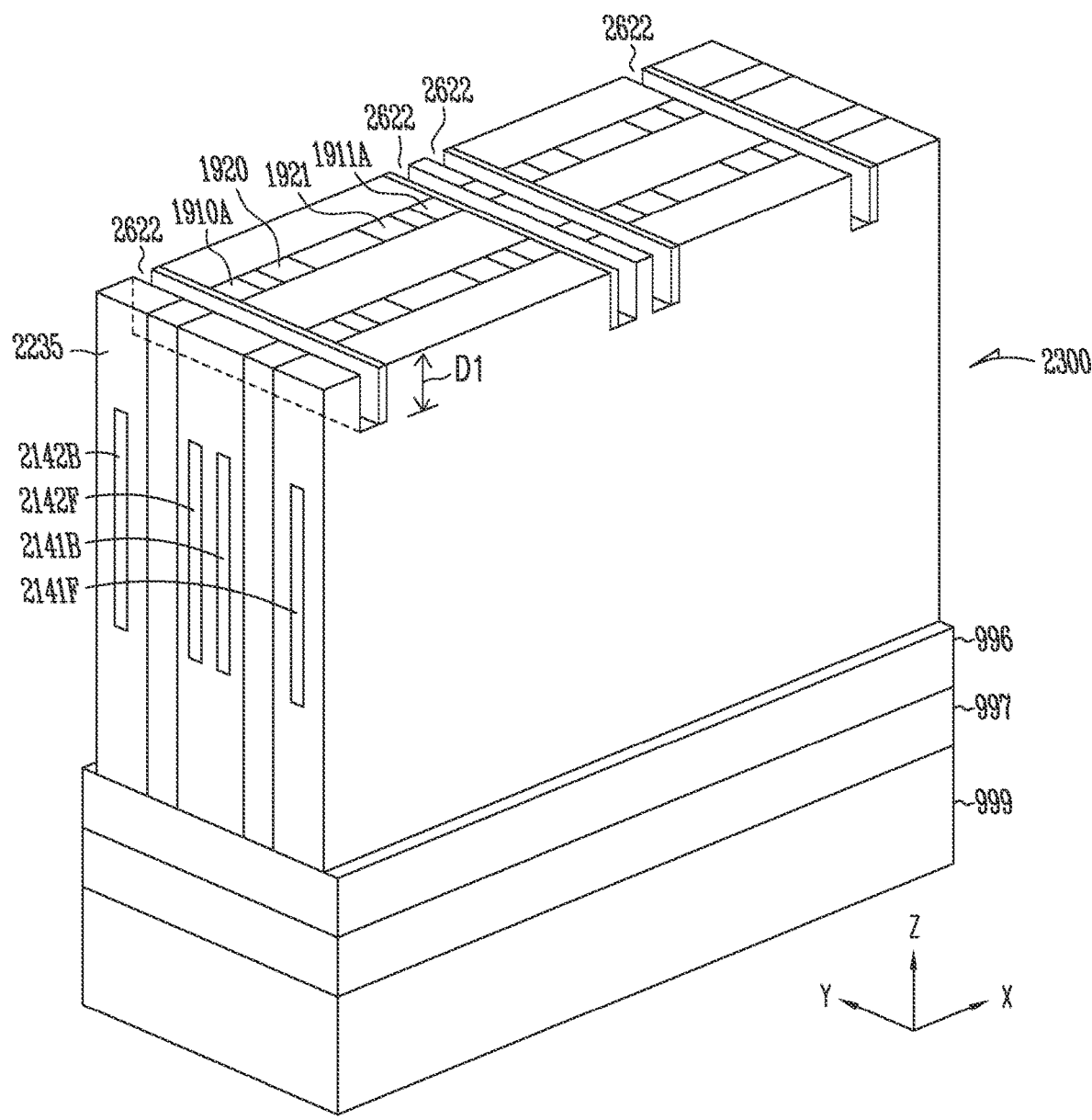

FIG. 26 shows memory device 2300 after trenches 2622 are formed. Forming trenches 2622 can include removing (e.g., etching) materials at the locations of trenches 2622. Each trench 2622 can have depth (e.g., D1) similar to or the same as the depth (e.g., D1) of trench 1822 (FIG. 18A).

Figure 27A:
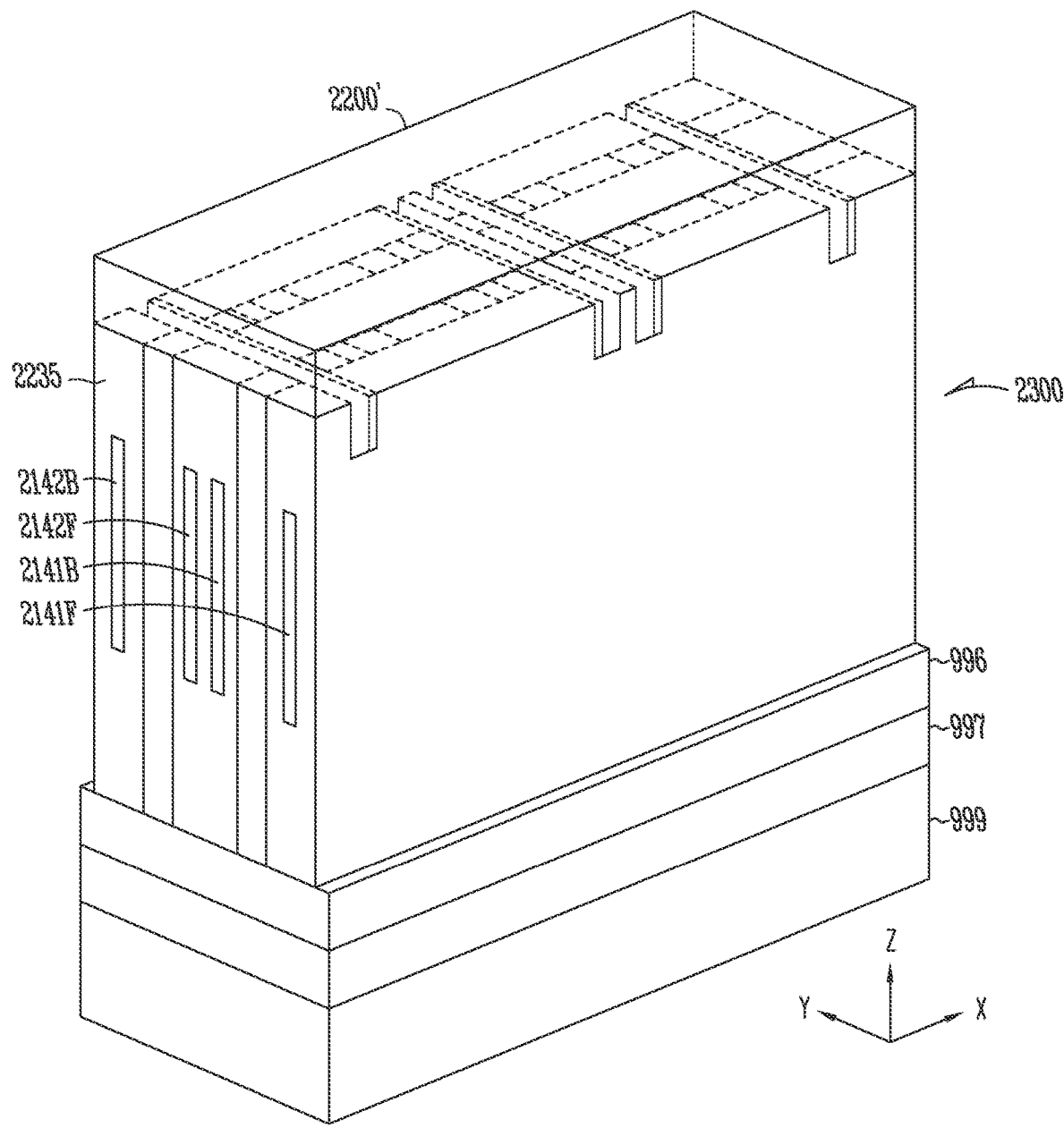

FIG. 27A shows memory device 2300 after a conductive material 2200' is formed. Conductive material 2200' can be formed (e.g., deposited) in trenches 2622 (FIG. 22A) and over other exposed portions 1910A, material 1920, 1911A, and material 1921 (shown in FIG. 26).

Figure 27B:
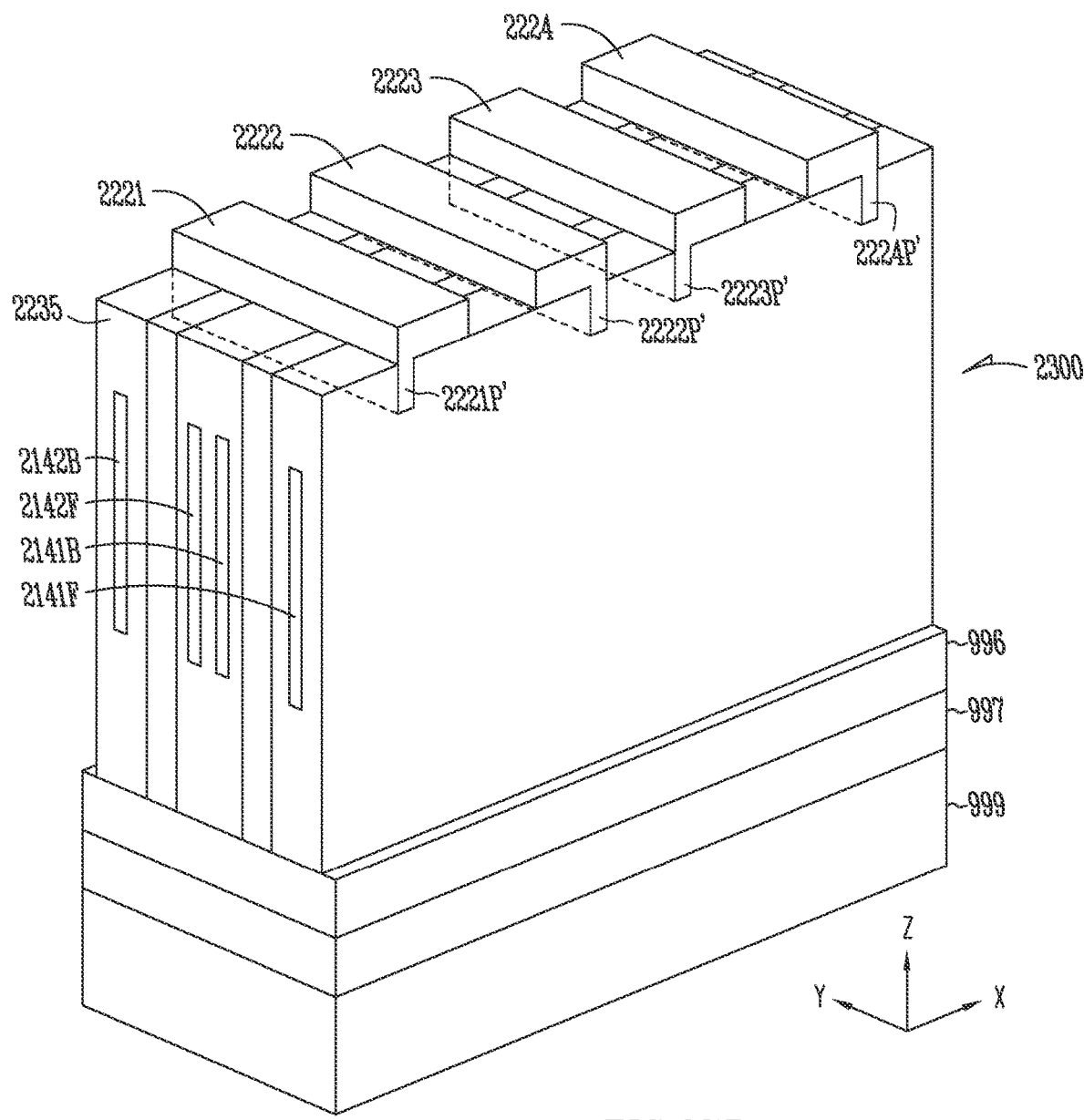

FIG. 27B shows memory device 2300 after data lines 2221, 2222, 2223, and 2224 and respective portions (e.g., wrapped portions) 2221P', 2222P', 2223P', and 2224P' are formed. Data lines 2221, 2222, 2223, and 2224 and respective portions 2221P', 2222P', 2223P', and 2224P' can be concurrently formed. For example, an initial conductive material can be formed (e.g., deposited) in trenches 2622 (FIG. 26) and over other exposed portion 1910A, material 1920, portion 191A. and material 1921 (shown in FIG. 26). Then, a process (e.g., patterning process) can be performed to remove a portion of the initial conductive material. In FIG. 27B, data lines 2221, 2222, 2223, and 2224 and respective portions 2221P', 2222P, 2223P', and 2224P' are the remaining portion of the initial conductive material.

As shown in FIG. 27B, data lines 2221, 2222, 2223, and 2224 are electrically separated from each other. Each of data lines 2221, 2222, 2223, and 2224 can have a length in the Y-direction, a width in the X-direction, and a thickness in the Z-direction. Data lines 2221, 2222, 2223, and 2224 and respective portions 2221P', 2222P', 2223P', and 2224P' can be concurrently formed. For example, a process (e.g., patterning process) can be performed to remove a portion of conductive material 2200' (FIG. 27A). In FIG. 27B, data lines 2221, 2222, 2223, and 2224 and respective portions 2221P', 2222P', 2223P', and 2224P' are the remaining portion of conductive material 2200'.

As shown in FIG. 27B, each of portions 2221P', 2222P', 2223P', and 2224P' can be a continuous structure (e.g., a continuous piece) of conductive material along the length of a respective data line. Each of portions 2221P', 2222P', 2223P', and 2224P' can be adjacent multiple read channel regions of respective memory cells. Each of portions 2221P', 2222P', 2223P', and 2224P' can be separated from respective read channel regions by a respective dielectric material between trench 2622 (FIG. 26) and respective read channel regions. The description of forming memory device 2300 with reference to FIG. 23 through FIG. 27B can include other processes to form a complete memory device. Such processes are omitted from the above description so as to not obscure the subject matter described herein. Memory device 2300 can include improvements and benefits similar to those of memory devices 200, 800, and 900.

Figure 28A:
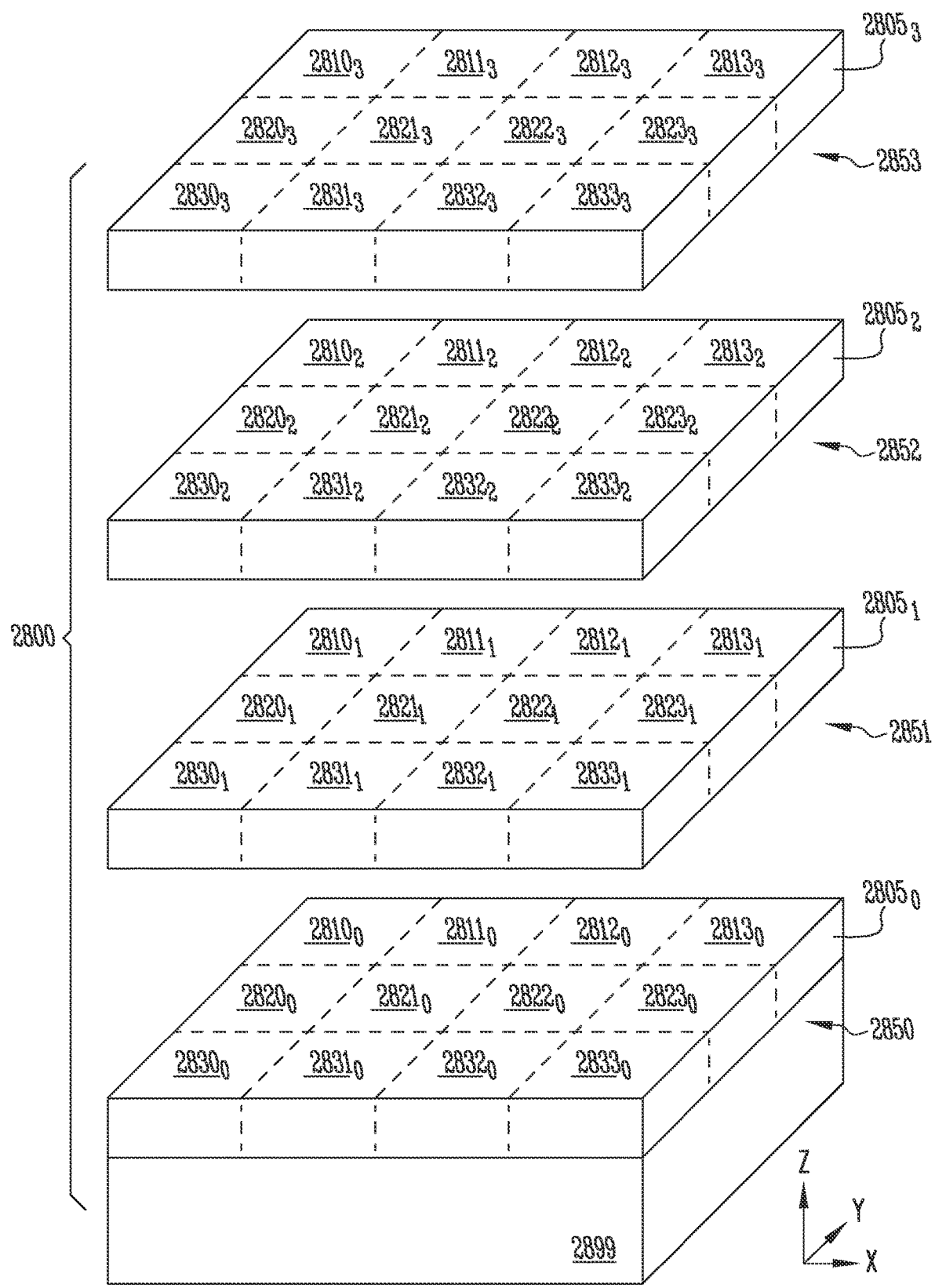
FIG. 28A, FIG. 28B, and FIG. 28C show different views of a structure of a memory device including multiple decks of memory cells, according to some embodiments described herein.
Figure 28B:
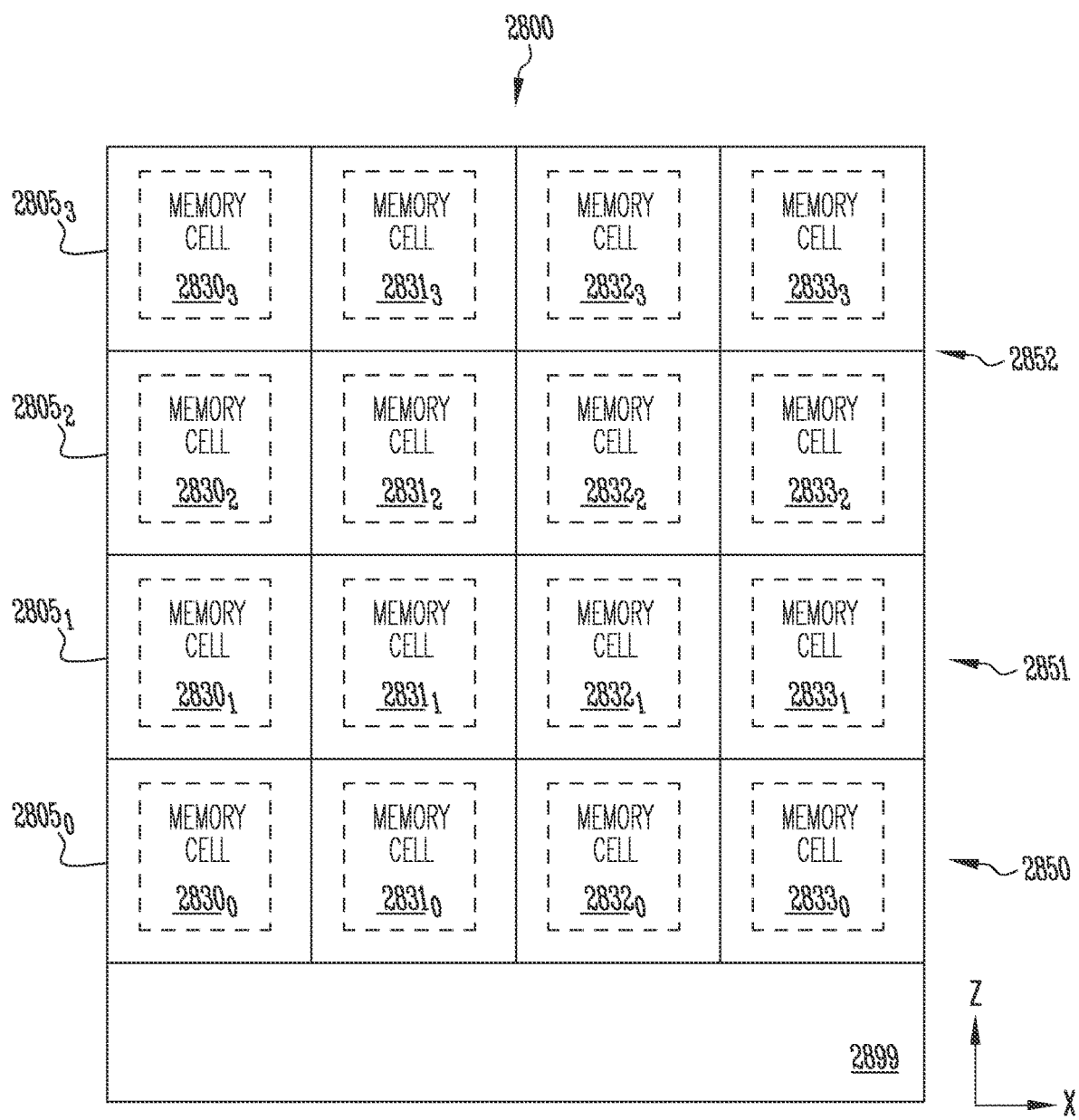
Figure 28C:
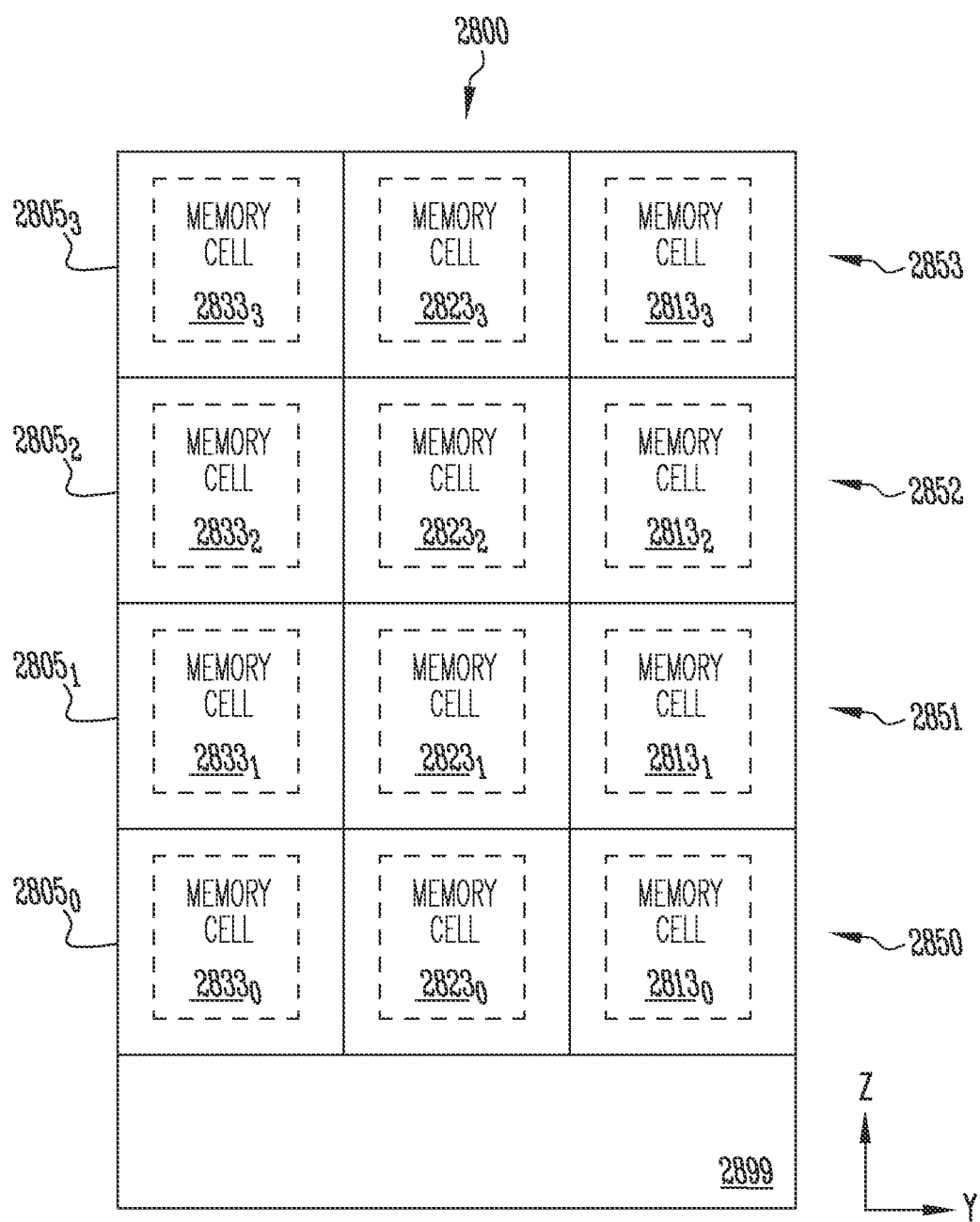

FIG. 28A, FIG. 28B, and FIG. 28C show different views of a structure of a memory device 2800 including multiple decks of memory cells, according to some embodiments described herein. FIG. 28A shows an exploded view (e.g., in the Z-direction) of memory device 2800. FIG. 28B shows a side view (e.g., cross-sectional view) in the X-direction and the Z-direction of memory device 2800. FIG. 28C shows a side view (e.g., cross-sectional view) in the Y-direction and the Z-direction of memory device 2800.

As shown in FIG. 28A, FIG. 28B, and FIG. 28C, memory device 2800 can include decks (decks of memory cells) $2805_0$, $2805_1$, $2805_2$, and $2805_3$ that are shown separately from each other in an exploded view to help ease of viewing the deck structure of memory device 2800. In reality, decks $2805_0$, $2805_1$, $2805_2$, and $2805_3$ can be attached to each other in an arrangement where one deck can be formed (e.g., stacked) over another deck over a substrate (e.g., a semiconductor (e.g., silicon) substrate) 2899. For example, as shown in FIG. 28A, decks $2805_0$, $2805_1$, $2805_2$, and $2805_3$ can be formed in the Z-direction perpendicular to substrate 2899 (e.g., formed vertically in the Z-direction with respect to substrate 2899).

As shown in FIG. 28A, FIG. 28B, and FIG. 28C, each of decks $2805_0$, $2805_1$, $2805_2$, and $2805_3$ can have memory cells arranged in the X-direction and the Y-direction (e.g., arranged in rows in the X-direction and in columns in the Y-direction). For example, deck $2805_0$ can include memory cells $2810_0$, $2811_0$, $2812_0$, and $2813_0$ (e.g., arranged in a row), memory cells $2820_0$, $2821_0$, $2822_0$, and $2823_0$ (e.g., arranged in a row), and memory cells $2830_0$, $2831_0$, $2832_0$, and $2833_0$ (e.g., arranged in a row).

Deck $2805_1$ can include memory cells $2810_1$, $2811_1$, $2812_1$, and $2813_1$ (e.g., arranged in a row), memory cells $2820_1$, $2821_1$, $2822_1$, and $2823_1$ (e.g., arranged in a row), and memory cells $2830_1$, $2831_1$, $2832_1$, and $2833_1$ (e.g., arranged in a row).

Deck $2805_2$ can include memory cells $2810_2$, $2811_2$, $2812_2$, and $2813_2$ (e.g., arranged in a row), memory cells $2820_2$, $2821_2$, $2822_2$, and $2823_2$ (e.g., arranged in a row), and memory cells $2830_2$, $2831_2$, $2832_2$, and $2833_2$ (e.g., arranged in a row).

Deck $2805_3$ can include memory cells $2810_3$, $2811_3$, $2812_3$, and $2813_3$ (e.g., arranged in a row), memory cells $2820_3$, $2821_3$, $2822_3$, and $2823_3$ (e.g., arranged in a row), and memory cells $2830_3$, $2831_3$, $2832_3$, and $2833_3$ (e.g., arranged in a row).

As shown in FIG. 28A, FIG. 28B, and FIG. 28C, decks $2805_0$, $2805_1$, $2805_2$, and $2805_3$ can be located (e.g., formed vertically in the Z-direction) on levels (e.g., portions) 2850, 2851, 2852, and 2853, respectively, of memory device 2800. The arrangement of decks $2805_0$, $2805_1$, $2805_2$, and $2805_3$ forms a 3-dimensional (3-D) structure of memory cells of memory device 2800 in that different levels of the memory cells of memory device 2800 can be located (e.g., formed) in different levels (e.g., different vertical portions) 2850, 2851, 2852, and 2853 of memory device 2800.

Decks $2805_0$, $2805_1$, $2805_2$, and $2805_3$ can be formed one deck at a time. For example, decks $2805_0$, $2805_1$, $2805_2$, and $2805_3$ can be formed sequentially in the order of decks $2805_0$, $2805_1$, $2805_2$, and $2805_3$ (e.g., deck $2805_1$ is formed first and deck $2805_3$ is formed last). In this example, the memory cell of one deck (e.g., deck $2805_1$) can be formed either after formation of the memory cells of another deck (e.g., deck $2805_0$) or before formation of the memory cells of another deck (e.g., deck $2805_2$). Alternatively, decks $2805_0$, $2805_1$, $2805_2$, and $2805_3$ can be formed concurrently (e.g., simultaneously), such that the memory cells of decks $2805_0$, $2805_1$, $2805_2$, and $2805_3$ can be concurrently formed. For example, the memory cells in levels 2850, 2851, 2852, and 2853 of memory device 2800 can be concurrently formed.

The structures decks $2805_0$, $2805_1$, $2805_2$, and $2805_3$ can include the structures of memory devices described above with reference to FIG. 1 through FIG. 27B. For example, memory device 2800 can include data lines (e.g., bit lines) and access lines (e.g., word lines) to access the memory cells of decks $2805_0$, $2805_1$, $2805_2$, and $2805_3$. For simplicity, data lines and access lines of memory cells are omitted from FIG. 28A. However, the data lines and access lines of memory device 2800 can be similar to the data lines and access lines, respectively, of the memory devices described above with reference to FIG. 1 through FIG. 27B.

FIG. 28A, FIG. 28B, and FIG. 28C show memory device 2800 including four decks (e.g., $2805_0$, $2805_1$, $2805_2$, and $2805_3$) as an example. However, the number of decks can be different from four. FIG. 28A shows each of decks $2805_0$, $2805_1$, $2805_2$, and $2805_3$ including one level (e.g., layer) of memory cells as an example. However, at least one of the decks (e.g., one or more of decks $2805_0$, $2805_1$, $2805_2$, and $2805_3$) can have two (or more) levels of memory cells. FIG. 28A shows an example where each of decks $2805_0$, $2805_1$, $2805_2$, and $2805_3$ includes four memory cells (e.g., in a row) in the X-direction and three memory cells (e.g., in a column) in the Y-direction. However, the number of memory cells in a row, in a column, or both, can vary. Since memory device 2800 can include the structures of memory devices 200, 800, 900, and 2300, memory device 2800 can also have improvements and benefits like memory devices 200, 800, 900, 2300, and 2300.

The illustrations of apparatuses (e.g., memory devices 100, 200, 800, 900, 2300, and 2800) and methods (e.g., methods of forming memory devices 900 and 2300) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 800, 900, 2300, and 2800) or a system (e.g., an electronic item that can include any of memory devices 100, 200, 800, 900, 2300 and 2800).

Any of the components described above with reference to FIG. 1 through FIG. 28C can be implemented in a number of ways, including simulation via software. Thus, apparatuses (e.g., memory devices 100, 200, 800, 900, 2300, and 2800) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, 800, 900, 2300, and 2800) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group. Audio Layer 3) players), vehicles, medical devices (e.g., heart monitor, blood pressure monitor, etc.), set top boxes, and others.

The embodiments described above with reference to FIG. 1 through FIG. 28C include apparatuses and methods of operating the apparatuses. One of the apparatuses includes a first transistor including a first channel region, and a charge storage structure separated from the first channel region; a second transistor including a second channel region formed over the charge storage structure; and a data line formed over and contacting the first channel region and the second channel region, the data line including a portion adjacent the first channel region and separated from the first channel region by a dielectric material. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B, and C" means A only; B only; C only; A and B (excluding C); A and C (excluding B); B and C (excluding A); or all of A. B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A. B, and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
a memory cell including:
a first transistor including a first channel region, and a charge storage structure separated from the first channel region; and
a second transistor including a second channel region formed over the charge storage structure; and
a data line formed over and contacting the first channel region and the second channel region, the data line including a portion adjacent the first channel region and separated from the first channel region by a dielectric material.

2. The apparatus of claim 1, wherein the first channel region and the second channel region have different conductivity types.

3. The apparatus of claim 1, wherein the second channel region includes semiconducting oxide material.

4. The apparatus of claim 1, wherein the first and second transistors have different threshold voltages.

5. The apparatus of claim 1, further comprising a ground connection coupled to the first channel region.

6. The apparatus of claim 1, further comprising a conductive line electrically separated from the first and second channel regions, the conductive line spanning across part of the first and second channel regions and forming a gate of the first and second transistors.

7. The apparatus of claim 6, further comprising an additional conductive line electrically separated from the first and second channel regions and opposite from the conductive line, such that the first and second channel regions are between the conductive line and the additional conductive line, wherein:

the additional conductive line spans across an additional part of the first and second channel regions and forms the gates of the first and second transistors.

8. The apparatus of claim 7, wherein the conductive line is electrically coupled to the additional conductive line.

9. The apparatus of claim 1, wherein the data line does not have a portion horizontally adjacent the second channel region.

10. The apparatus of claim 1, wherein the second channel region includes at least one of zinc tin oxide (ZTO), indium zinc oxide (IZO), zinc oxide (ZnOx), indium gallium zinc oxide (IGZO), indium gallium silicon oxide (IGSO), indium oxide (InO$_x$, In$_2$O$_3$), tin oxide (SnO$_2$), titanium oxide (TiOx), zinc oxide nitride (Zn$_x$O$_y$N$_z$), magnesium zinc oxide (Mg$_x$Zn$_y$O$_z$), indium zinc oxide (In$_x$Zn$_y$O$_z$), indium gallium zinc oxide (InxGayZnzOa), zirconium indium zinc oxide (ZrxInyZnzOa), hafnium indium zinc oxide (HfxInyZnzOa), tin indium zinc oxide (SnxInyZnzOa), aluminum tin indium zinc oxide (AlxSnyInzZnaOd), silicon indium zinc oxide (SixInyZnzOa), zinc tin oxide (ZnxSnyOz), aluminum zinc tin oxide (AlxZnySnzOa), gallium zinc tin oxide (GaxZnySnzOa), zirconium zinc tin oxide (ZrxZnySnzOa), indium gallium silicon oxide (InGaSiO), and gallium phosphide (GaP).

11. An apparatus comprising:
a memory cell including:
a semiconductor material including a first side and a second side opposite from the first side, a charge storage structure located on the first side of the semiconductor material, and a first dielectric material between the semiconductor material and the charge storage structure; and
a semiconducting oxide material formed on the charge storage structure and located on the first side of the semiconductor material;
a data line located over and contacting the semiconductor material and the semiconducting oxide material, wherein the data line includes a portion adjacent the second side of the semiconductor material; and
a second dielectric material between and contacting the portion of the data line and the semiconductor material.

12. The apparatus of claim 11, wherein the data line contacts the semiconducting oxide material at an interface, and wherein:
the semiconducting oxide material has a length in a direction from the interface to the charge storage structure; and
the portion of the data line has a length in the direction from the interface to the charge storage structure, and wherein the length of the portion of the data line is less than the length of the semiconducting oxide material.

13. The apparatus of claim 11, wherein the semiconductor material and the semiconducting oxide material have different conductivity types.

14. The apparatus of claim 11, wherein the semiconductor material is p-type conductivity and semiconducting oxide material is n-type conductivity.

15. An apparatus comprising:
a first memory cell including:
a first transistor including a first channel region, and a first charge storage structure separated from the first channel region; and
a second transistor including a second channel region formed over the charge storage structure;
a second memory cell including:
a third transistor including a third channel region, and a second charge storage structure separated from the third channel region; and
a fourth transistor including a fourth channel region formed over the second charge storage structure; and
a data line formed over and contacting the first, second, third, and fourth channel regions, the data line including:
a first portion adjacent the first channel region and separated from the first channel region by a first dielectric material; and
a second portion adjacent the third channel region and separated from the third channel region by a second dielectric material.

16. The apparatus of claim 15, wherein a side of the first portion of the data line is separated from a side of the second portion of the data line by a gap, and wherein the gap is void of a material of the data line.

17. The apparatus of claim 15, wherein the data line includes a first part extending from the first memory cell to the second memory cell, a second part perpendicular to the first part and extending from the first memory cell to the second memory cell, and wherein the first and second portions of the data line are included in the second part of the data line.

* * * * *